(12) United States Patent
Kawai et al.

(10) Patent No.: US 10,658,295 B2
(45) Date of Patent: May 19, 2020

(54) SEMICONDUCTOR MEMORY DEVICE

(71) Applicant: Toshiba Memory Corporation, Minato-ku (JP)

(72) Inventors: Tomoya Kawai, Kawasaki (JP); Takashi Ishida, Yokkaichi (JP); Shuichi Toriyama, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/126,064

(22) Filed: Sep. 10, 2018

(65) Prior Publication Data

US 2019/0295956 A1 Sep. 26, 2019

(30) Foreign Application Priority Data

Mar. 20, 2018 (JP) .................. 2018-053314

(51) Int. Cl.
| | |
|---|---|
| *H01L 23/532* | (2006.01) |
| *H01L 23/528* | (2006.01) |
| *H01L 27/11573* | (2017.01) |
| *H01L 27/11582* | (2017.01) |
| *G11C 16/08* | (2006.01) |
| *G11C 16/14* | (2006.01) |
| *H01L 27/1157* | (2017.01) |
| *G11C 16/04* | (2006.01) |

(52) U.S. Cl.
CPC .... *H01L 23/53209* (2013.01); *G11C 16/0483* (2013.01); *G11C 16/08* (2013.01); *G11C 16/14* (2013.01); *H01L 23/528* (2013.01); *H01L 27/1157* (2013.01); *H01L 27/11582* (2013.01); *H01L 27/11573* (2013.01)

(58) Field of Classification Search
CPC ............. H01L 23/53209; H01L 23/528; H01L 27/1157; H01L 27/11582; H01L 27/11573; H01L 27/11521; H01L 27/11568; G11C 16/0483; G11C 16/14; G11C 16/08
See application file for complete search history.

(56) References Cited

U.S. PATENT DOCUMENTS 9,123,749 B2   9/2015 Kawai et al.
9,287,290 B1 *  3/2016 Rabkin ............ H01L 27/11556
(Continued)

FOREIGN PATENT DOCUMENTS

| JP | 10-93047 | 4/1998 |
|---|---|---|
| JP | 2014-179465 | 9/2014 |
| JP | 2017-34144 | 2/2017 |

*Primary Examiner* — Galina G Yushina
(74) *Attorney, Agent, or Firm* — Oblon, McClelland, Maier & Neustadt, L.L.P.

(57) ABSTRACT

According to one embodiment, a semiconductor memory device includes a first interconnect layer, a first insulating layer, a second interconnect layer, and a memory pillar including a second insulating layer, a charge storage layer, and a third insulating layer stacked on a part of a side surface and on the bottom surface of the memory pillar, and a first silicide layer in contact with the first interconnect layer, a semiconductor layer, and a second silicide layer stacked in order along a first direction. A height position of a bottom surface of the first silicide layer is lower than a top surface of the first interconnect layer, and a height position of a top surface of the first silicide layer is higher than a bottom surface of the second interconnect layer.

19 Claims, 50 Drawing Sheets

(56) References Cited

U.S. PATENT DOCUMENTS

| | | | |
|---|---|---|---|
| 9,520,407 B2* | 12/2016 | Fukuzumi | H01L 27/11582 |
| 9,870,991 B1* | 1/2018 | Kim | H01L 23/5226 |
| 2014/0264547 A1* | 9/2014 | Kawai | H01L 29/66833 |
| | | | 257/324 |
| 2016/0307908 A1* | 10/2016 | Sharangpani | H01L 27/1157 |
| 2017/0040416 A1* | 2/2017 | Ota | H01L 29/1037 |
| 2017/0053935 A1 | 2/2017 | Fukuzumi et al. | |

* cited by examiner

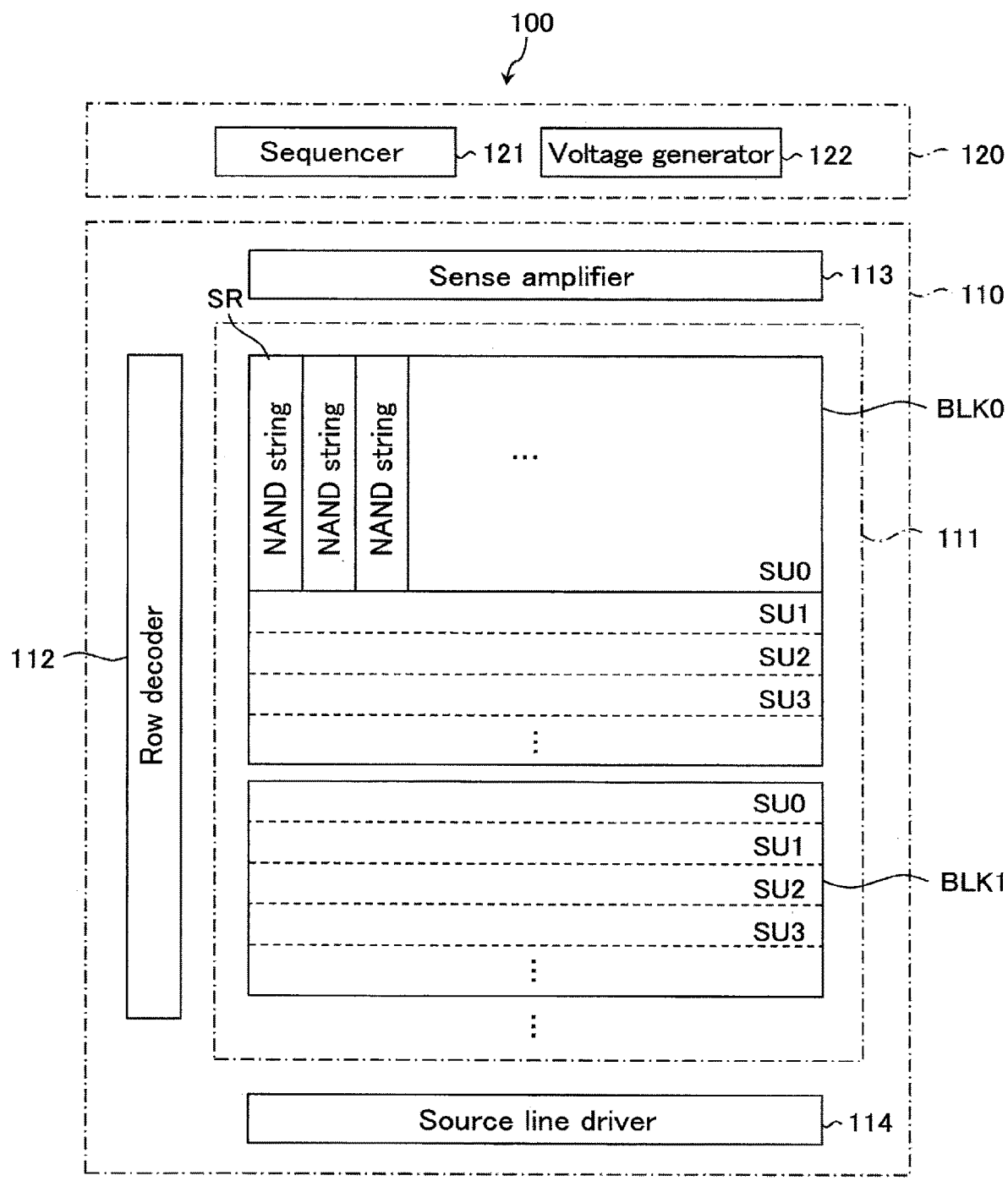
F I G. 1

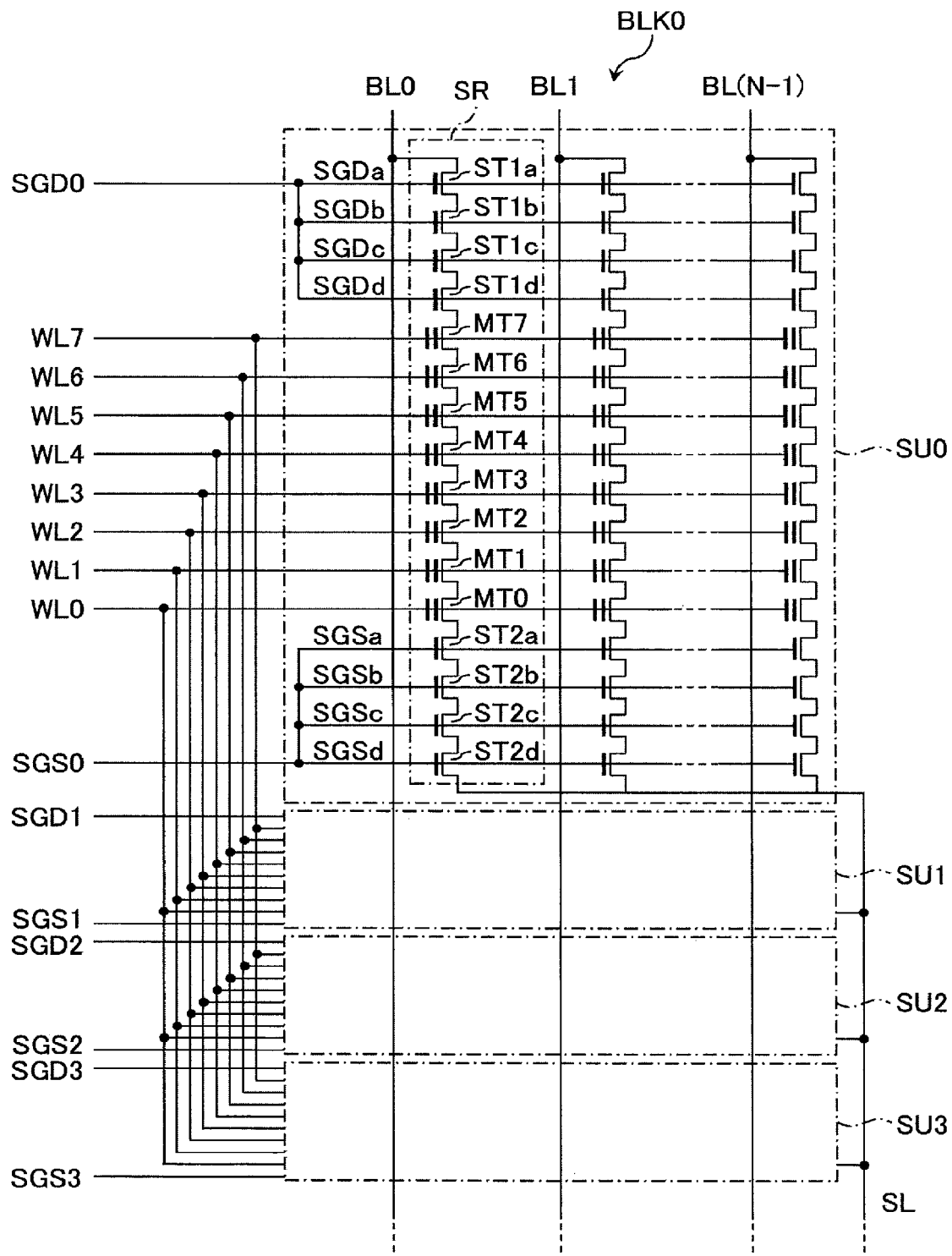
F I G. 2

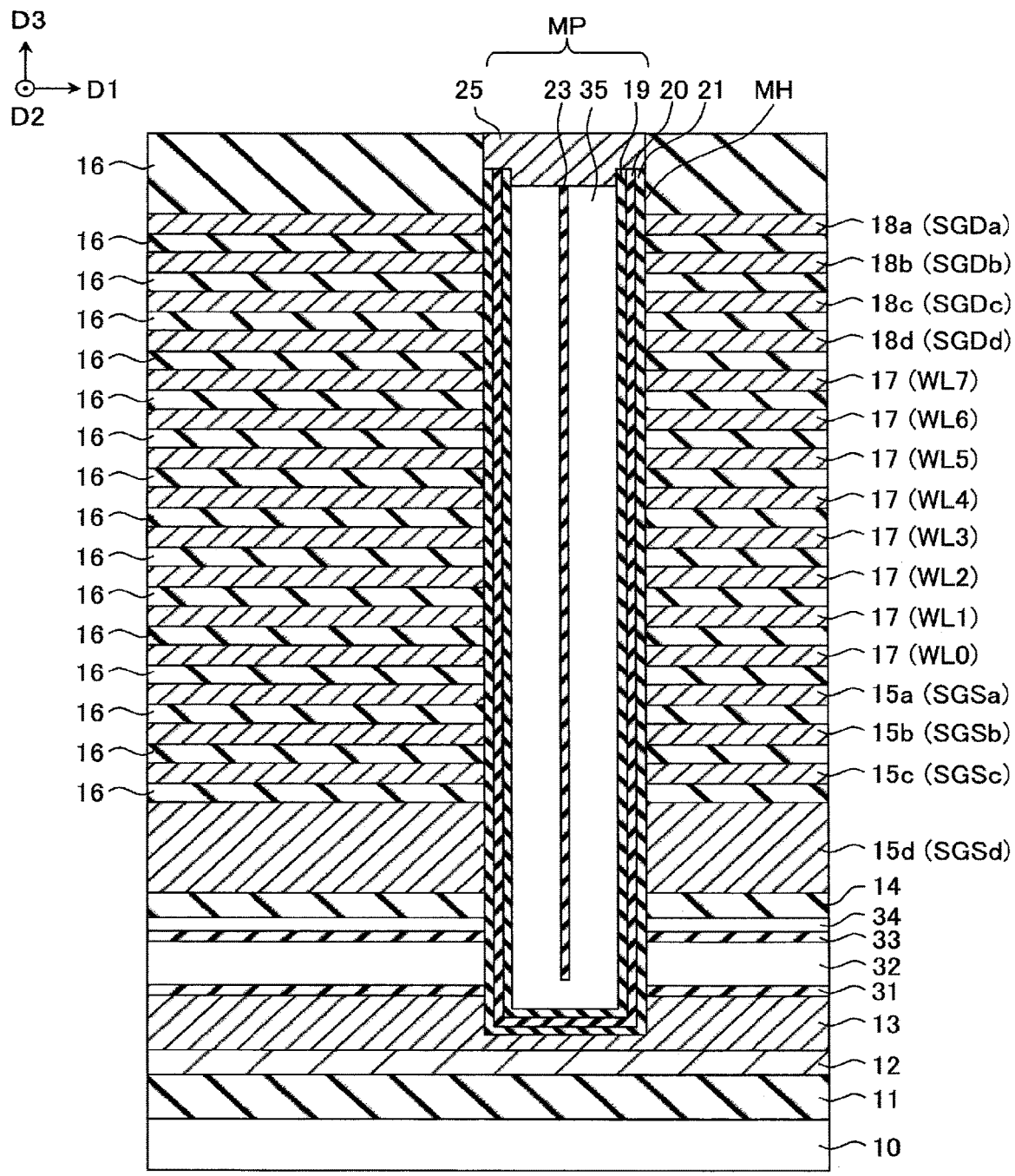
F I G. 6

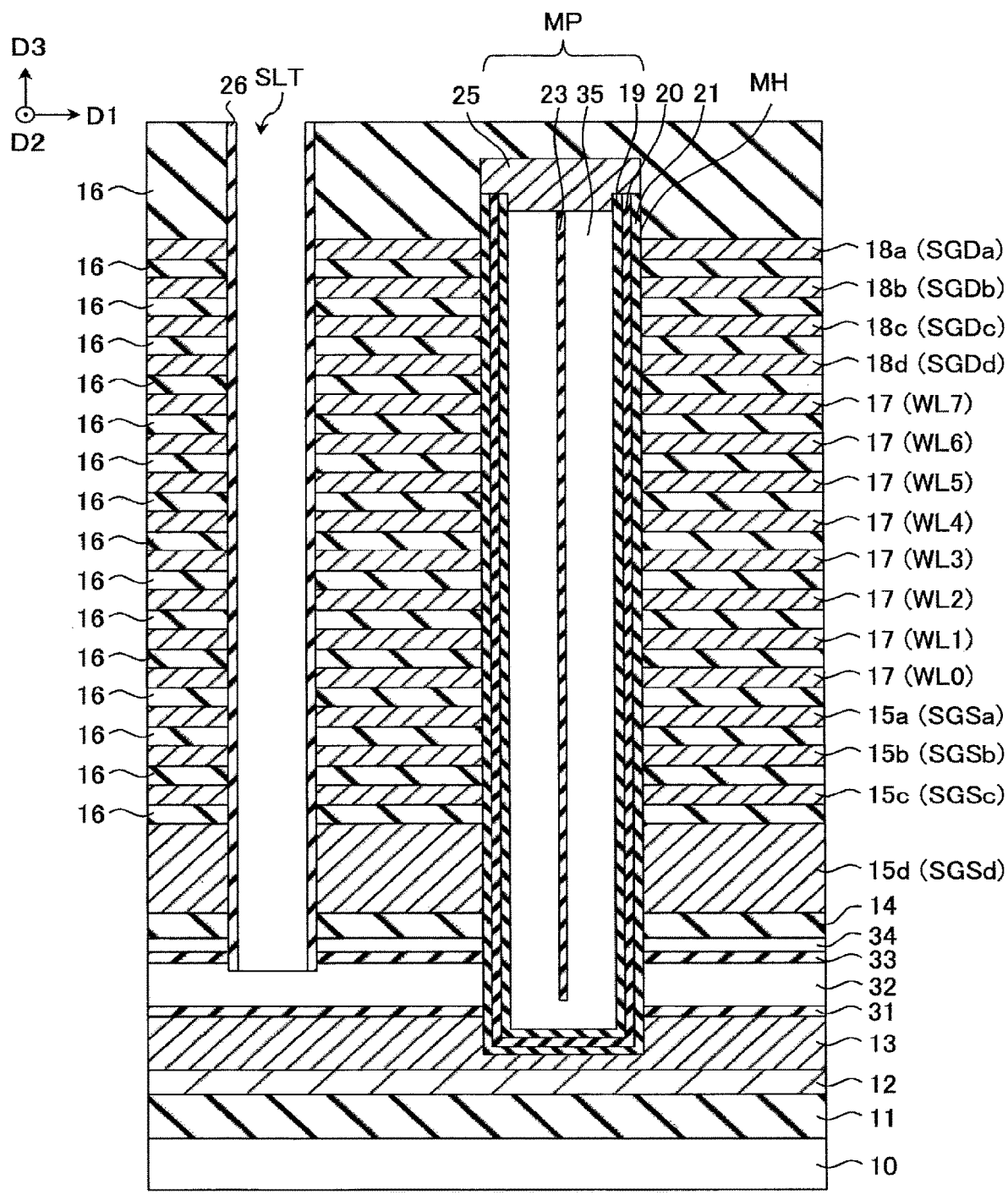
F I G. 8

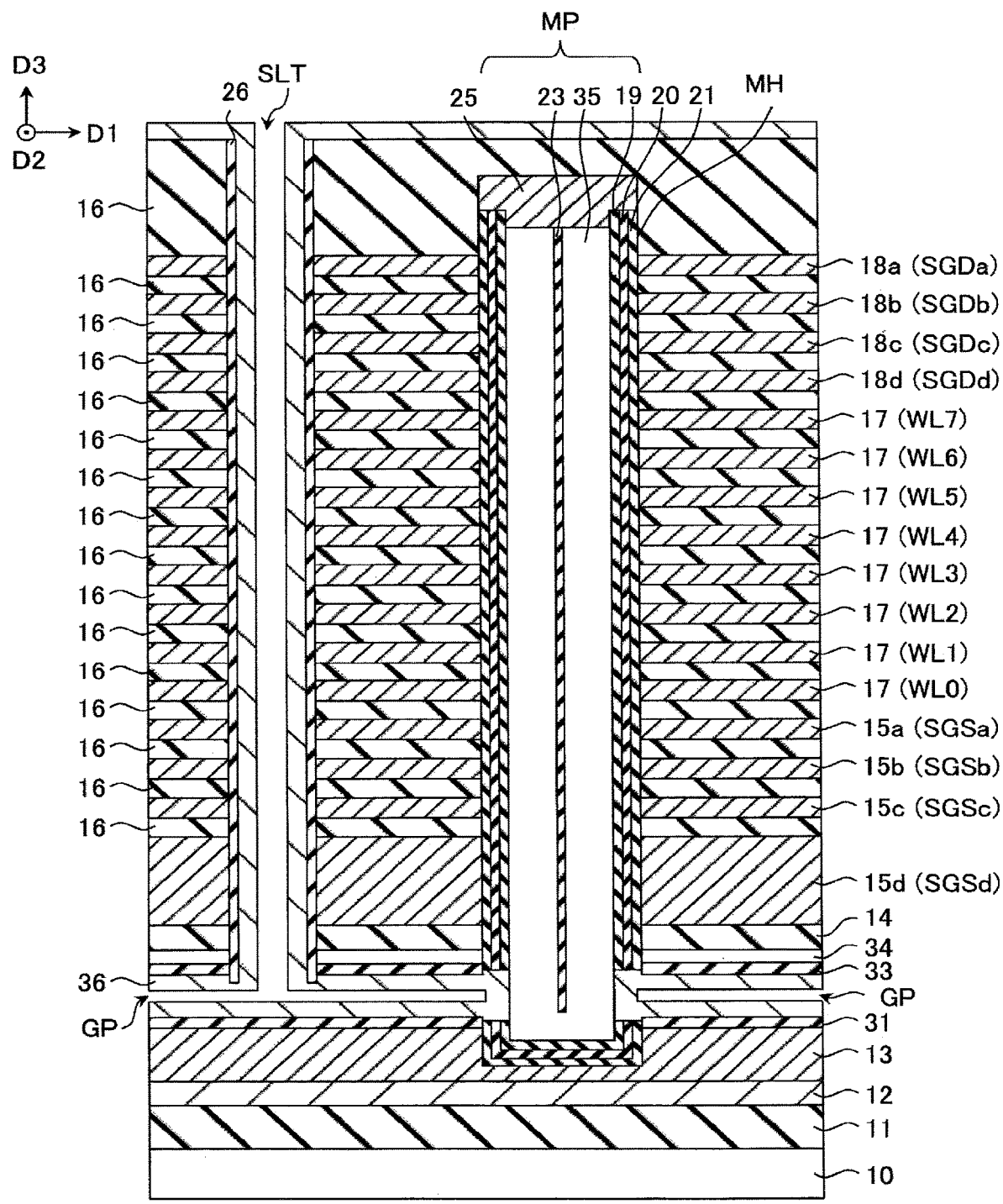
F I G. 11

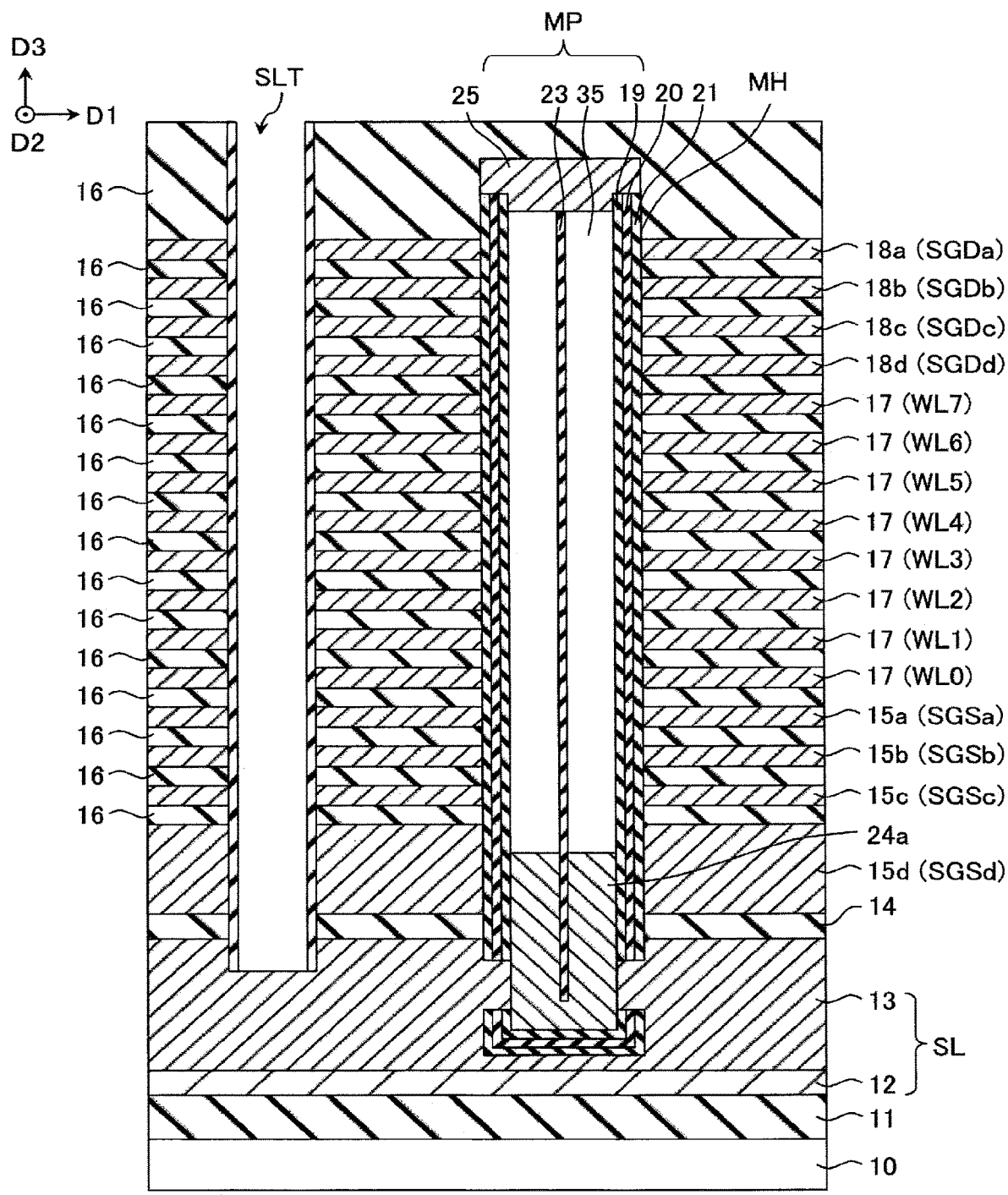
F I G. 15

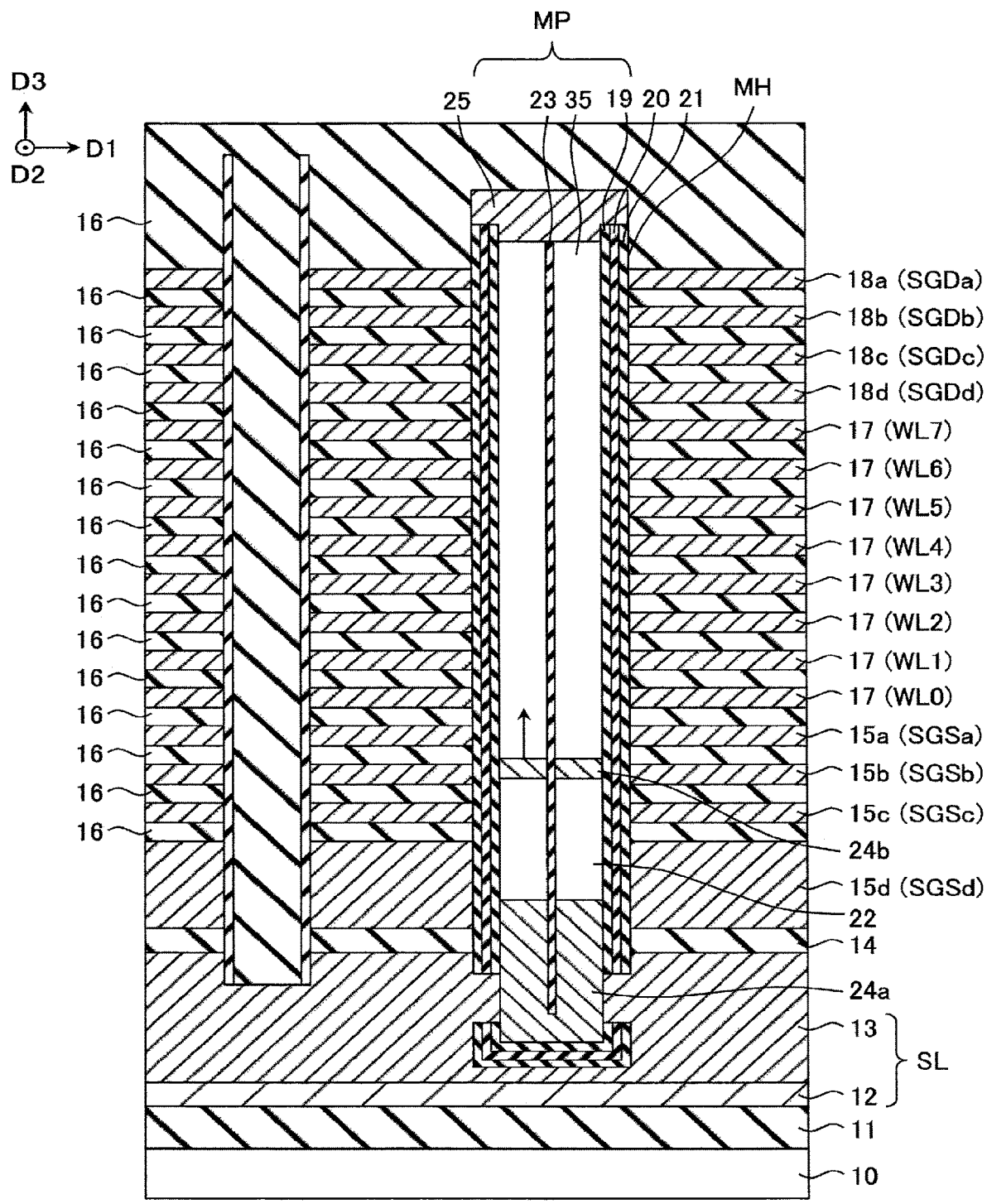
F I G. 17

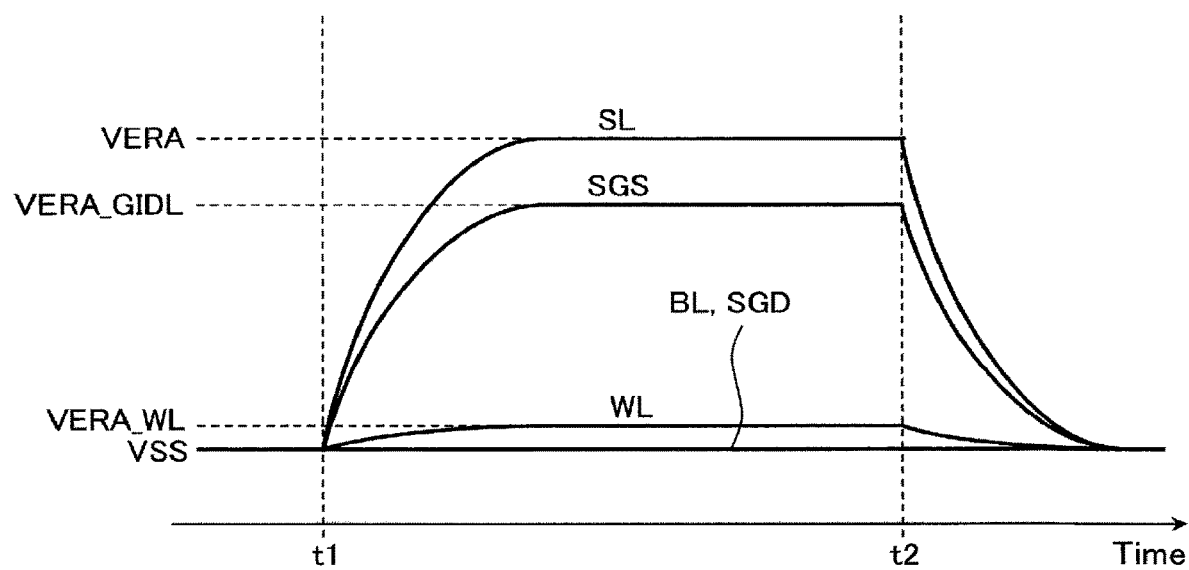
F I G. 19

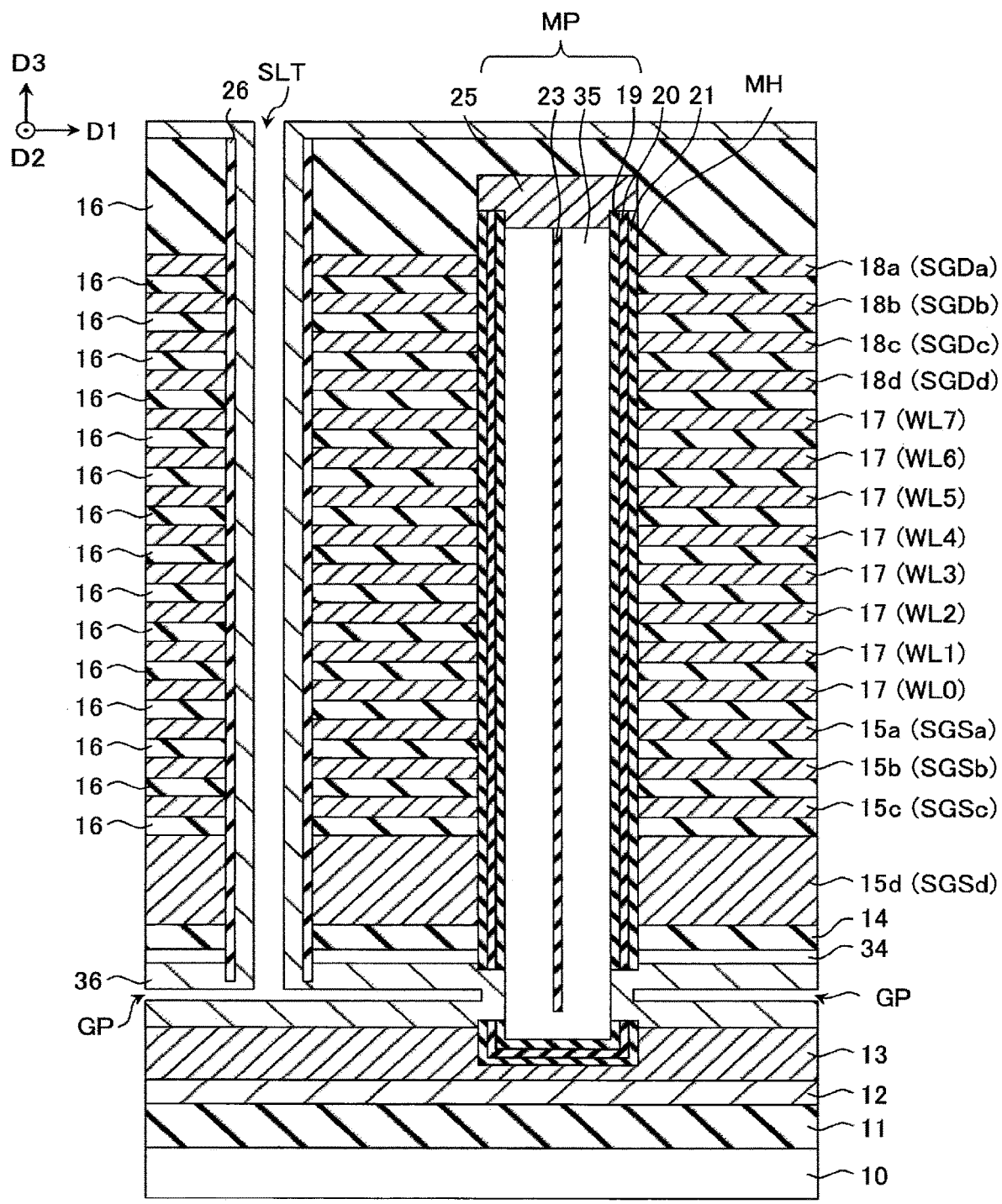
F I G. 28

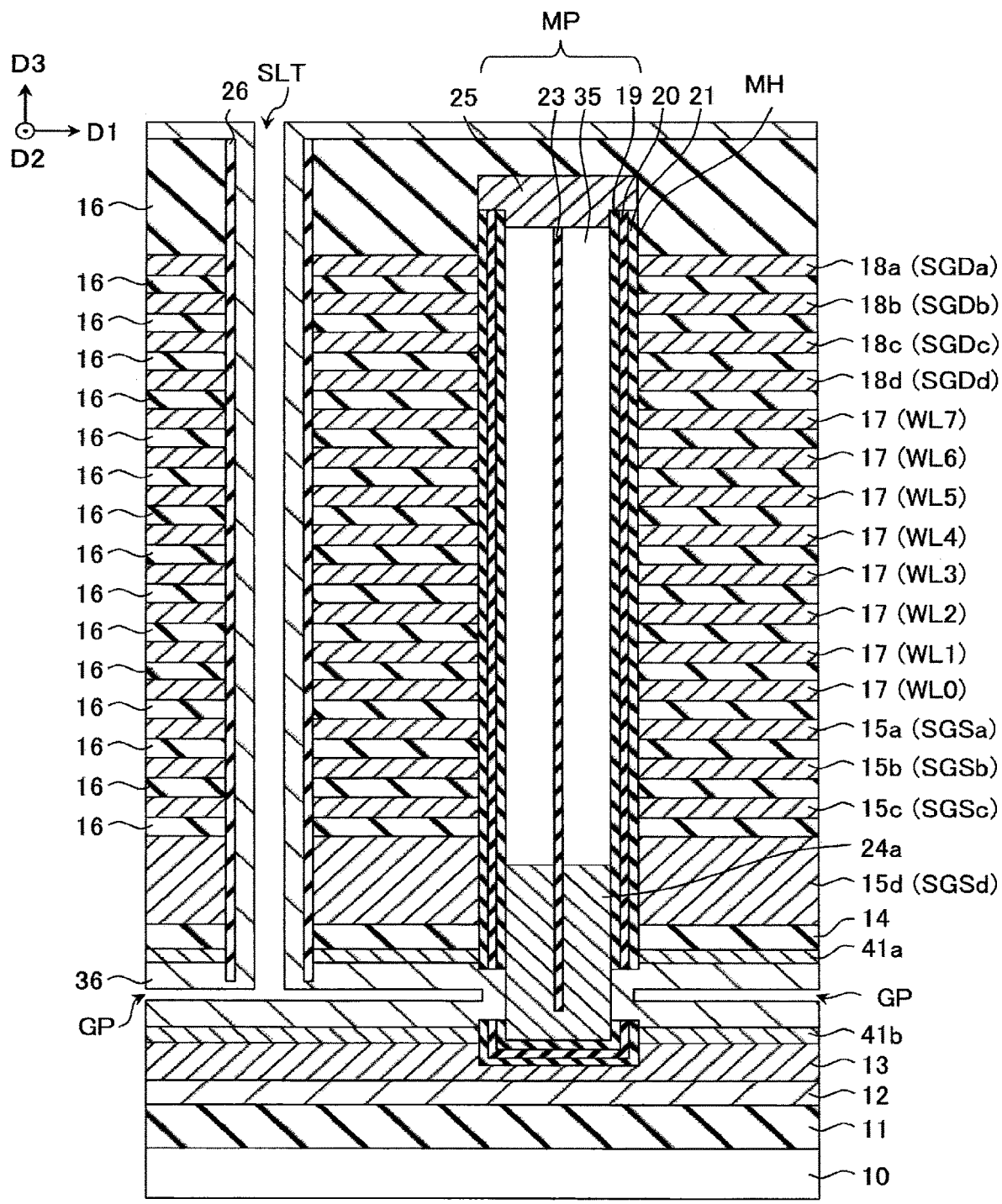
F I G. 29

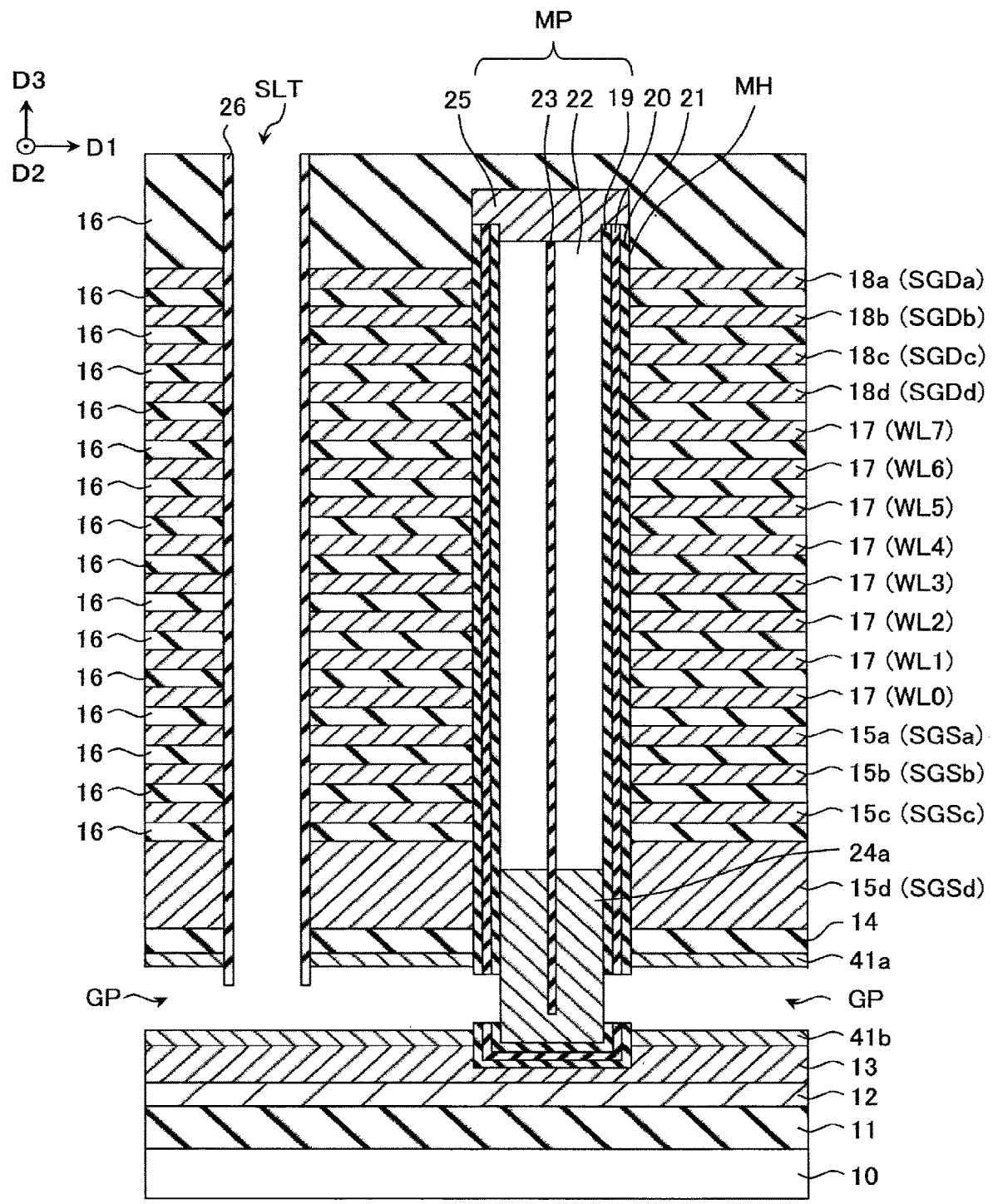
F I G. 30

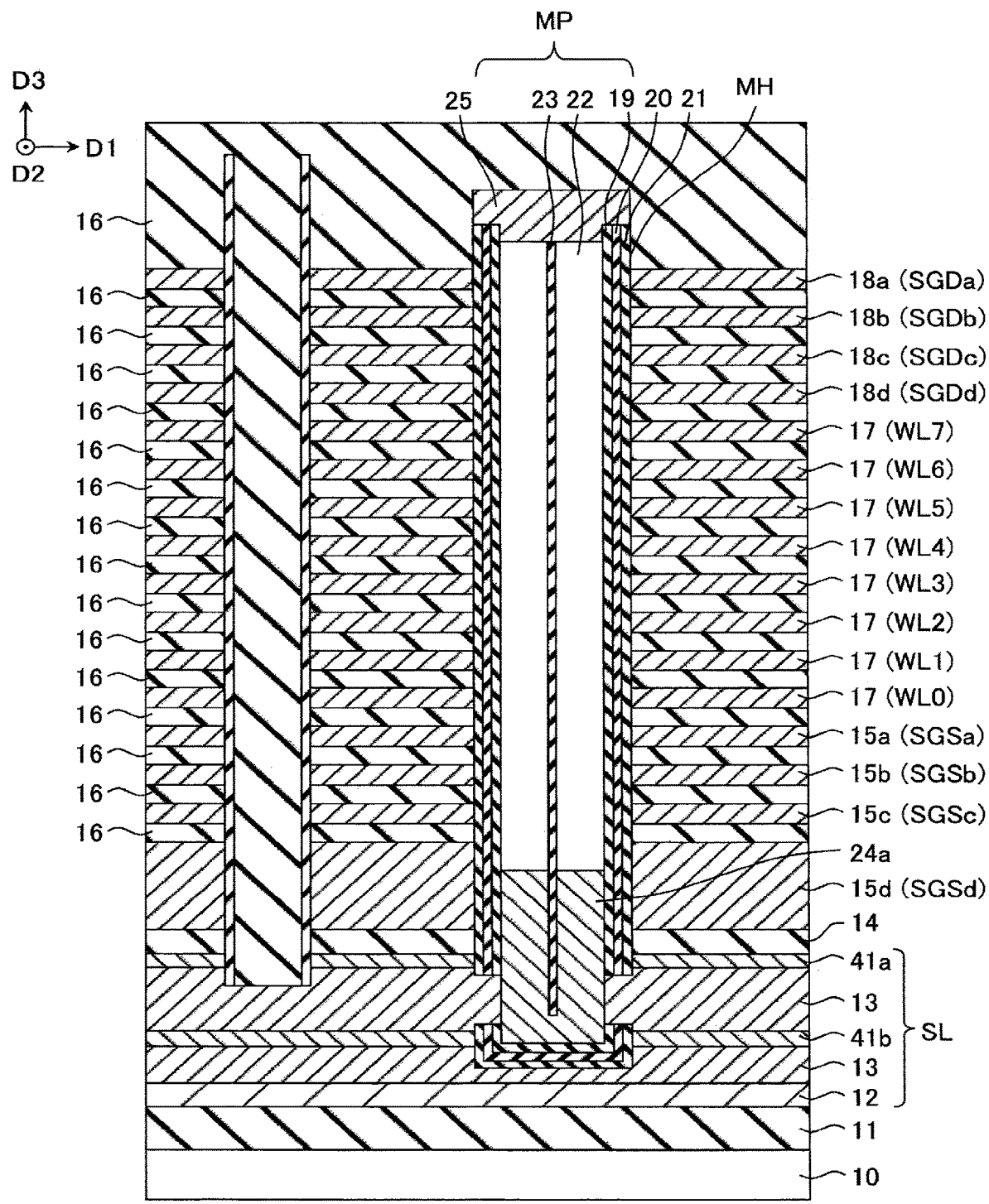
F I G. 31

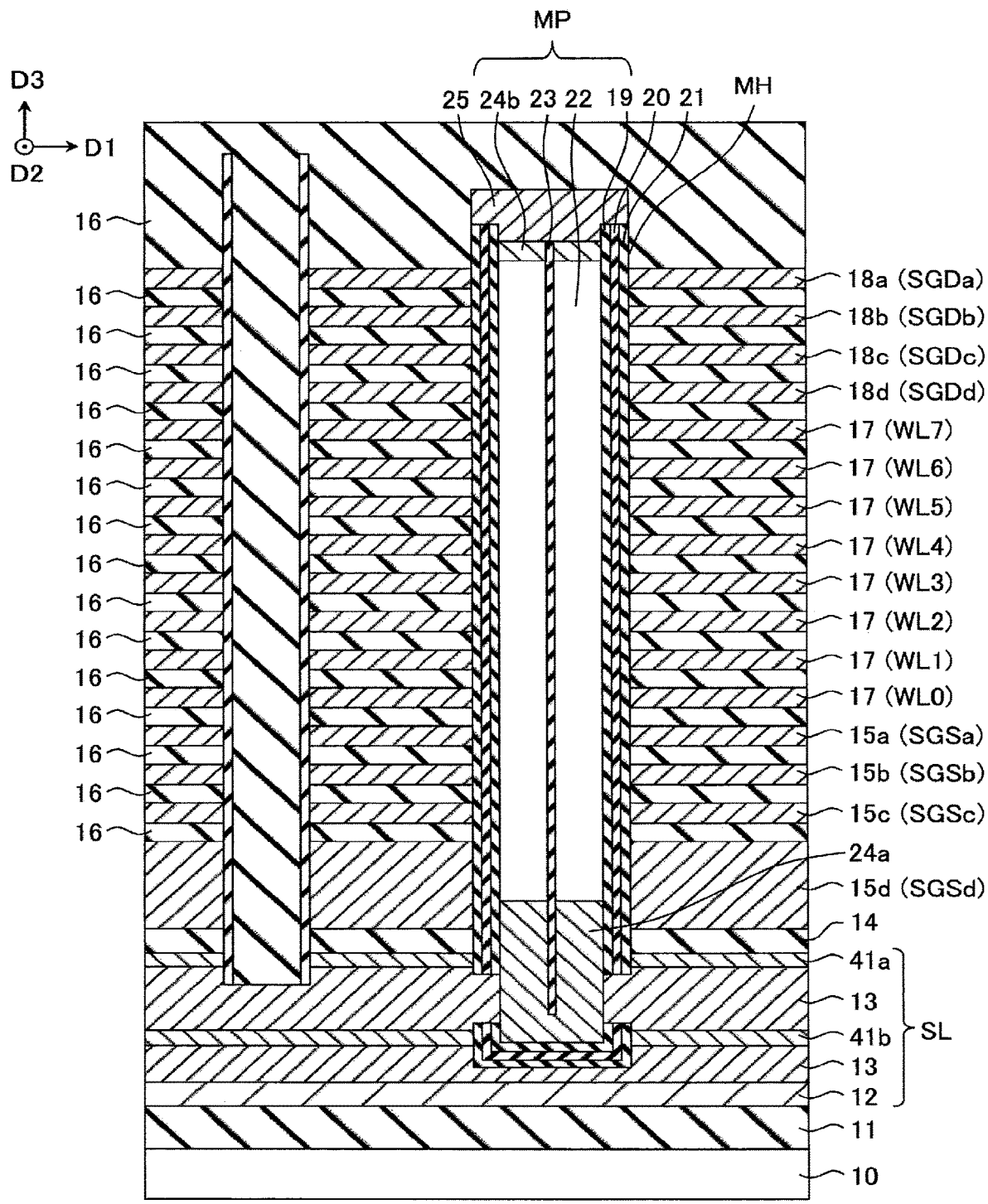
F I G. 32

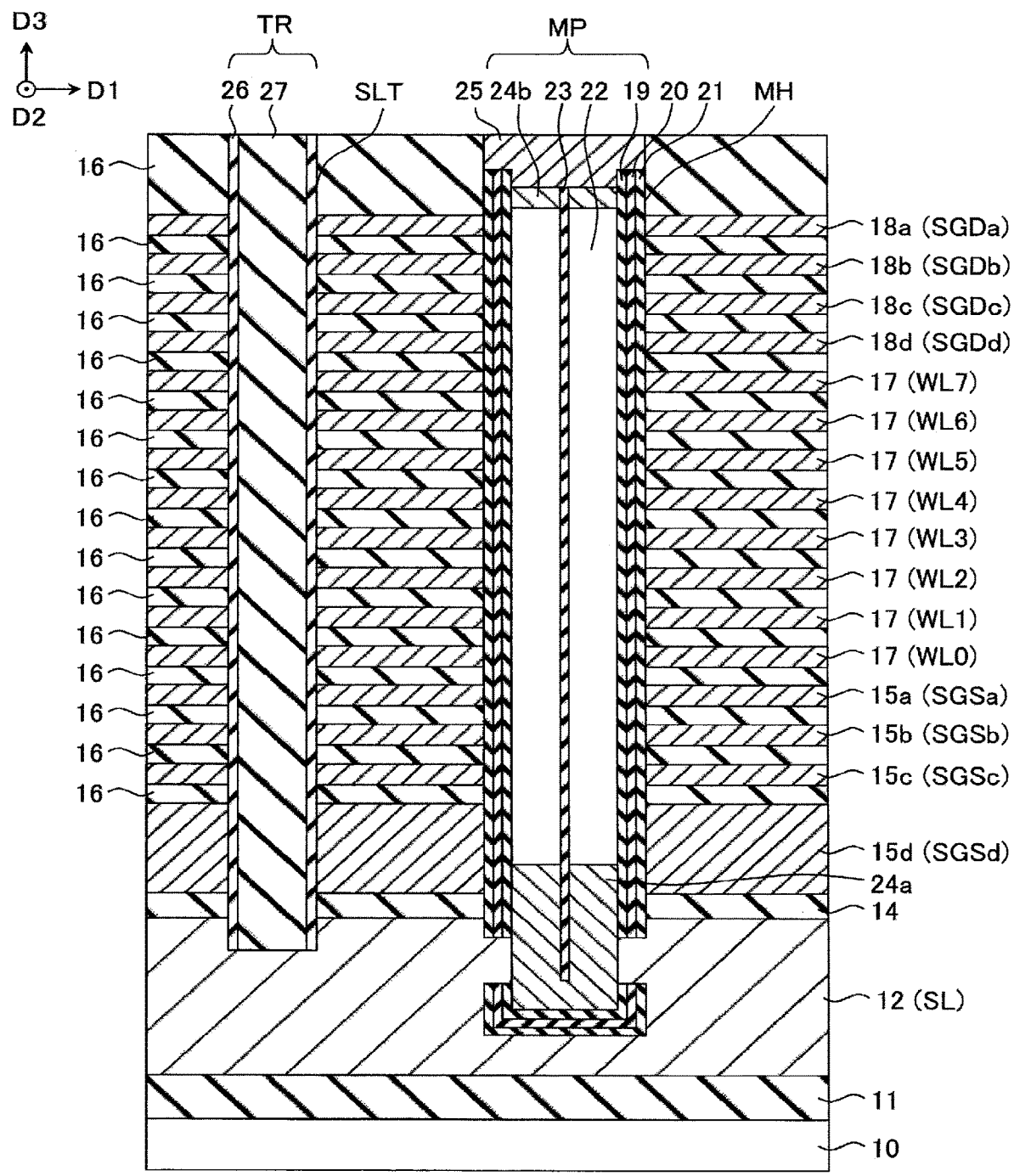
F I G. 34

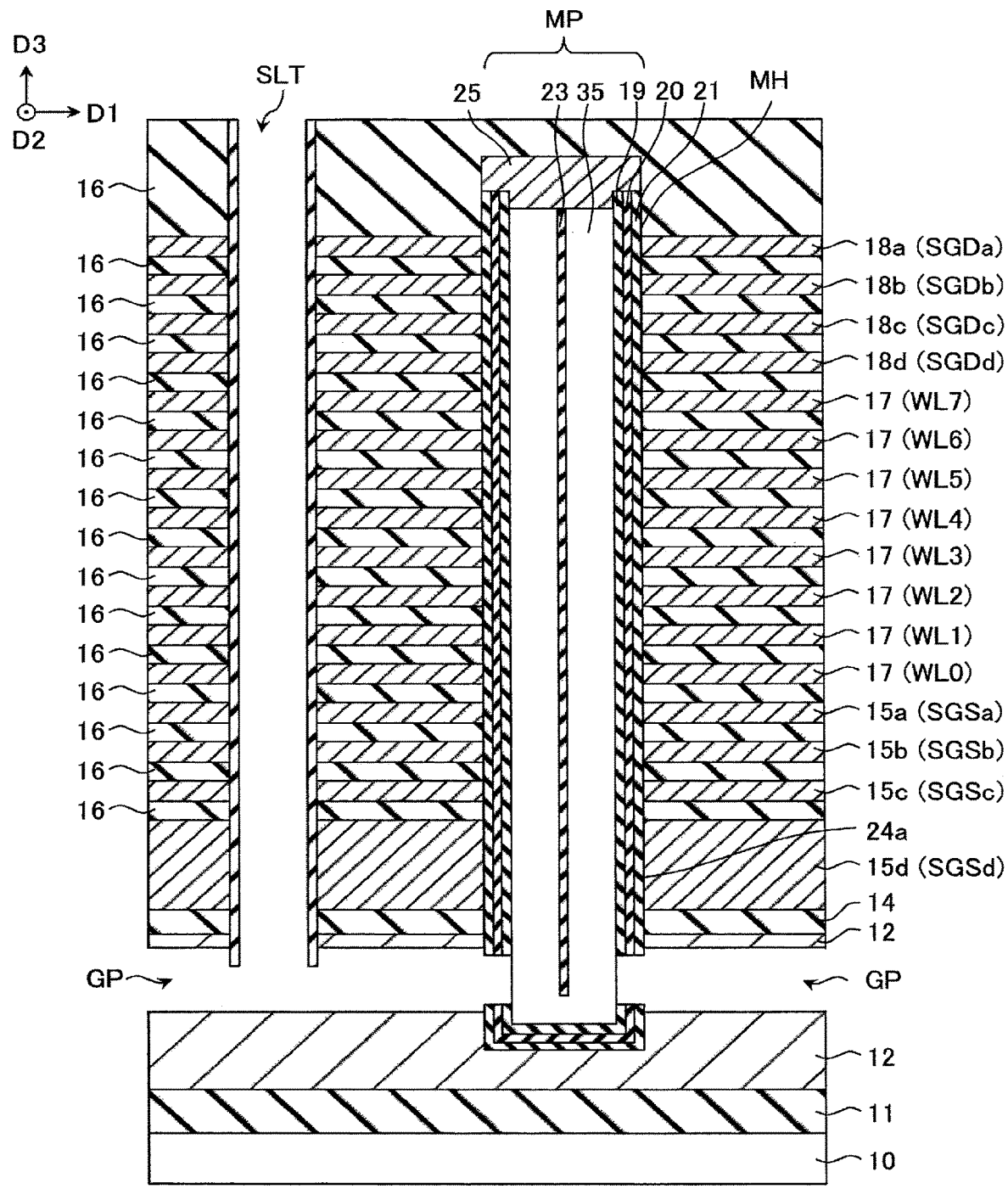
F I G. 36

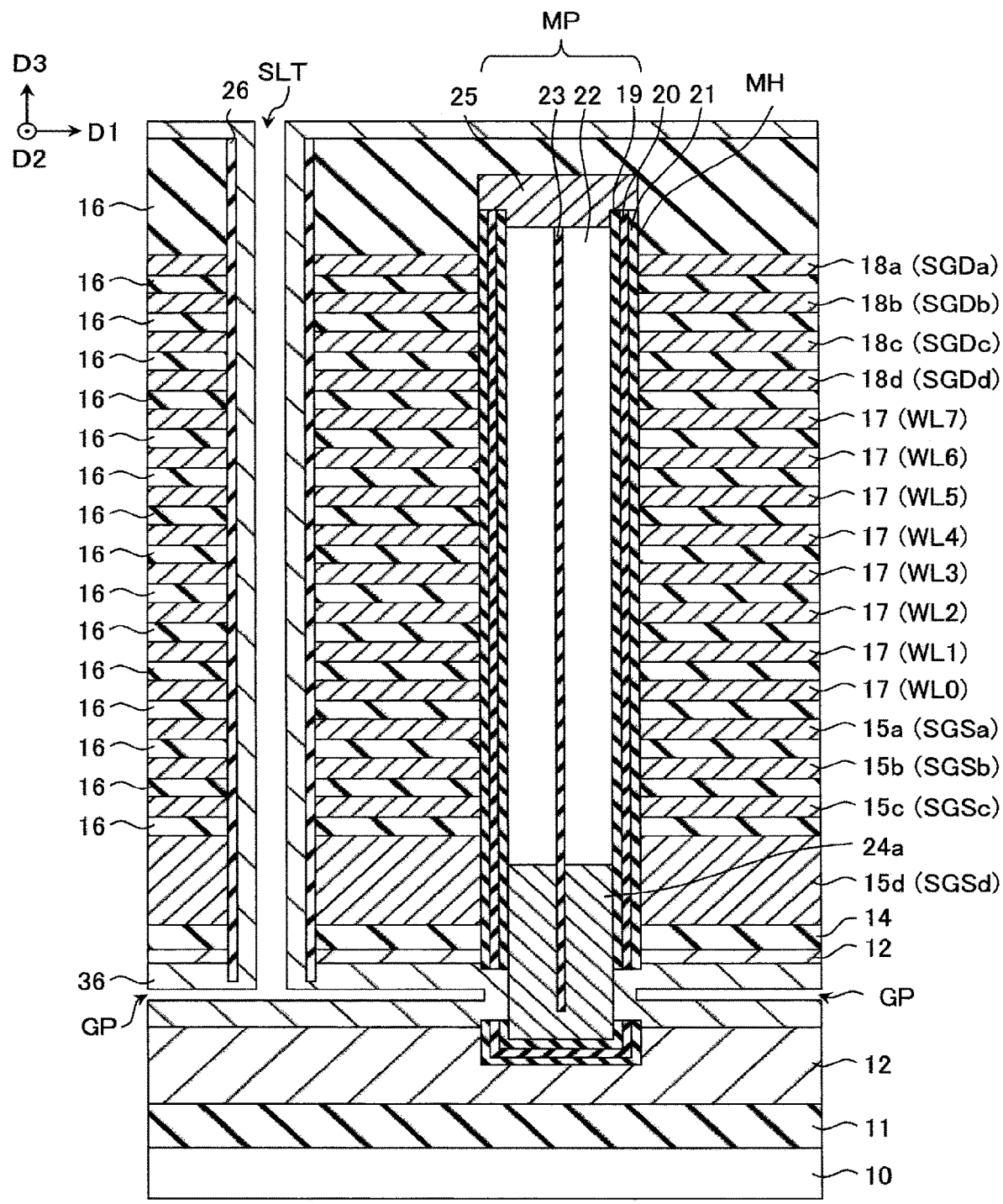
F I G. 37

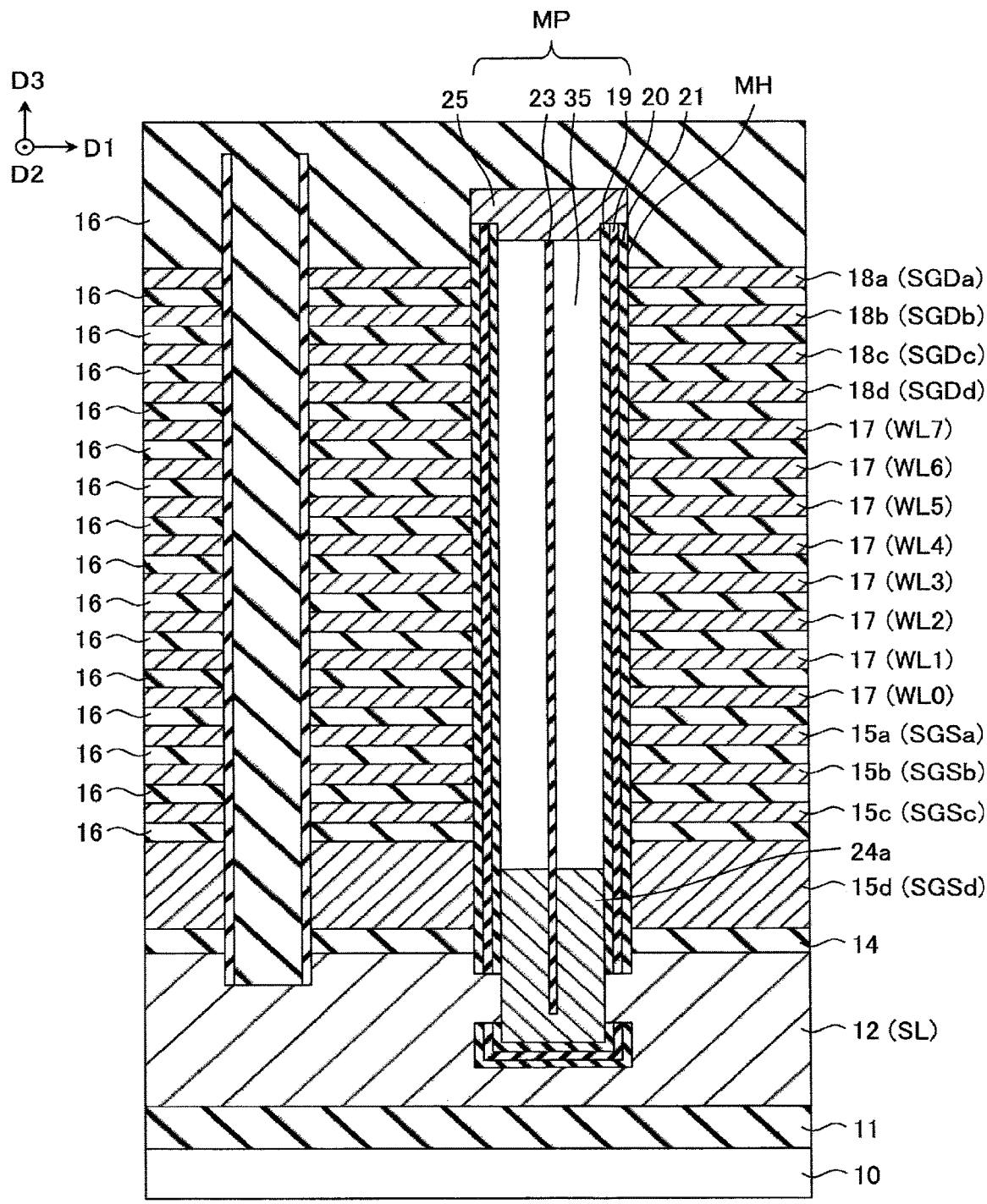
F I G. 39

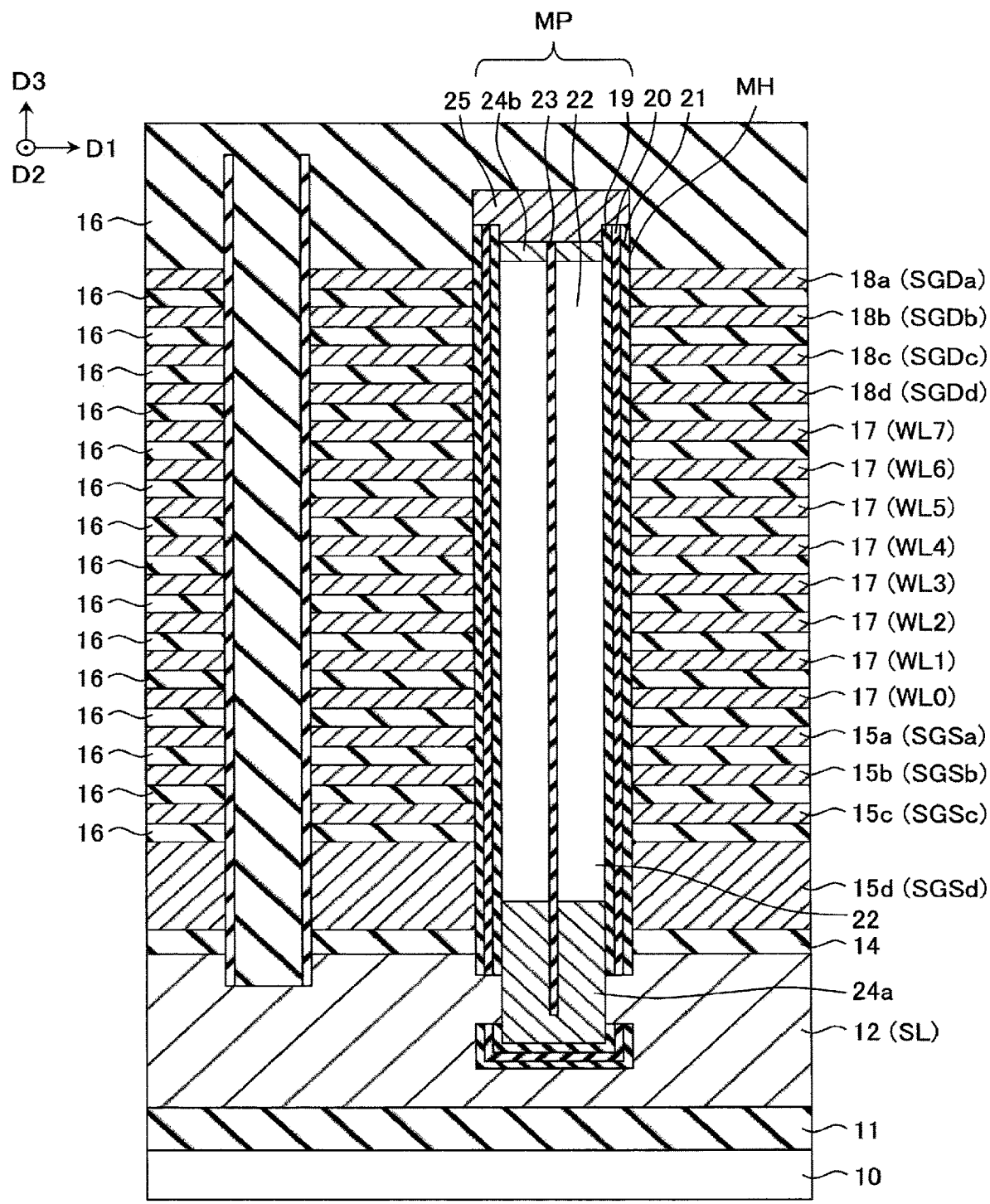
F I G. 40

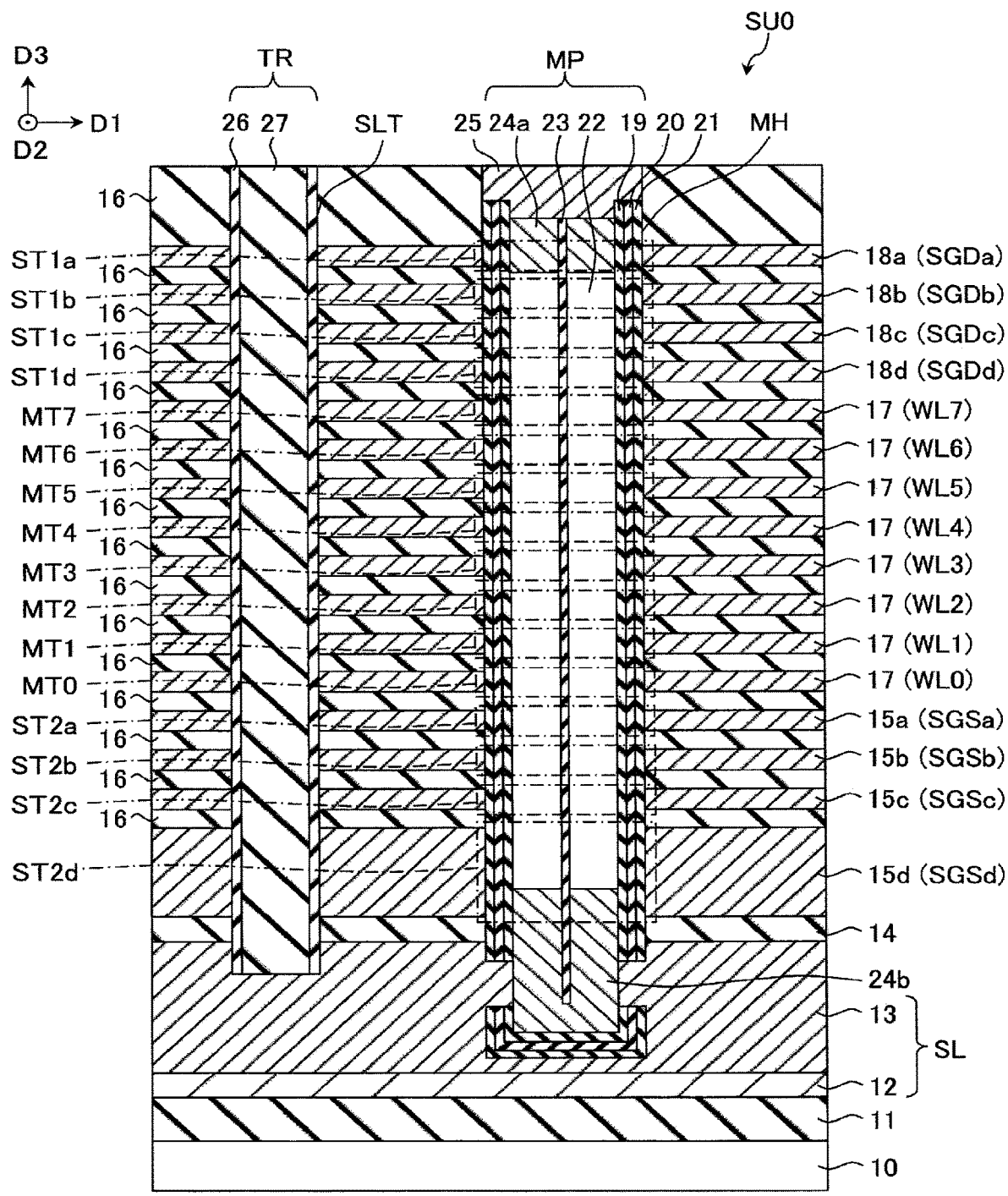
F I G. 41

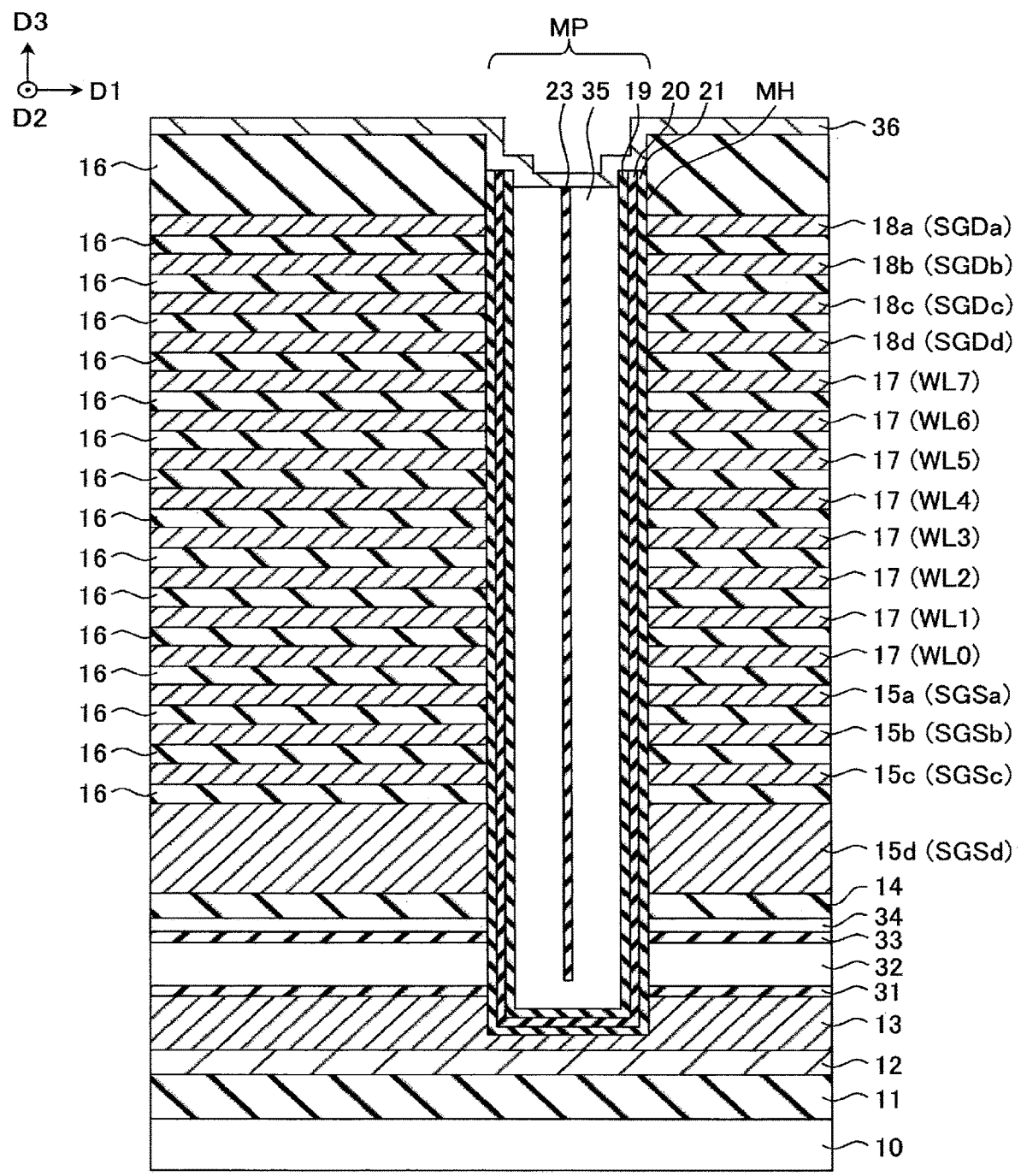
F I G. 43

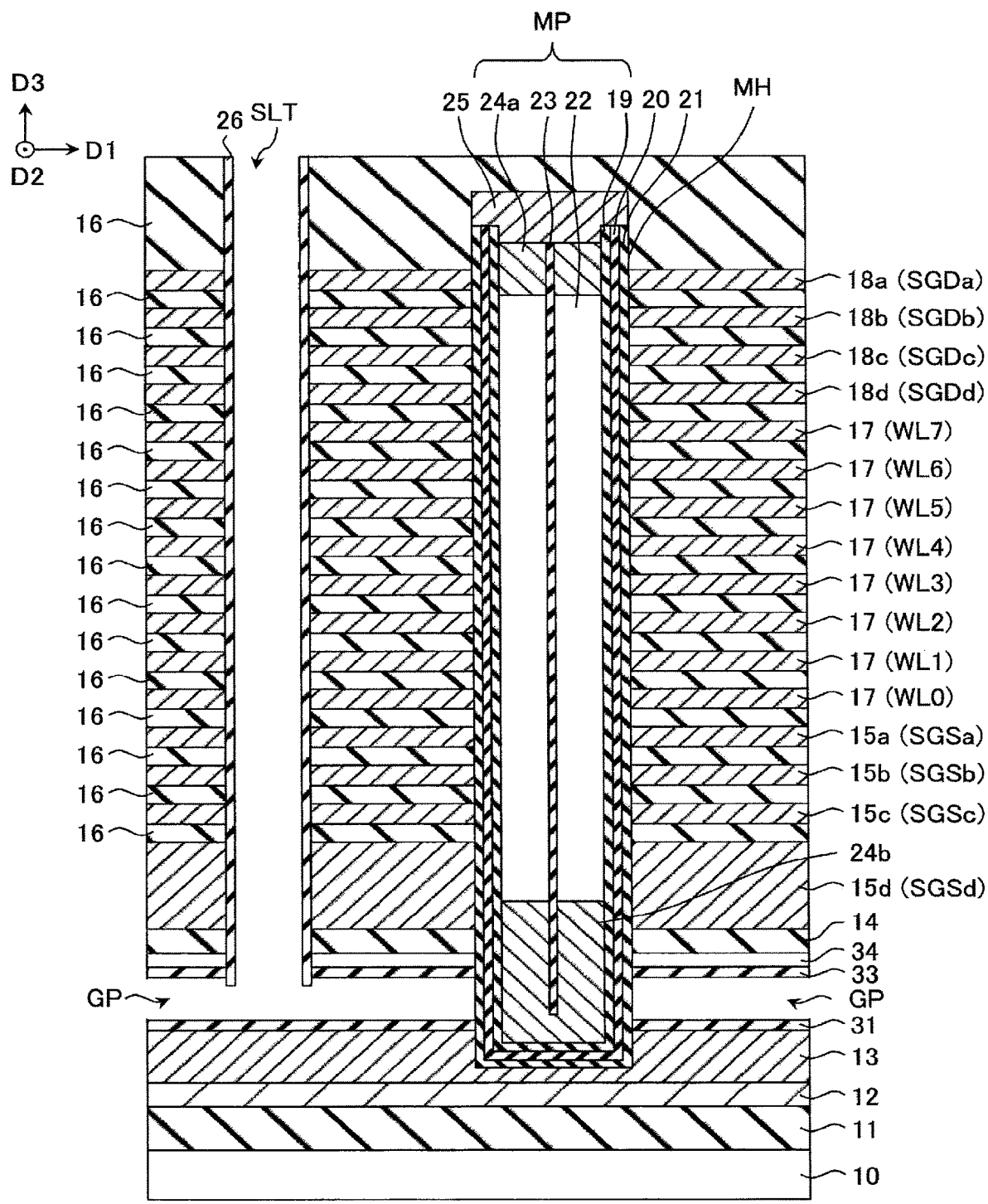
F I G. 48

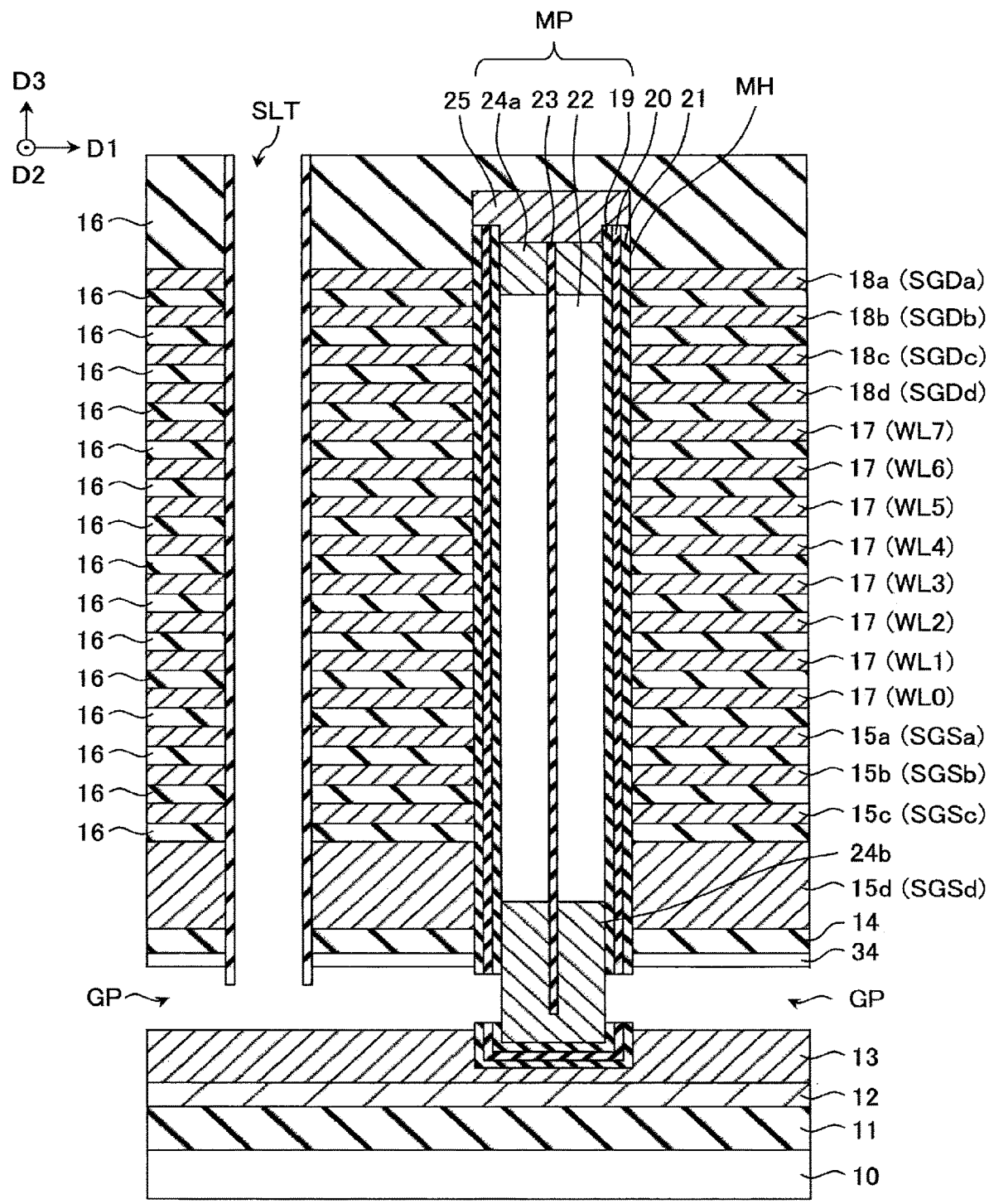
F I G. 49

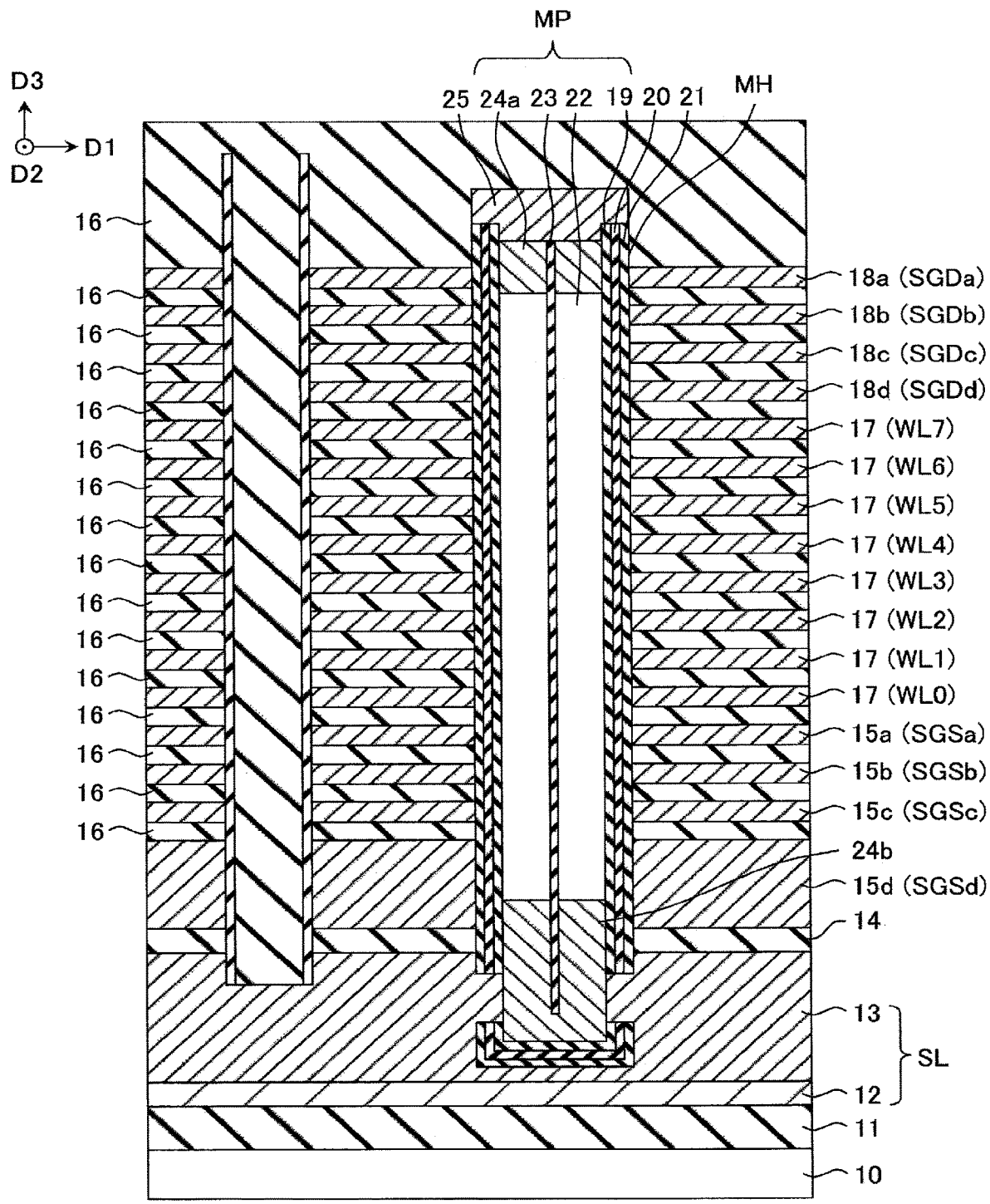
F I G. 50

SEMICONDUCTOR MEMORY DEVICE

CROSS-REFERENCE TO RELATED APPLICATIONS

This application is based upon and claims the benefit of priority from Japanese Patent Application No. 2018-053314, filed Mar. 20, 2018, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWING(S)

FIG. 1 is a block diagram of a semiconductor memory device according to a first embodiment;

FIG. 2 is a circuit diagram of a memory cell array in the semiconductor memory device according to the first embodiment;

FIGS. 4-18 are cross-sectional views illustrating a manufacturing process of the memory cell array in the semiconductor memory device according to the first embodiment;

FIG. 19 is a timing chart illustrating voltages of interconnects in an erase pulse application in the semiconductor memory device according to the first embodiment;

FIGS. 27-32 are cross-sectional views showing a manufacturing process of the memory cell array in the semiconductor memory device according to the third embodiment;

FIG. 34 is a cross-sectional view of a memory cell array in a semiconductor memory device according to a fourth embodiment;

FIGS. 35-40 are cross-sectional views showing a manufacturing process of the memory cell array in the semiconductor memory device according to the fourth embodiment;

FIG. 41 is a cross-sectional view of a memory cell array in a semiconductor memory device according to a fifth embodiment; and FIGS. 42-50 are cross-sectional views showing a manufacturing process of the memory cell array in the semiconductor memory device according to the fifth embodiment.

DETAILED DESCRIPTION

Figure 3:
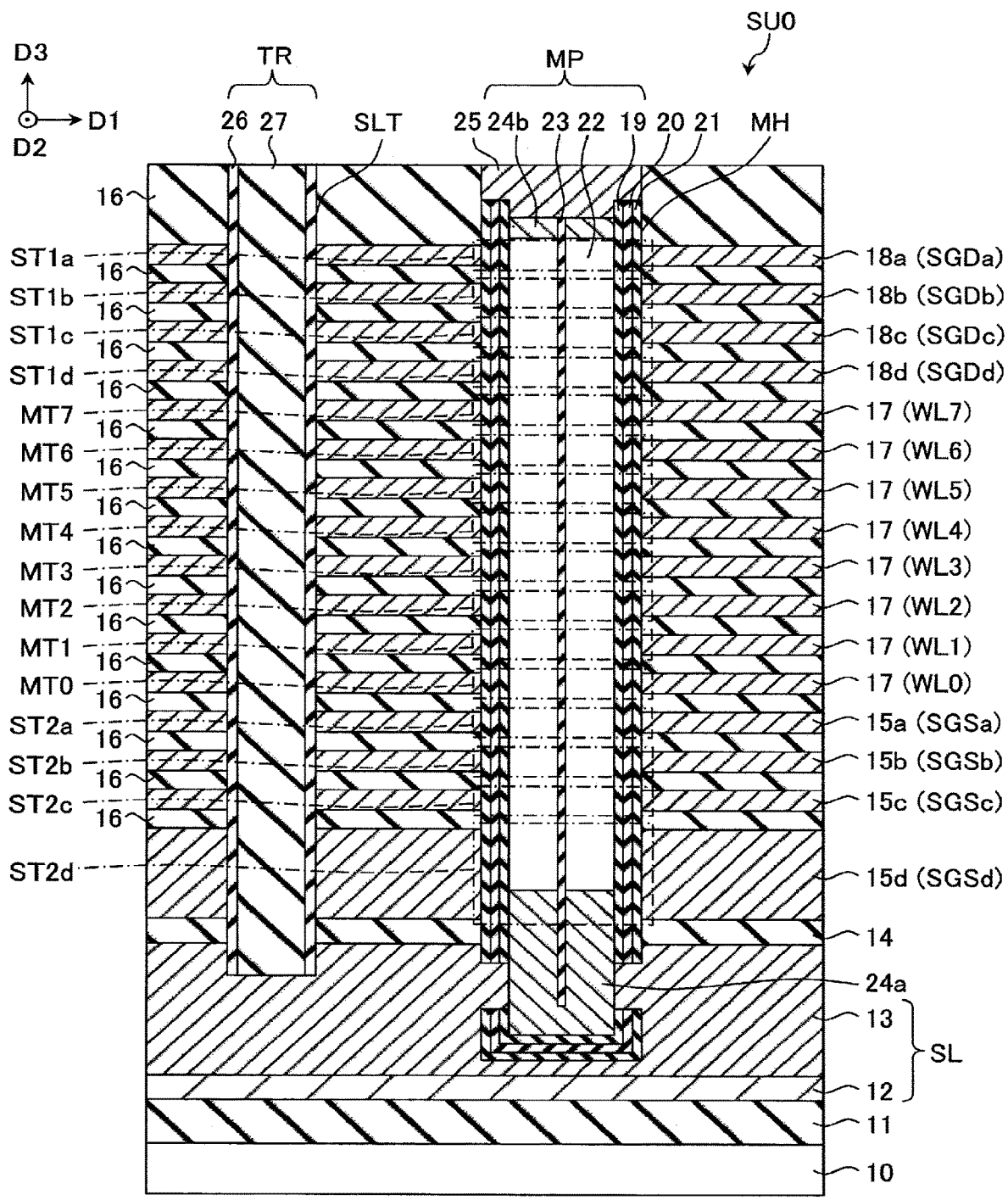
FIG. 3 is a cross-sectional view of the memory cell array in the semiconductor memory device according to the first embodiment.

In general, according to one embodiment, a semiconductor memory device includes: a first interconnect layer provided above a semiconductor substrate, a first insulating layer and a second interconnect layer stacked on the first interconnect layer, and a memory pillar penetrating the first insulating layer and the second interconnect layer so that a bottom surface of the memory pillar reaches an inner portion of the first interconnect layer, the memory pillar including a second insulating layer, a charge storage layer, and a third insulating layer stacked on a part of a side surface including an area in contact with the second interconnect layer and on the bottom surface of the memory pillar, and a first silicide layer in contact with the first interconnect layer, a semiconductor layer, and a second silicide layer stacked in order along a first direction perpendicular to the semiconductor substrate. In the first direction, a height position of a bottom surface of the first silicide layer is lower than a top surface of the first interconnect layer, and a height position of a top surface of the first silicide layer is higher than a bottom surface of the second interconnect layer.

1. FIRST EMBODIMENT

A semiconductor memory device according to a first embodiment will be described. In the following descriptions, as a semiconductor memory device, a three-dimensional stacked NAND flash memory with memory cell transistors stacked above a semiconductor substrate will be described by way of example.

1.1 CONFIGURATION

1.1.1 General Configuration of the Semiconductor Memory Device

First, an overall configuration of a semiconductor memory device will be described using FIG. 1. FIG. 1 is a block diagram illustrating an overall configuration of a NAND flash memory 100.

As depicted in FIG. 1, the NAND flash memory 100 generally comprises a memory core section 110 and a peripheral circuit 120.

The memory core section 110 comprises a memory cell array 111, a row decoder 112, a sense amplifier 113, and a source line driver 114.

The memory cell array 111 comprises a plurality of blocks BLK (BLK0, BLK1, . . . ) each of which is a set of a plurality of nonvolatile memory cell transistors. Data in the same block BLK is, for example, collectively erased.

Each of the blocks BLK comprises a plurality of string units SU (SU0, SU1, SU2, SU3, . . . ). Each of the string units SU comprises a plurality of NAND strings SR. In each of the NAND strings SR, the memory cell transistors are coupled together in series. Any number of blocks BLK, string units SU, and NAND strings SR may be provided in the memory cell array 111.

The row decoder 112 decodes, in write operation, read operation, and erase operation, an address of a block BLK or an address of a string unit SU to select a target word line.

In the read operation, the sense amplifier 113 senses data read onto a bit line from a memory cell transistor. In the write operation, the sense amplifier 113 transfers write data to the memory cell transistor.

The source line driver 114 applies voltages needed for a source line during the write operation, read operation, and erase operation.

The peripheral circuit 120 comprises a sequencer 121 and a voltage generator 122.

The sequencer 121 controls overall operation of the NAND flash memory 100.

The voltage generator 122 generates voltages needed for the write operation, read operation, and erase operation, and supplies the voltages to the row decoder 112, the sense amplifier 113, the source line driver 114, etc.

1.1.2 Configuration of the Memory Cell Array

Now, a configuration of the memory cell array 111 will be described using FIG. 2. An example of FIG. 2 depicts a circuit diagram of a block BLK0, but the other blocks BLK have similar configurations.

As depicted in FIG. 2, each of the NAND strings SR includes, for example, 8 memory cell transistors MT (MT0 to MT7), 4 select transistors ST1 (ST1a to ST1d), and 4 select transistors ST2 (ST2a to ST2d). Each memory cell transistor MT is provided with a stacked gate including a control gate and a charge storage layer to hold data in a nonvolatile manner. The memory cell transistors MT may be of a MONOS type in which an insulating film is used as the charge storage layer or an FG type in which a conductive film is used as the charge storage layer. In the following, in the present embodiment, a MONOS type will be explained by way of example. In addition, the number of the memory cell transistors MT is not limited to 8, and may be, for example, 16, 32, 64, or 128, etc. Moreover, the example of FIG. 2 illustrates a case where 4 select transistors ST1 and 4 select transistors ST2 are present, but each of the select transistors ST1 and ST2 may be one or more.

Current paths of the memory cell transistors MT0 to MT7 are coupled together in series. A drain of the memory cell transistor MT7 is coupled to a source of the select transistor ST (ST1d), and a source of the memory cell transistor MT0 is coupled to a drain of the select transistor ST2 (ST2a).

Current paths of the select transistors ST1a to ST1d are coupled together in series. A drain of the select transistor ST1a is coupled to a corresponding bit line BL. Gates of the select transistors ST1a to ST1d are coupled to a common select gate line SGD via select gate lines SGDa to SGDd, respectively. Thus, the four select transistors ST1a to ST1d function as one select transistor ST1.

Similarly, current paths of the select transistors ST2a to ST2d are coupled together in series. A source of the select transistor ST2d is coupled to a source line SL. Gates of the select transistors ST2a to ST2d are coupled to a common select gate line SGS via the select gate lines SGSa to SGSd, respectively. Thus, the four select transistors ST2a to ST2d function as one select transistor ST2.

Gates of the select transistor ST1 (ST1a to ST1d) of each NAND string SR in the same string unit SU are commonly coupled to the same select gate line SGD. In the example of FIG. 2, gates of the select transistors ST1 in the string unit SU0 of the block BLK0 are coupled to a common select gate line SGD0, and gates of the select transistors ST1 (not depicted in the drawings) in the string unit SU1 are coupled to a common select gate line SGD1.

Similarly, gates of the select transistors ST2 (ST2a to ST2d) of each of the NAND strings SR in the same block BLK are coupled to a common select gate line SGS.

Control gates of the memory cell transistors MT0 to MT7 of each of the NAND strings SR in the same block BLK are commonly coupled to different word lines WL0 to WL7, respectively.

Among the NAND strings SR arranged in a matrix in the memory cell array 111, drains of the select transistors ST1 (ST1a) of the NAND strings SR in the same row are respectively coupled to different bit lines BL (BL0 to BL(N-1), (N-1) is an integer of 1 or more), and drains of the select transistors ST1 (ST1a) of the NAND strings SR in the same column are commonly coupled to any one of the bit lines BL0 to BL(N-1). Namely, a bit line BL commonly couples the NAND strings SR among a plurality of blocks BLK. In addition, sources of the select transistors ST2 (ST2d) in each block BLK are coupled to a common source line SL. Namely, a source line SL, for example, commonly couples the NAND strings SR among a plurality of blocks BLK.

In other words, a string unit SU is an aggregate of the NAND strings SR coupled to the different bit lines BL and also coupled to the same select gate line SGD. A block BLK is an aggregate of a plurality of string units SU using the common word lines WL. The memory cell array 111 is an aggregate of a plurality of blocks BLK using the common bit lines BL.

1.1.3 Cross-Sectional Configuration of the Memory Cell Array

Now, a cross-sectional configuration of the memory cell array 111 will be described using FIG. 3. An example of FIG. 3 depicts a cross section of the string unit SU0, but the other string units SU have similar configurations. In addition, in the example of FIG. 3, for simplification of the descriptions, a film thickness of a gate electrode layer 15d functioning as the select gate line SGSd is depicted thicker than that of gate electrode layers 15a to 15c functioning as select gate lines SGSa to SGSc, but the gate electrode layers 15a to 15d may have the same film thickness. Furthermore, in the example of FIG. 3, contacts formed on a memory pillar MP and bit lines EL coupled to the contacts are omitted.

As depicted in FIG. 3, the memory cell array 111 includes a trench TR and a memory pillar MP functioning as a NAND string SR. One memory pillar MP corresponds to one NAND string SR. The trench TR is provided to separate the word lines WL0 to WL7, the select gate lines SGDa to SGDd, and SGSa to SGSd for each string unit SU between the string units SU. For example, in FIG. 3, a plurality of NAND strings SR (memory pillar MP) of the string unit SU0 are arranged along a second direction D2 parallel to the semiconductor substrate 10, and the trench TR extending in the second direction D2 in parallel to these NAND strings SR is provided.

On the semiconductor substrate 10, an insulating layer 11 is formed, and interconnect layers 12 and 13 functioning as a source line SL are stacked on the insulating layer 11. As the insulating layer 11, for example, a silicon oxide film ($SiO_2$) is used. An interconnect layer 12 is a metal interconnect layer, and as a conductive material, tungsten (W), for example, is used, and as a W barrier metal, a stacked film of titanium nitride/titanium (TiN/Ti) (not depicted in the drawings), etc. is used. As a barrier metal, a single-layered film of TiN, etc. may be used. In addition, as the interconnect layer 13, for example, an n-type semiconductor containing impurities, such as phosphorus (P) or arsenic (As), as a conductive material is used. In the following, in the present embodiment, a case where a P doped poly-Si is used as the interconnect layer 13 will be described by way of example.

On the interconnect layer 13, an insulating layer 14, and a gate electrode layer 15d functioning as the select gate line SGSd are stacked. Furthermore, on the gate electrode layer 15d, gate electrode layers 15c, 15b, and 15a, eight gate electrode layers 17, and gate electrode layers 18d to 18a are stacked in order from the lower layer via insulating layers 16 which lie between the respective layers. Then, an insulating layer 16 is formed on the uppermost gate electrode layer 18a. The gate electrode layers 15a to 15c function as the select gate lines SGSa to SGSc, respectively. The eight gate electrode layers 17 function as the word lines WL0 to WL7 in order from the lower layer. The gate electrode layers 18a to 18d function as the select gate lines SGDa to SGDd. As the insulating layers 14 and 16, for example, $SiO_2$ is used. As the gate electrode layers 15a to 15d, 17, and 18a to 18d, as a conductive material, for example, a metal material such as W, etc. or an n-type semiconductor or a p-type semiconductor in which impurities are added to the semiconductor may be used. In the following, in the present embodiment, a case where a P doped poly-Si is used as the gate electrode layer 15d, and W (and a stacked film, such as TiN/Ti as a barrier metal) is used as the gate electrode layers 15a to 15c, 17, and 18a to 18d will be described.

The trench TR includes insulating layers 26 and 27. More specifically, a slit SLT is formed so as to penetrate the gate electrode layers 15a to 15d, the eight gate electrode layers 17, the gate electrode layers 18a to 18d, a plurality of insulating layers 16, and the insulating layer 14 to reach the interconnect layer 13. On a side surface of the slit SLT, the insulating layer 26 is formed, and an inner portion of the slit SLT is filled with the insulating layer 27. As the insulating layer 26, for example, a silicon nitride film (SiN) is used. In addition, as the insulating layer 27, for example, $SiO_2$ is used. In the following, a case where the insulating layer 27 and the insulating layers 16 are made from the same material ($SiO_2$).

The memory pillar MP includes a tunnel insulating film 19, a charge storage layer 20, a block insulating film 21, a semiconductor layer 22, a core layer 23, a silicide layers 24 (24a and 24b), and a cap layer 25. Then, by the memory pillar MP and the word lines WL0 to WL7, memory cell transistors MT0 to MT7 are constituted. Similarly, by the memory pillar MP and the select gate lines SGD (SGDa to SGDd) and SGS (SGSa to SGSd), the select transistors ST1 (ST1a to ST1d) and ST2 (ST2a to ST2d) are constituted.

More specifically, a memory hole MH is formed so as to penetrate the gate electrode layers 15a to 15d, the eight gate electrode layers 17, the gate electrode layers 18a to 18d, a plurality of insulating layers 16, and the insulating layer 14 to reach the interconnect layer 13. On a part of a side surface and a bottom surface of the memory hole MH, the block insulating film 21, the charge storage layer 20, and the tunnel insulating film 19 are sequentially formed. An inner portion of the memory hole MH is filled with the silicide layer 24a, the semiconductor layer 22, the silicide layer 24b, and the cap layer 25 from the lower place, and a core layer 23 extending in a third direction D3 perpendicular to the semiconductor substrate 10 is further provided in the center of the memory hole MH. The semiconductor layer 22 within the memory hole MH serves as an area where channels of the memory cell transistors MT and the select transistors ST1 and ST2 are formed. The block insulating film 21, the charge storage layer 20, and the tunnel insulating film 19 on the side surface of the memory hole MH are formed to prevent the gate electrode layers 15a to 15d, the eight gate electrode layers 17, and the gate electrode layers 18a to 18d from being in contact with the silicide layer 24a, the semiconductor layer 22, and the silicide layer 24b. Namely, in the memory hole MH, the block insulating film 21, the charge storage layer 20, and the tunnel insulating film 19 are formed on a part of the side surface including an area in contact with the gate electrode layers 15a to 15d, the eight gate electrode layers 17, and the gate electrode layers 18a to 18d. Then, in a top of the memory hole MH and a part of an area in contact with the interconnect layer 13, the block insulating film 21, the charge storage layer 20, and the tunnel insulating film 19 are removed. Thus, a part of a side surface of the silicide layer 24a as the lower layer is in contact with the interconnect layer 13.

In the example of FIG. 3, a height position of a bottom surface of the silicide layer 24a in the third direction D3 is lower than a top surface of the interconnect layer 13, and is higher than a bottom surface of the interconnect layer 13. In addition, a height position of a top surface of the silicide layer 24a, i.e., an interface between the silicide layer 24a and the semiconductor layer 22 is higher than a bottom surface of the gate electrode layer 15d, and is lower than a top surface of the gate electrode layer 15d. Thus, the select transistor ST2d functions as a gated diode that is a Schottky diode by a junction of the silicide layer 24a and the semiconductor layer 22, i.e., a metal-semiconductor junction, which is gate-controlled. The height position of the interface between the silicide layer 24a and the semiconductor layer 22 may be higher than the top surface of the gate electrode layer 15d. The height position of the interface between the silicide layer 24a and the semiconductor layer 22 may be lower than the top surface of the gate electrode layer 15a so that at least the select transistor ST2a operates as the select transistor ST2.

In addition, in the example of FIG. 3, a top surface of the silicide layer 24b in the third direction D3, i.e., the height position of the interface between the silicide layer 24b and the cap layer 25, is higher than a top surface of the gate electrode layer 18a. Furthermore, a bottom surface of the silicide layer 24b, i.e., the height position of an interface between the silicide layer 24b and the semiconductor layer 22, is higher than a top surface of the gate electrode layer 18a. The height position of the interface between the silicide layer 24b and the semiconductor layer 22 may be lower than the top surface of the gate electrode layer 18a. The height position of the interface between the semiconductor layer 22 and the silicide layer 24b may be higher than a bottom surface of the gate electrode layer 18d so that at least the select transistor ST1d operates as the select transistor ST1.

As the block insulating film 21 and the tunnel insulating film 19, $SiO_2$, for example, is used. As the charge storage layer 20, SiN, for example, is used. As the silicide layers 24a and 24b, for example, a metal silicide using nickel (Ni), cobalt (Co), aluminum (Al), palladium (Pd), or other metals is used. As the semiconductor layer 22, for example, a non-doped monocrystal silicon formed by metal induced lateral crystallization (MILC) is used. The MILC is a method for forming a monocrystal silicon from a metal silicide, such as nickel die silicide ($NiSi_2$), as a base point. A specific manufacturing method by the MILC will be described later. For the cap layer 25, as a conductive material, for example, a metal material, such as W, or an n-type semiconductor may be used. In the following, a case where $NiSi_2$ is used as the silicide layers 24a and 24b, and a P doped poly-Si is used as the cap layer 25 will be described. A lattice constant of $NiSi_2$ has only about a 0.3% mismatch with a lattice constant of Si, and thus NiSi$_2$ is suitable for forming a monocrystal silicon by the MILC.

A barrier metal may be provided at an interface between the silicide layer 24a as the lower layer and the interconnect layer 13. In this case, as a barrier metal, a stack structure, such as TiN/Ti, for example, may be used. In addition, as the semiconductor layer 22, germanium (Ge) or silicon germanium (SiGe) may be used. Furthermore, the core layer 23 may not be provided.

1.2 MANUFACTURING METHOD OF THE MEMORY CELL ARRAY

Now, a method of manufacturing the memory cell array 111 will be described using FIGS. 4 to 18.

Figure 4:
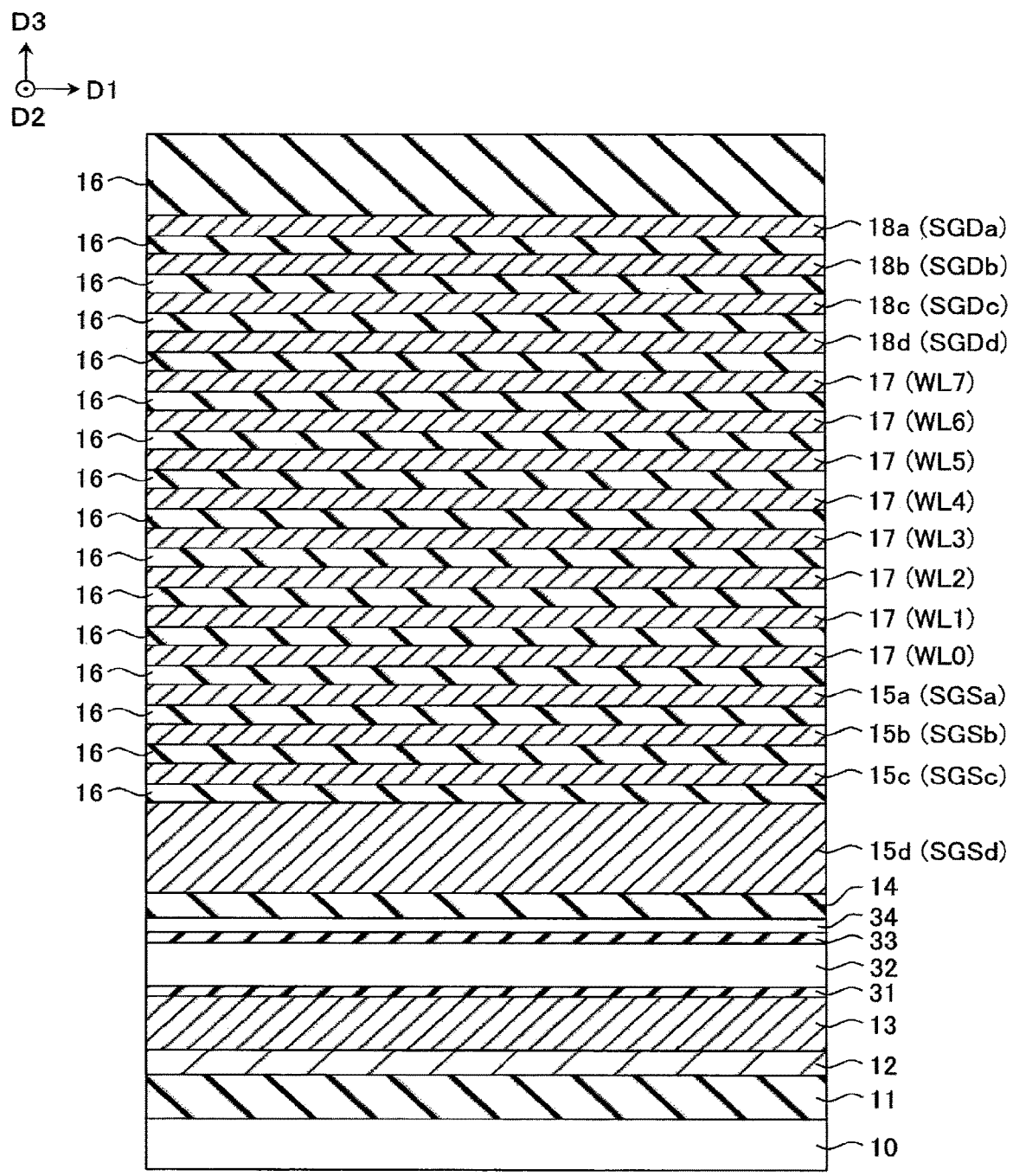

As depicted in FIG. 4, on the semiconductor substrate 10, the insulating layer 11, the interconnect layer 12, the interconnect layer 13, the insulating layer 31, the semiconductor layer 32, the insulating layer 33, the semiconductor layer 34, the insulating layer 14, and the gate electrode layer 15d are sequentially stacked. Then, on the gate electrode layer 15d, the gate electrode layers 15c to 15a, the eight gate electrode layers 17, and the gate electrode layers 18d to 18a are sequentially formed via insulating layers 16 that lie between the respective interconnect layers. Furthermore, an insulating layer 16 is formed on the gate electrode layer 18a. As the insulating layers 31 and 33, SiO$_2$, for example, is used. As the semiconductor layers 32 and 34, a non-doped amorphous Si, for example, is used.

Figure 5:
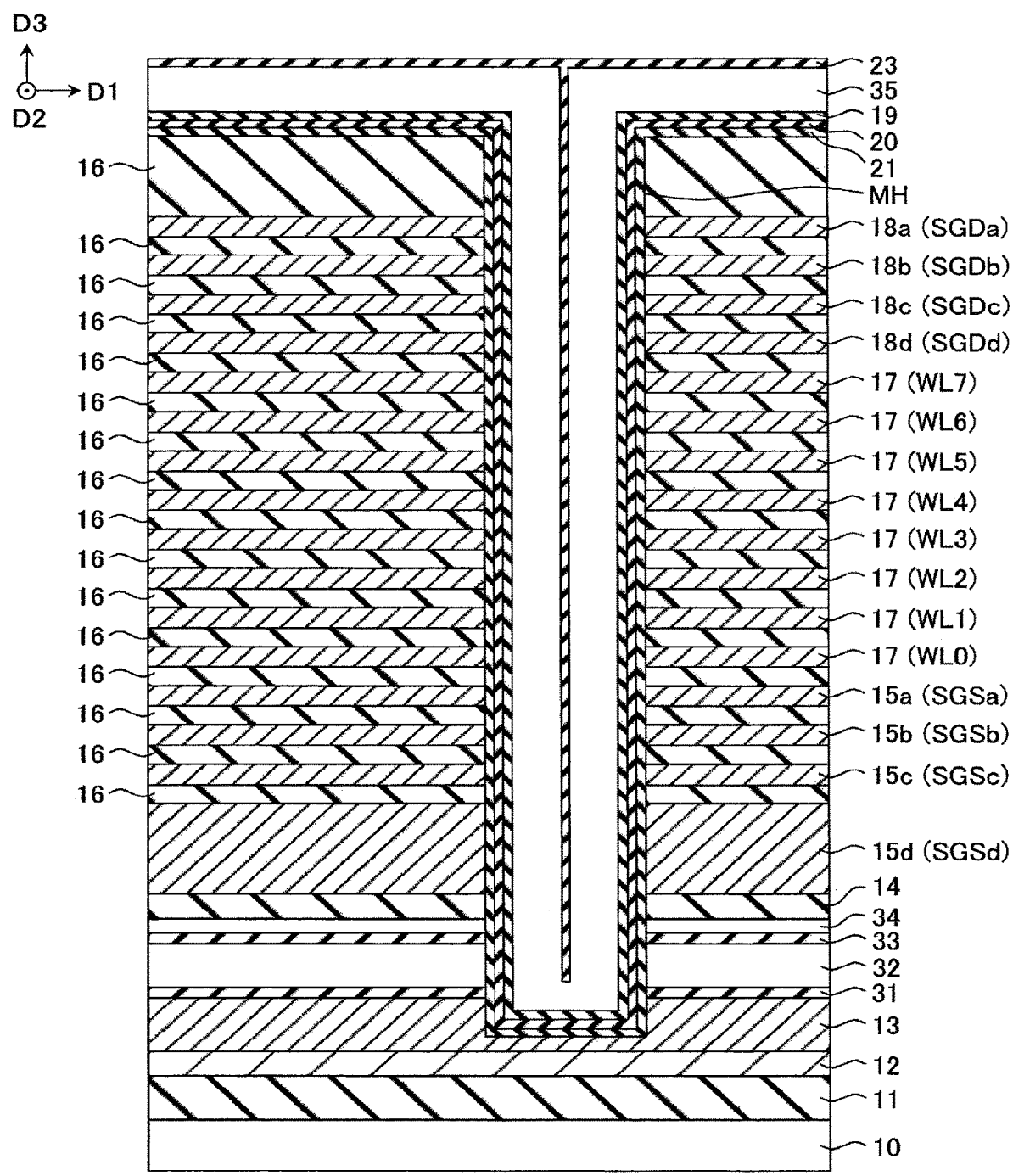

As depicted in FIG. 5, the memory hole MH is formed so that a bottom surface of the memory hole MH reaches the interconnect layer 13, and the block insulating film 21, the charge storage layer 20, the tunnel insulating film 19, the semiconductor layer 35, and the core layer 23 are sequentially stacked. As the semiconductor layer 35, amorphous silicon, for example, is used. In a case where the memory hole MH inner portion is filled with the semiconductor layer 35, or the memory hole MH opening is closed, the core layer 23 may not be formed in the inner portion of the memory hole MH.

As depicted in FIG. 6, the cap layer 25 is formed on the top of the memory hole MH. More specifically, excess block insulating film 21, charge storage layer 20, tunnel insulating film 19, semiconductor layer 35, and core layer 23 on the insulating layer 16 are removed by, for example, dry etching. At this time, in an upper portion inside the memory hole MH, the block insulating film 21, the charge storage layer 20, the tunnel insulating film 19, the semiconductor layer 35, and the core layer 23 are partially etched. After that, the cap layer 25 is formed so as to fill the top of the memory hole MH. Then, for example, the cap layer 25 on the insulating layer 16 is removed by dry etching.

Figure 7:
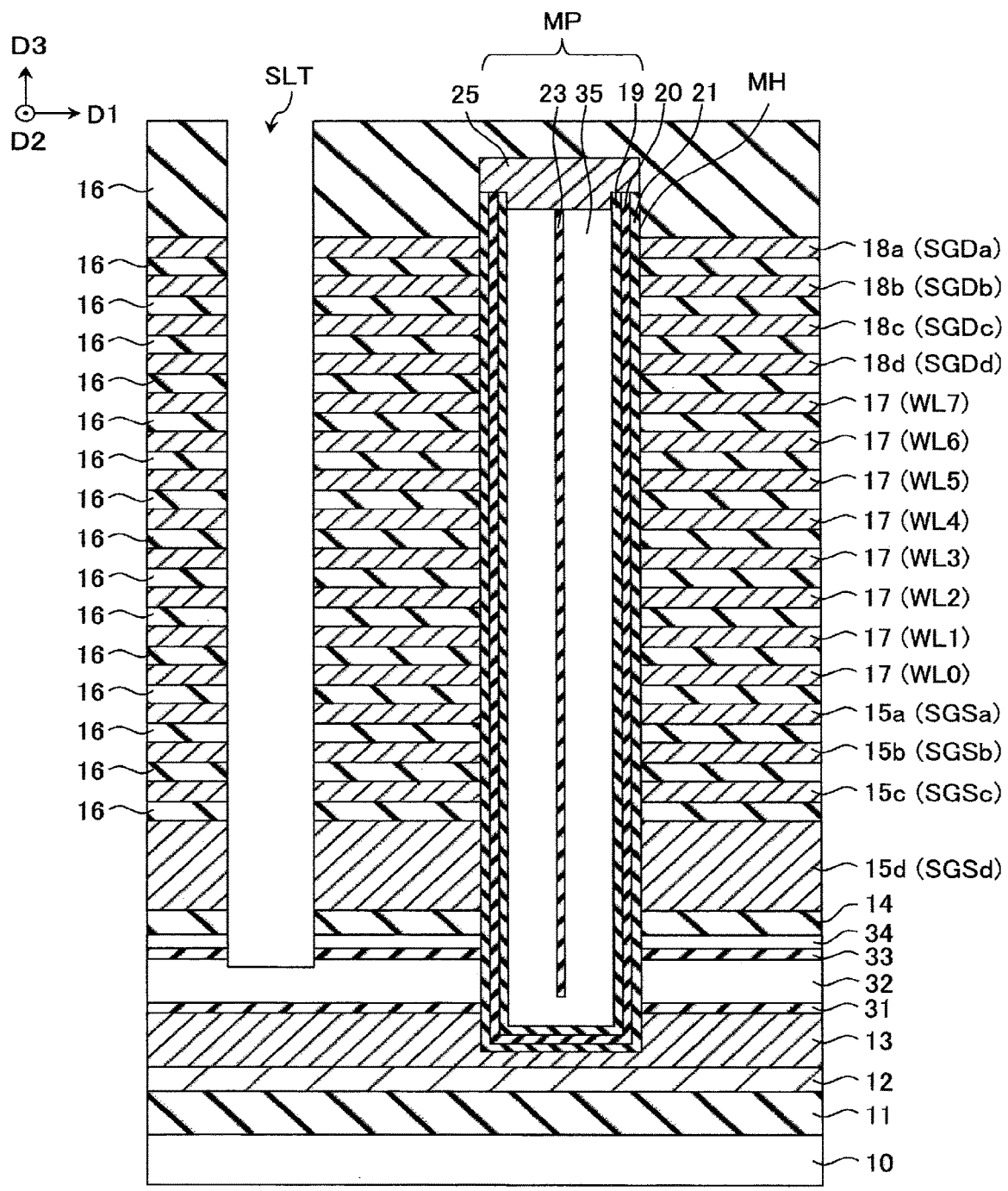

As depicted in FIG. 7, after forming the insulating layer 16 on the cap layer 25, the slit SLT is formed so that a bottom surface of the slit SLT reaches the semiconductor layer 32.

As depicted in FIG. 8, an insulating layer 26 is formed on a side surface of the slit SLT. More specifically, after forming the insulating layer 26 having a film thickness thin enough to not fill inside the slit SLT on the insulating layer 16 and inside the slit SLT, the insulating layers 26 on the insulating layer 16 and of the bottom portion of the slit SLT are removed by dry etching.

Figure 9:
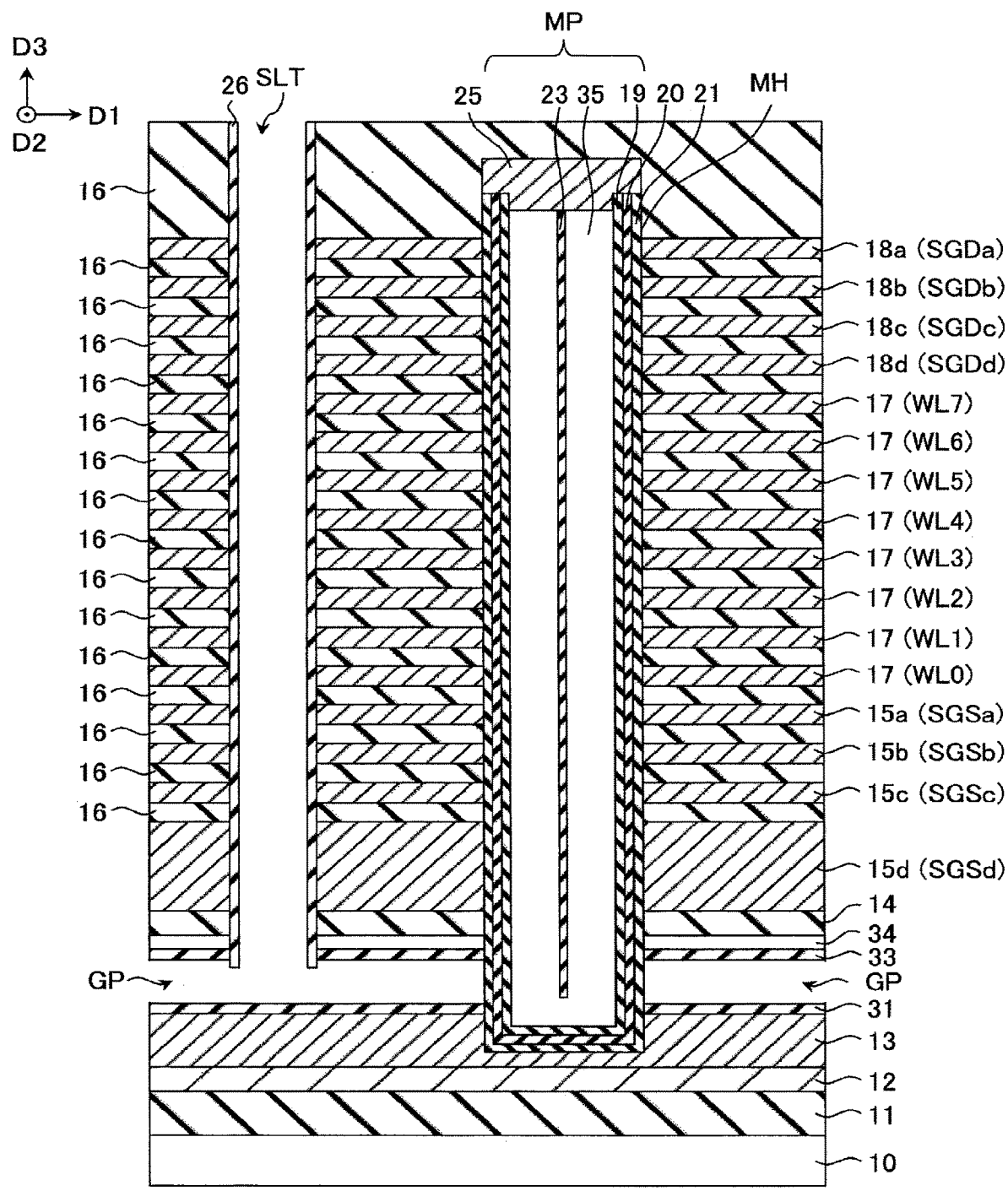

As depicted in FIG. 9, for example, the semiconductor layer 32 is removed by wet etching using an alkali chemical solution, and a gap GP is formed between the insulating layers 31 and 33.

Figure 10:
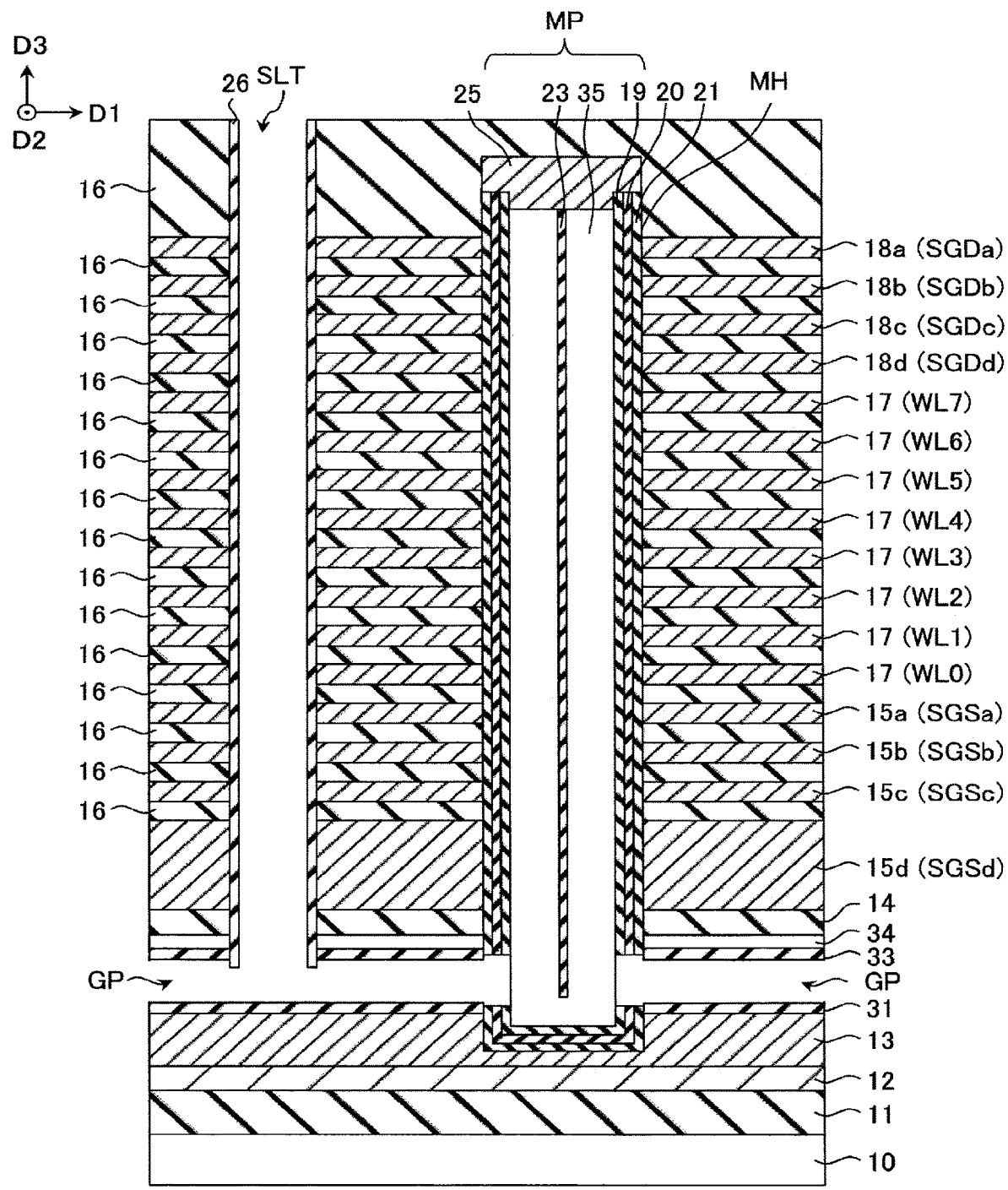

As depicted in FIG. 10, for example, the block insulating film 21, the charge storage layer 20, and the tunnel insulating film 19 in the gap GP are removed by wet etching using a hydrofluoric acid chemical solution to expose the semiconductor layer 35. At this time, the core layer 23, and the insulating layers 26, 31, and 33 are also etched, but are to have a film thickness thicker than the block insulating film 21, the charge storage layer 20, and the tunnel insulating film 19 so that the respective layers will not be completely removed by wet etching.

As depicted in FIG. 11, for example, a conductive layer 36 is formed inside the gap GP, and on the slit SLT side surface and the insulating layer 16 by atomic layer deposition (ALD), chemical vapor deposition (CVD), or plating. As the conductive layer 36, Ni, Co, Al, Pd, or a metal silicide thereof, for example, is used to form the silicide layers 24a and 24b. In the following, a case of using Ni as the conductive layer 36 will be described.

Figure 12:
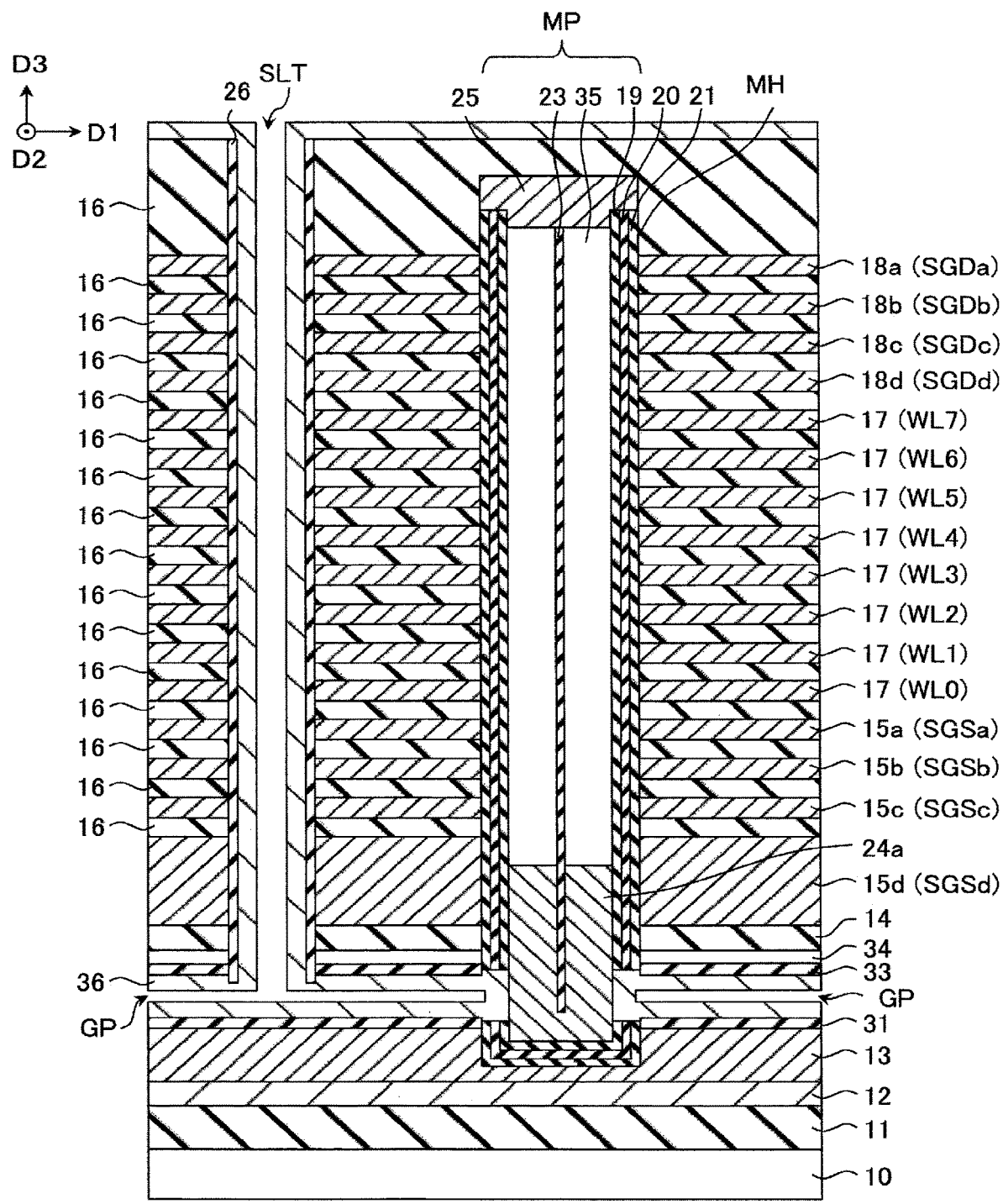

As depicted in FIG. 12, for example, heat treatment (hereinafter, referred to as "silicide heat treatment") for silicide processing, is performed by a rapid thermal process (RTP), and the conductive layer 36 (Ni) and the semiconductor layer 35 (amorphous silicon) are reacted to form the silicide layer 24a (NiSi$_2$) in the bottom portion of the memory hole MH. The silicide heat treatment is performed at a lower temperature than a heat treatment for the MILC (hereinafter, referred to as "MILC heat treatment") to be performed in a later process so as to prevent crystallization of amorphous silicon (semiconductor layer 35) by the MILC in this process. More specifically, for example, in a case of forming NiSi$_2$, although it depends on the film thickness of amorphous silicon, the monocrystallization of amorphous silicon by the MILC occurs typically at 550° C. or higher, and thus the silicide heat treatment is performed at a temperature of 450° C. or lower. For example, the amount of the silicide layer 24a to be formed is controlled by processing time of the silicide heat treatment.

Figure 13:
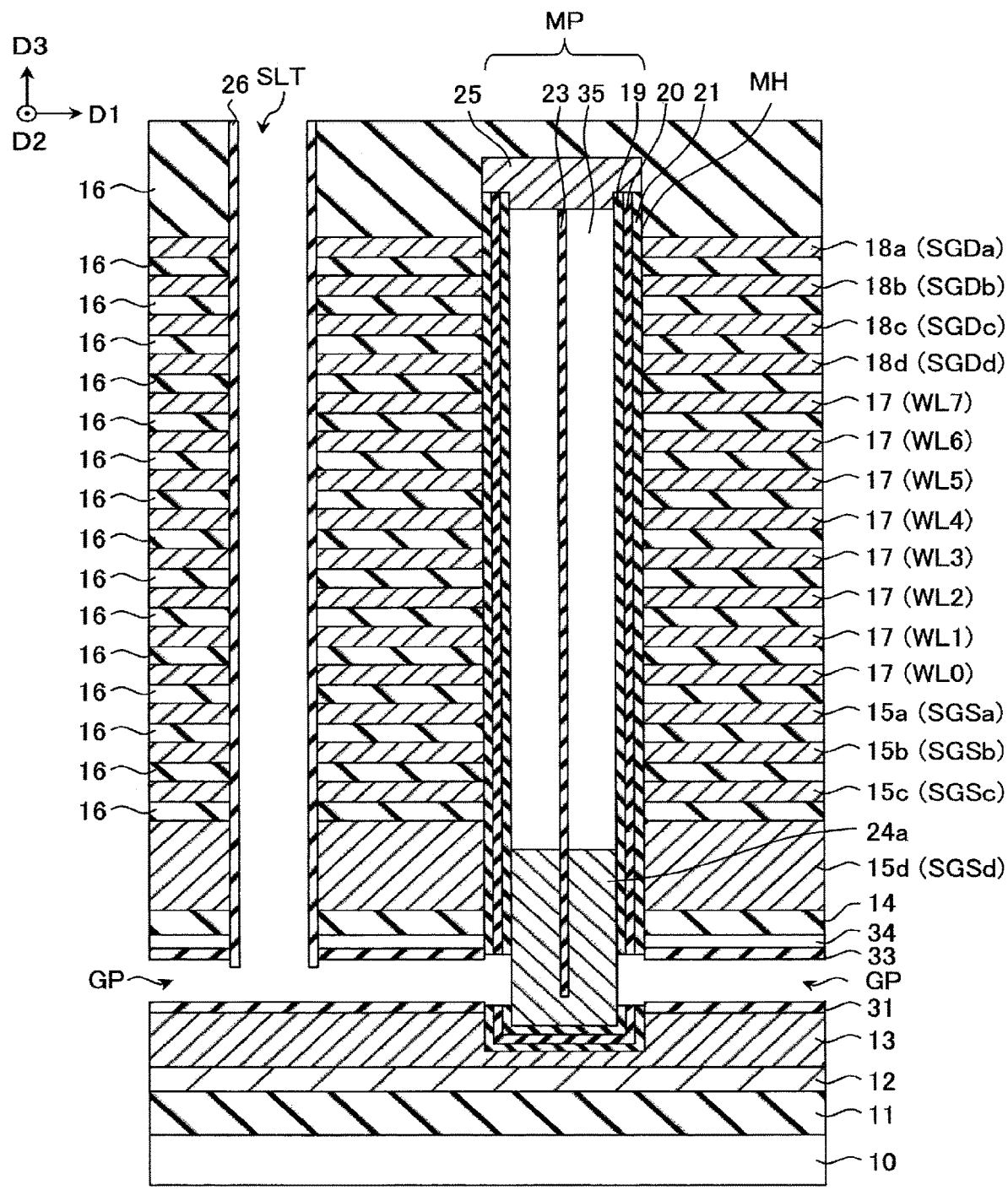

As depicted in FIG. 13, for example, by wet etching using an aqueous sulfuric acid solution (a mixture of sulfuric acid and hydrogen peroxide solution), excess conductive layer 36, i.e. Ni, inside the gap GP and on the slit SLT side surface and the insulating layer 16 is removed.

Figure 14:
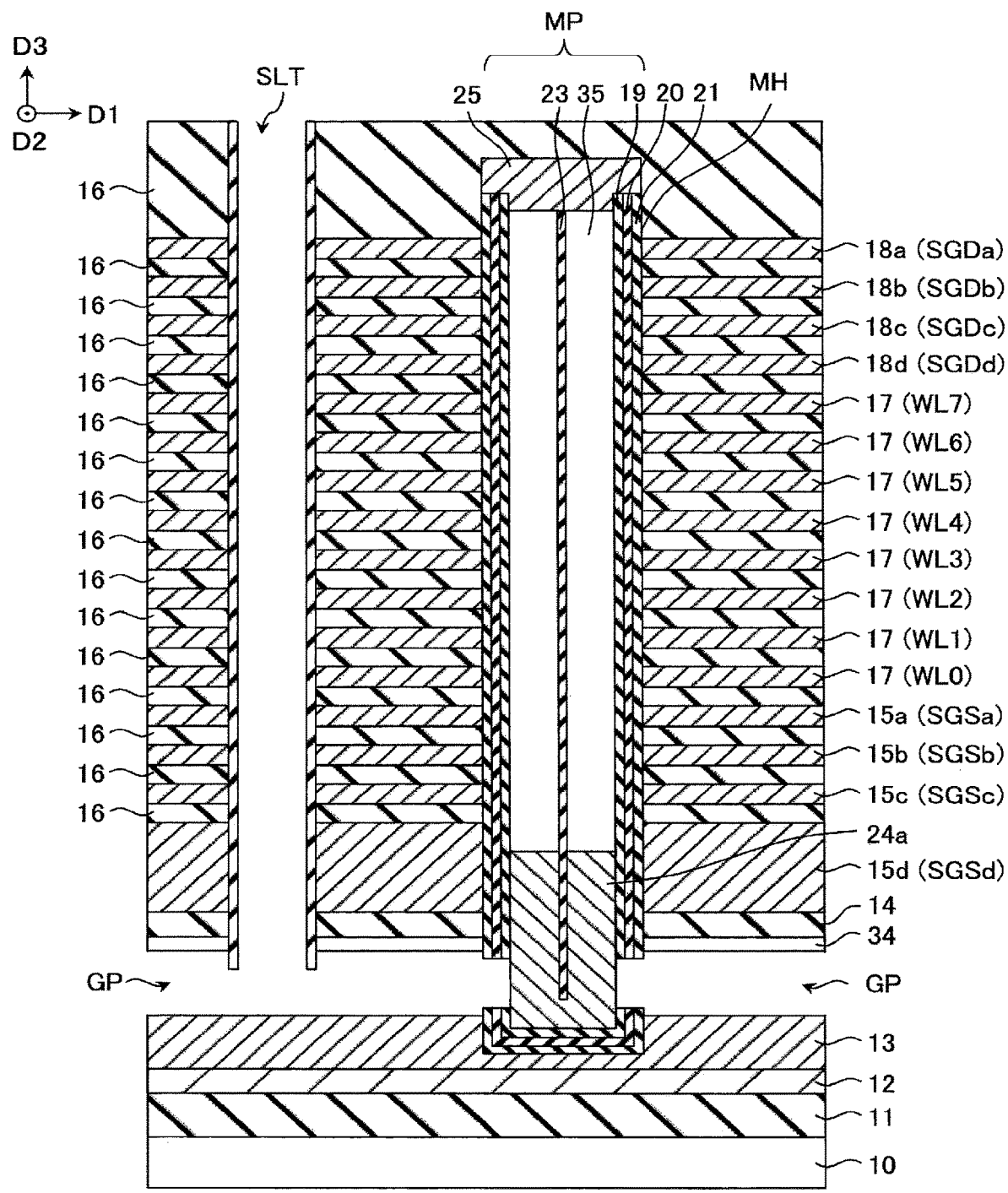

As depicted in FIG. 14, for example, the insulating layers 31 and 33 are removed by hydrofluoric acid wet etching. As depicted in FIG. 15, the gap GP is filled with the interconnect layer 13 (P doped poly-Si). More specifically, a P doped amorphous Si is formed by CVD, for example, to fill the gap GP. Next, the heat treatment is performed to polycrystallize the P doped amorphous Si, forming a P doped poly-Si. At this time, P (phosphorus) is diffused in the semiconductor layer 34, and the semiconductor layer 34 will also be a P doped poly-Si. The temperature of the heat treatment at the time of polycrystallizing the P doped amorphous Si is set to, for example, about 500° C., to suppress the monocrystallization of amorphous silicon by the MILC. After that, excess P doped poly-Si in the slit SLT and on the insulating layer 16 is removed by, for example, wet etching. Thus, a source line SL is formed by the interconnect layers 12 and 13. It should be noted that the heat treatment for polycrystallization may be performed after removing the excess P doped amorphous Si by wet etching.

Figure 16:
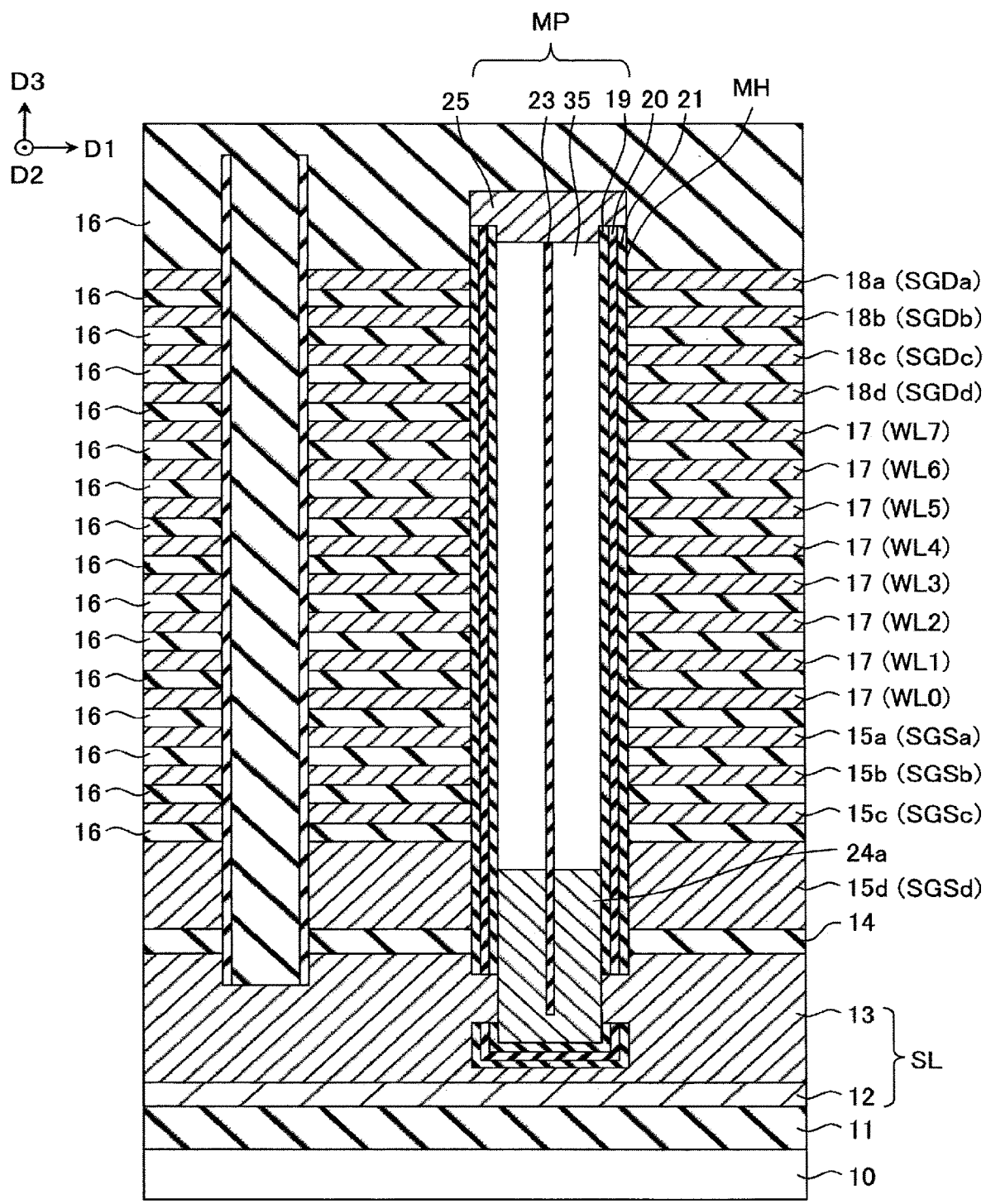

As depicted in FIG. 16, the insulating layer 16 (insulating layer 27) is formed to fill inside the slit SLT.

Figure 18:
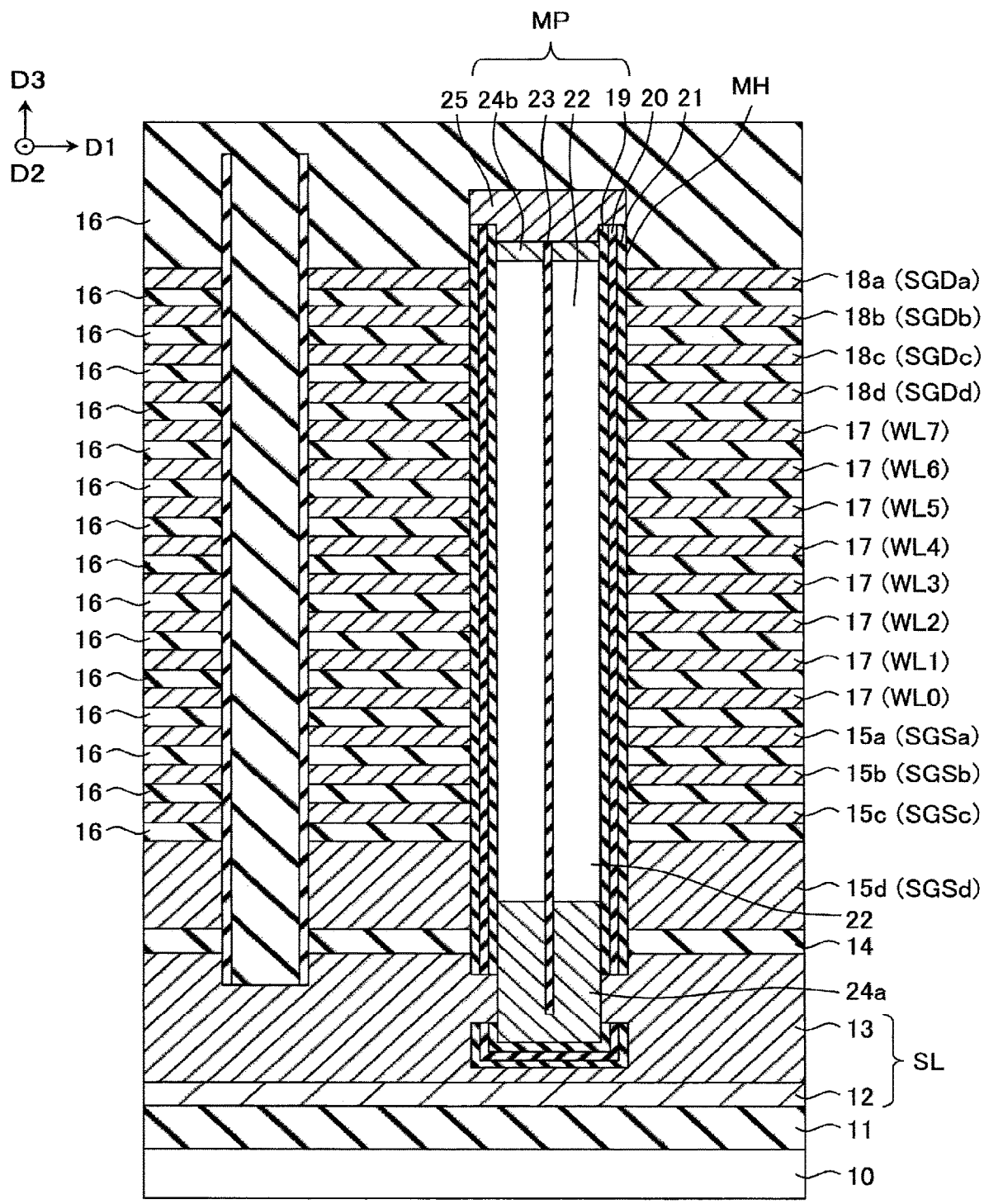

As depicted in FIGS. 17 and 18, the MILC heat treatment is performed by the RTP. For example, in a case of the MILC using NiSi$_2$, the MILC heat treatment is performed at a temperature of about 550° C. By the MILC heat treatment, a part of the silicide layer 24a moves, as the silicide layer 24b, to an upper portion of the memory hole MH. Namely, the silicide layer 24b moves inside the semiconductor layer 35 (amorphous Si). At this time, in an area where the silicide layer 24b passes, with the silicide layer 24b as a starting point of crystal growth, amorphous Si (semiconductor layer 35) epitaxially grows so that a monocrystal silicon (semiconductor layer 22) is formed. By controlling the temperature and processing time of the MILC heat treatment, the silicide layer 24b moves up to the top (a position in contact with a bottom surface of the cap layer 25) of the memory pillar MP.

1.3 ERASE OPERATION

Next, an erase operation will be briefly described. An erase operation generally includes a copy program operation and a data erase operation. The copy program operation is, for example, an operation to copy data to a non-erase target block BLK in a case where there is valid data in an erase target block BLK. The data erase operation includes an operation to apply an erase pulse for erasing data, and an erase verify operation for verifying if data in the erase target block BLK is erased, and the erase pulse application operation and the erase verify operation will be repeated until the data in the erase target block BLK is erased.

Now, a voltage of each interconnect at the time of applying the erase pulse will be described using FIG. 19.

As depicted in FIG. 19, at time t1, a source line driver 114 applies a voltage VERA to a source line SL. The voltage VERA is a high voltage for generating a gate induced drain leakage (GIDL) current on a junction interface between the silicide layer 24a and the semiconductor layer 22 when the erase pulse is applied. Then, the row decoder 112 applies a voltage VERA_GIDL to the select gate lines SGS (SGSa to SGSd) of the select block BLK. The voltage VERA_GIDL is a high voltage for generating the GIDL current by putting the select transistors ST2 (ST2a to ST2d) in an ON state, and is in a relation of VERA>VERA_GIDL. On the other hand, the sense amplifier 113 applies a ground voltage VSS to a bit line BL. In addition, the row decoder 112 applies the voltage VSS to the select gate lines SGD (SGDa to SGDd) of the select block BLK.

In this state, the row decoder 112 applies the voltage VERA_WL to the word lines WL0 to WL7. VERA_WL is set to a voltage sufficiently lower than the voltage VERA so that a positive hole generated by the GIDL current will be injected into the charge storage layer 20 of the memory cell transistor MT. Thus, the positive hole generated by the GIDL current is supplied to the charge storage layer 20 of the memory cell transistors MT0 to MT7 coupled to the word lines WL0 to WL7, and the data is erased.

After that, recovery processing is performed at time t2. Namely, the voltage VSS is applied to the source line SL, the word line WL, and the select gate line SGS.

1.4 EFFECTS RELATED TO THE PRESENT EMBODIMENT

According to the configuration of the present embodiment, the memory pillar MP includes the silicide layer 24a in contact with the source line SL and the semiconductor layer 22 in contact with the silicide layer 24a. Then, by forming an interface between the silicide layer 24a and the semiconductor layer 22 in a channel area of the select transistor ST2d, a Schottky diode by a metal-semiconductor junction is formed in the channel area to have the select transistor ST2d to be a gated diode. Thus, the following advantageous effect can be obtained.

Figure 20:
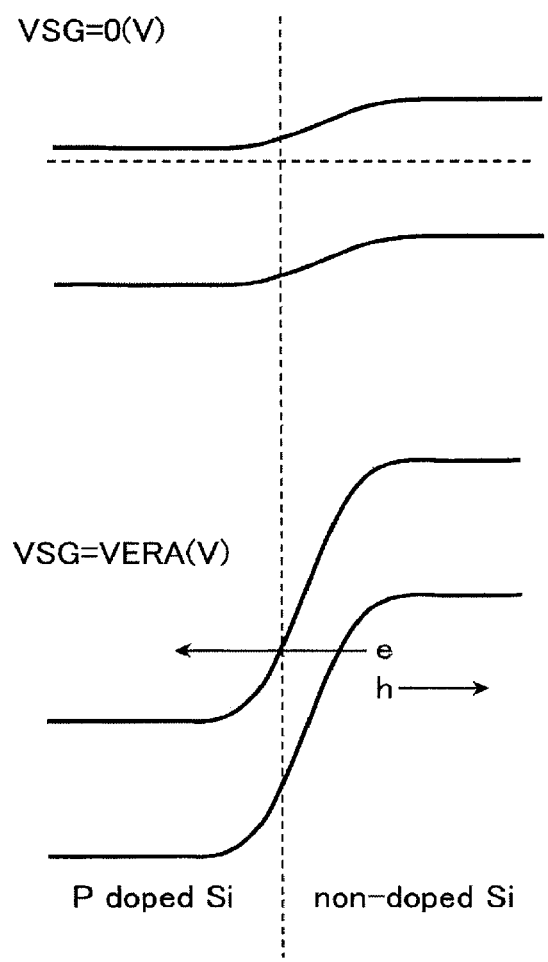
FIG. 20 is a diagram illustrating a band gap of a memory pillar in a comparative example.

For example, differences between a case where a P doped Si is used instead of the silicide layer 24a as a comparative example and a case of applying the present embodiment will be described using FIGS. 20 and 21. FIG. 20 is a band diagram depicting a junction interface of P doped Si/non-doped Si as a comparative example, and FIG. 21 is a band diagram depicting a junction interface of $NiSi_2$/non-doped Si to which the present embodiment is applied.

An impurity concentration in the junction interface of P doped Si/non-doped Si continuously and gradually changes due to effects of thermal diffusion. Thus, as depicted in FIG. 20, band bending in the junction interface of the P doped Si/non-doped Si is relatively gentle. In the erase operation, magnitude of an electric field at the junction interface of P doped Si/non-doped Si is weak even if applying the voltage VERA to the source line SL, the GIDL current becomes small (generation of a positive hole is reduced), and an erasure characteristic becomes insufficient. Thus, the number of times of repeating the erase pulse application and erase verify tends to increase, and the erasing time tends to be lengthened.

Figure 21:
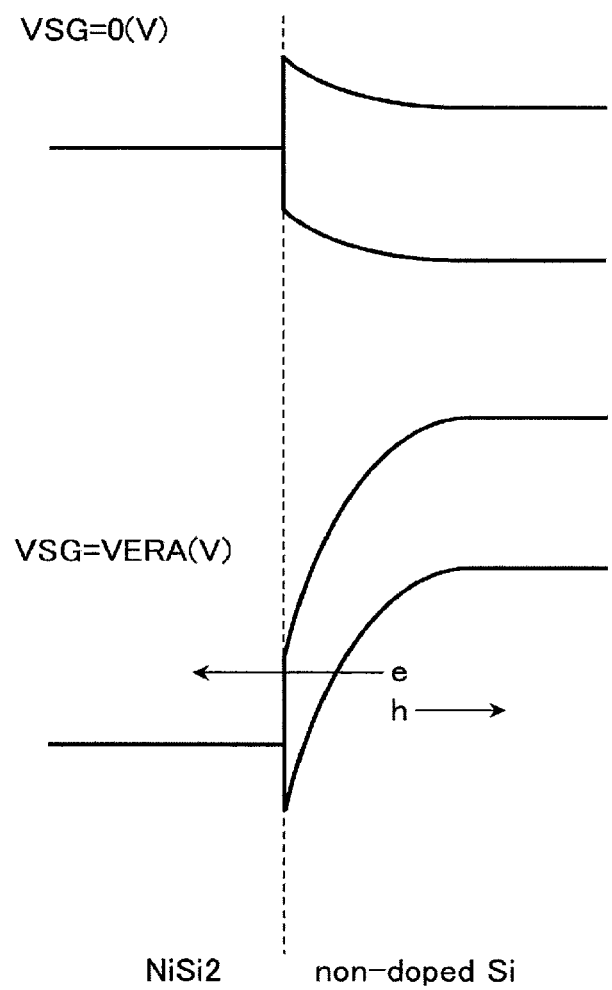
FIG. 21 is a diagram illustrating a band gap of the memory pillar in the semiconductor memory device according to the first embodiment.

In contrast, as shown in FIG. 21, in the present embodiment in which the silicide layer 24a is composed of $NiSi_2$, and the semiconductor layer 22 is composed of (monocrystal) non-doped Si, the band bending of the junction interface of the metal ($NiSi_2$)/semiconductor (non-doped Si) can be made steep. Thus, in a case of applying the voltage VERA to the source line SL, magnitude of the electric field at the junction interface is increased and the GIDL current can be increased (a lot of positive holes can be generated), than the comparative example. As a result, the erasure characteristic can be improved. Thus, the number of times of repeating the erase pulse application and erase verify is reduced, and the erasing time can be shortened. Therefore, the semiconductor memory device is able to have improved processing capabilities.

Figure 22:
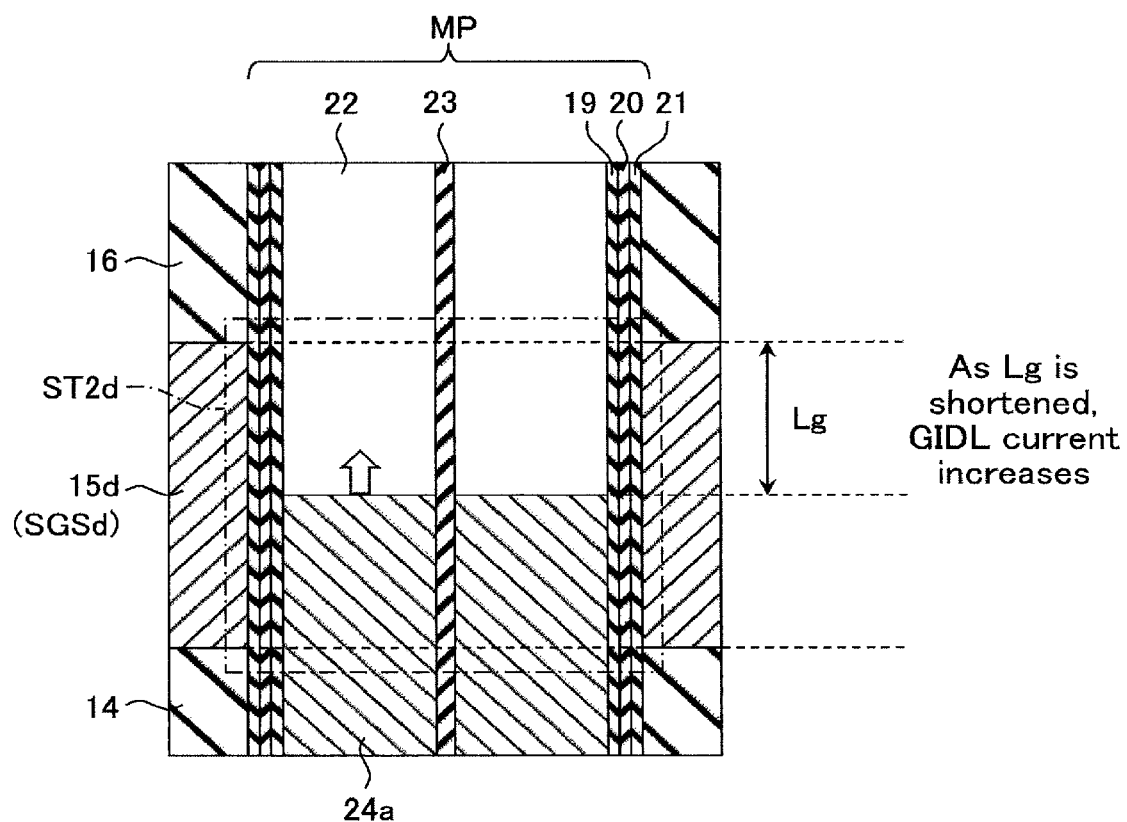
FIG. 22 is a cross-sectional view showing a height position of a top surface of a silicide layer 24*a* of the memory pillar in the semiconductor memory device according to the first embodiment.

Furthermore, advantageous effects of having the select transistor ST2d to be a gated diode will be described using FIG. 22. FIG. 22 is a cross-sectional view of the select transistor ST2d in the memory pillar MP.

As depicted in FIG. 22, by providing the junction interface of the silicide layer 24a and the semiconductor layer 22 in the channel area of the select transistor ST2d, an effective channel length Lg of the select transistor ST2d can be shortened. Thus, the band bending in the junction interface described in FIG. 21 can be made even steeper. Accordingly, the GIDL current can be increased further, and the erasure characteristic can be further improved. Thus, the number of times of repeating the erase pulse application and erase verify is reduced, and the erasing time can be shortened. Therefore, the semiconductor memory device is able to have improved processing capabilities.

Moreover, in the configuration according to the present embodiment, a channel in the NAND string SR, i.e., the semiconductor layer 22 in the memory pillar MP, can be composed of a monocrystal silicon by the MILC. Thus, for example, as compared with a case in which amorphous silicon is heated to be polycrystallized by solid phase crystallization (SPC), since there is no crystal grain boundary, resistance of the semiconductor layer 22 can be lowered and charge mobility can be increased. Thus, a channel current of the NAND string SR can be increased.

Furthermore, in the configuration according to the present embodiment, use of the silicide layer 24a can reduce the resistance of the memory pillar MP, and can also reduce a contact resistance between the memory pillar MP and the source line SL.

Furthermore, in the configuration of the present embodiment, the silicide layer 24b can be also formed on the SGD side (the top of the memory pillar MP) by the MILC. Thereby, the resistance of the memory pillar MP can be further reduced.

2. SECOND EMBODIMENT

Now, a second embodiment will be described. In the second embodiment, three examples of configurations of the memory pillar MP different from the first embodiment will be described. Hereinafter, only the matters different from the first embodiment will be described.

2.1 FIRST EXAMPLE

First, a first example will be described using FIG. 23.

Figure 23:
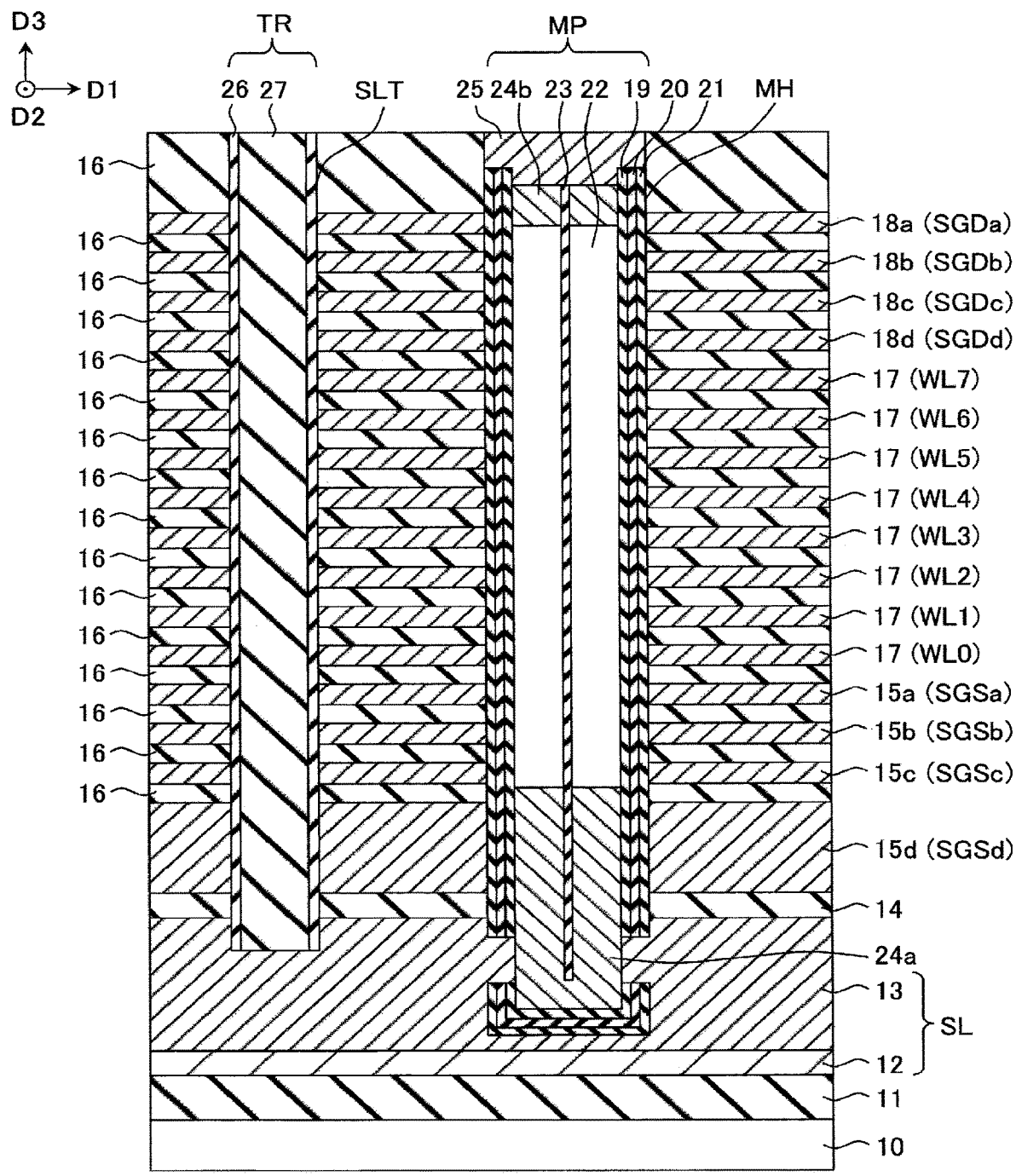
FIG. 23 is a cross-sectional view of a memory cell array in a semiconductor memory device according to a first example of a second embodiment.

As depicted in FIG. 23, a height position of an interface between the silicide layer 24a and the semiconductor layer 22 in the third direction D3 is higher than a top surface of the gate electrode layer 15d, and is lower than a bottom surface of the gate electrode layer 15c. In this case, the select transistors ST2a to ST2c function as the select transistor ST2. In addition, a height position of an interface between the silicide layer 24b and the semiconductor layer 22 in the third direction D3 is higher than a bottom surface of the gate electrode layer 18a, and is lower than a top surface of the gate electrode layer 18a. In this case, the select transistor ST1a functions as a gated diode.

2.2 SECOND EXAMPLE

Now, a second example will be described using FIG. 24.

Figure 24:
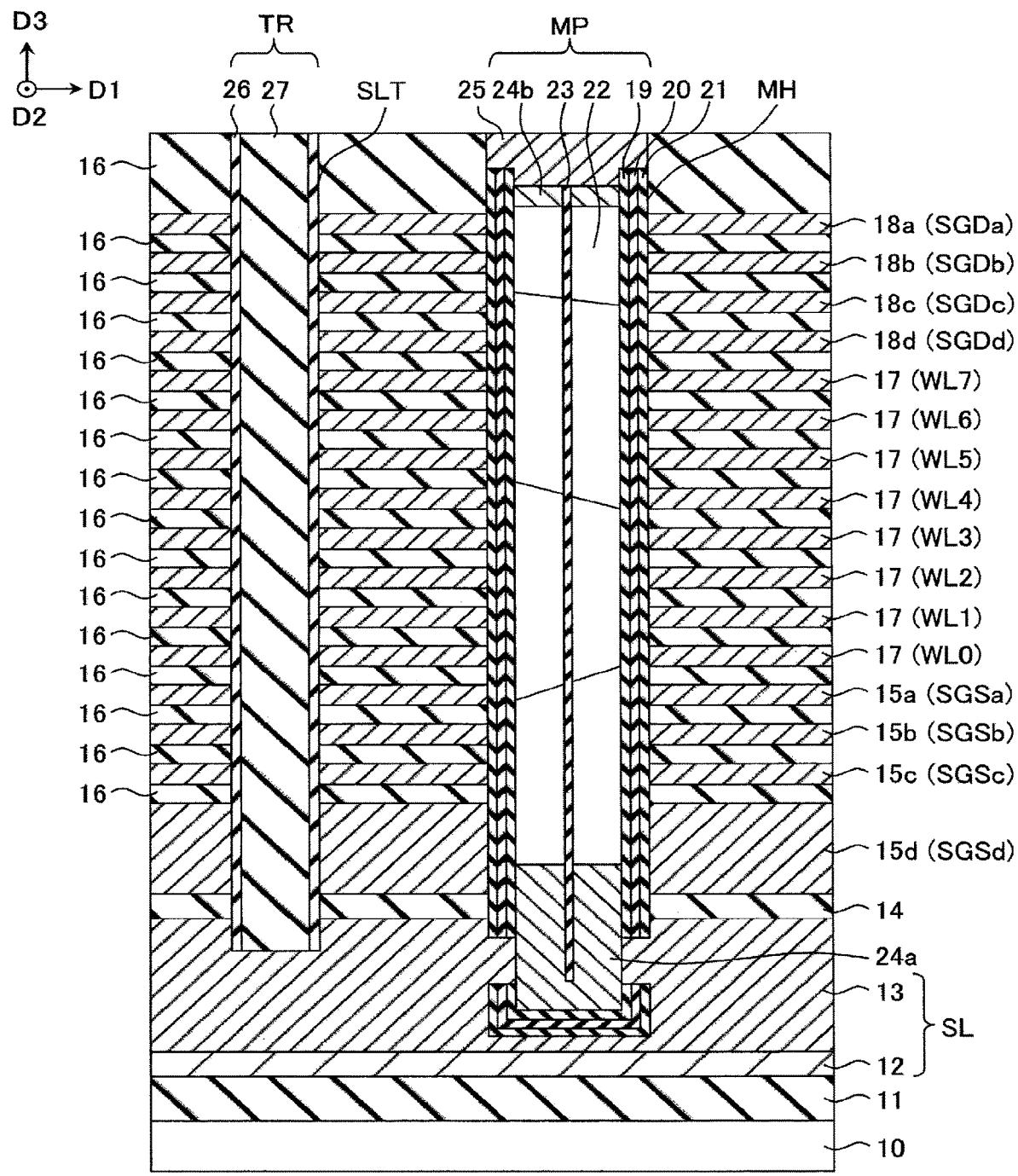
FIG. 24 is a cross-sectional view of a memory cell array in a semiconductor memory device according to a second example of the second embodiment.

As depicted in FIG. 24, a polycrystal silicon having a relatively large grain size may be used as the semiconductor layer 22. Even in a case of applying the MILC, there is a possibility that an amorphous silicon may not be monocrystallized, and a crystal grain boundary is formed in the middle of crystallization; as a result, the amorphous silicon may be polycrystallized. An average grain size of a polycrystal silicon obtained by the solid phase crystallization is about the same as the film thickness of an amorphous silicon. In contrast, in a case where a polycrystal silicon is formed by the MILC, its average grain size is at least three times or greater than the film thickness of an amorphous silicon, and is larger than the polycrystal silicon formed by the solid phase crystallization.

2.3 THIRD EXAMPLE

Now, a third example will be described using FIG. 25.

Figure 25:
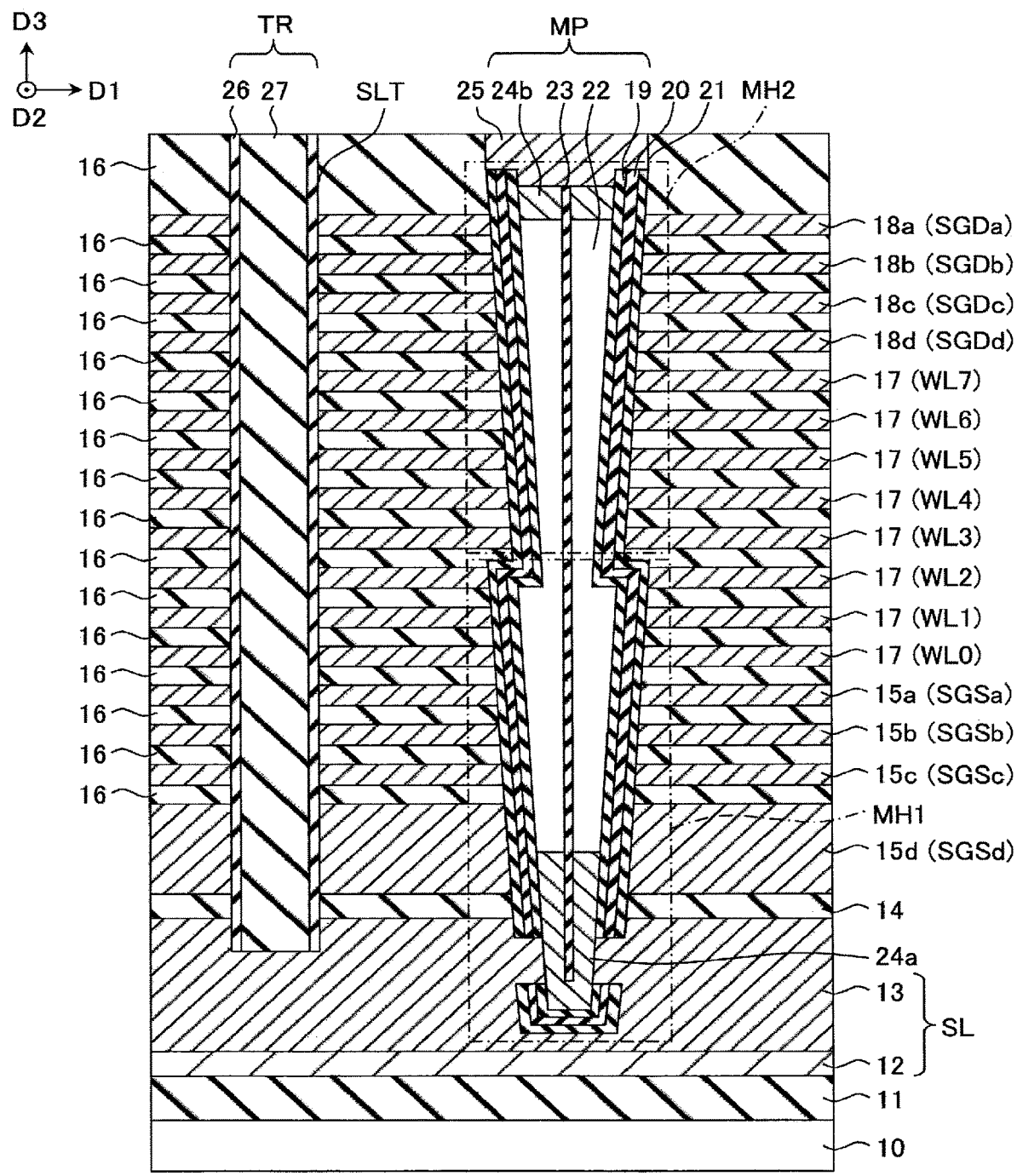
FIG. 25 is a cross-sectional view of a memory cell array in a semiconductor memory device according to a third example of the second embodiment.

As depicted in FIG. 25, the memory pillar MP may be a stack structure of two-staged memory holes MH1 and MH2. In this case, after forming up to the insulating layer 16 on the gate electrode layer 17 corresponding to the word line WL2, the memory hole MH1 is formed. After that, the memory hole MH1 is filled in once with a sacrifice layer. Then, after forming up to the insulating layer 16 on the gate electrode layer 18a, the memory hole MH2 is formed. After removing the sacrifice film in the memory hole MH1, the block insulating film 21, the charge storage layer 20, the tunnel insulating film 19, the semiconductor layer 35, and the core layer 23 are sequentially stacked as described in FIG. 5 for the first embodiment. The subsequent manufacturing method is the same as that of the first embodiment. Thus, the memory pillar MP, in which the two-staged memory holes MH1 and MH2 are stacked as depicted in FIG. 25, is formed.

The memory hole MH is not limited to a structure in which two-staged memory holes MH1 and MH2 are stacked. The memory hole MH may be a structure in which three or more stages of memory holes MH are stacked.

2.4 EFFECTS RELATED TO THE PRESENT EMBODIMENT

The configuration according to the present embodiment produces effects similar to the effects of the first embodiment.

3. THIRD EMBODIMENT

Now, a third embodiment will be described. In the third embodiment, a configuration of the source line SL different from that of the first embodiment will be described. Hereinafter, only the matters different from the first and second embodiments will be described.

3.1 CROSS-SECTIONAL CONFIGURATION OF THE MEMORY CELL ARRAY

First, a cross-sectional configuration of the memory cell array 111 will be described using FIG. 26.

Figure 26:
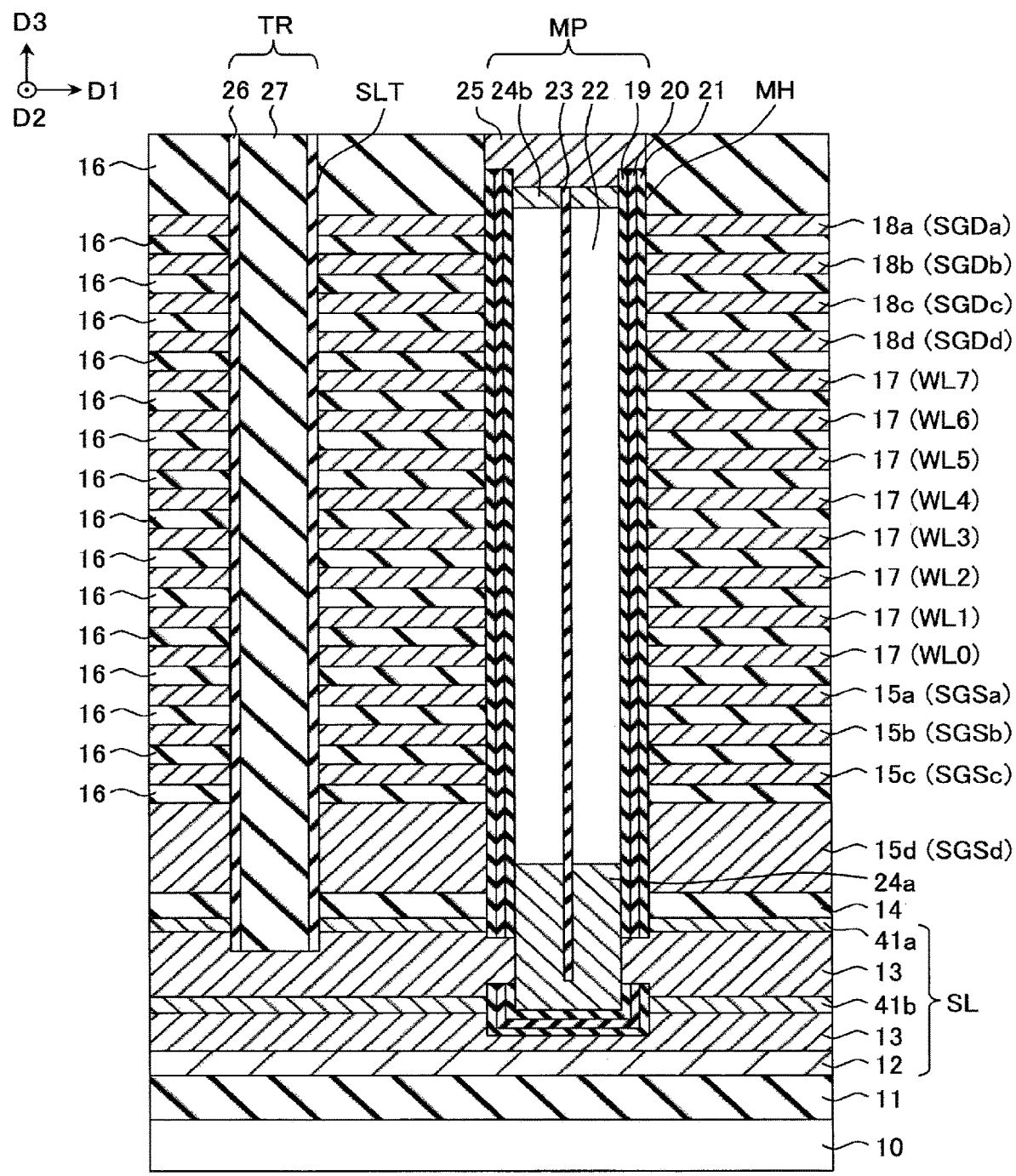
FIG. 26 is a cross-sectional view of a memory cell array in a semiconductor memory device according to a third embodiment.

As depicted in FIG. 26, the configuration of the source line SL is different from that in FIG. 3 for the first embodiment. More specifically, on the semiconductor substrate 10, the insulating layer 11 is formed, and on the insulating layer 11, the interconnect layers 12 and 13, the silicide layer 41b, the interconnect layer 13, and the silicide layer 41a, which function as the source line SL, are sequentially stacked. In the silicide layers 41a and 41b, as a conductive material, a metal silicide, e.g., $NiSi_2$, which is the same as the silicide layer 24a, is used.

3.2 MANUFACTURING METHOD OF THE MEMORY CELL ARRAY

Next, the manufacturing method of the memory cell array 111 will be described using FIGS. 27-32. In the manufacturing method of the memory cell array 111 in the present embodiment, the processes of up to removing the semiconductor layer 32 to form the gap GP are the same as FIGS. 4-9 for the first embodiment.

Figure 27:
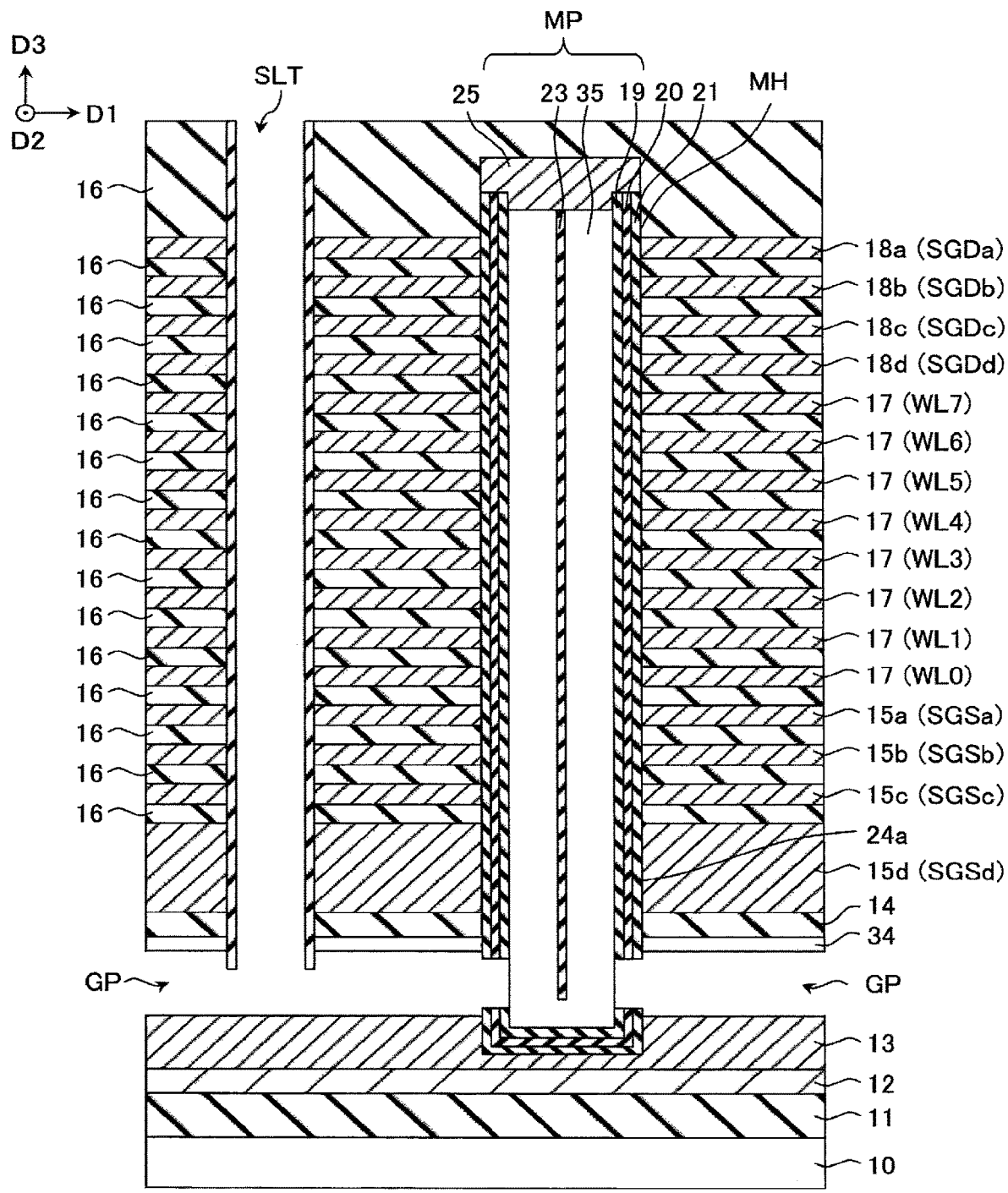

As depicted in FIG. 27, after forming the gap GP, the block insulating film 21, the charge storage layer 20, the tunnel insulating film 19, and the insulating layers 31 and 33 in the gap GP are removed by wet etching using a hydrofluoric acid chemical solution. In the present embodiment, the film thickness of the insulating layers 31 and 33 is set to, for example, about the same film thickness of the tunnel insulating film 19 or the block insulating film 21, so that the insulating layers 31 and 33 will also be removed when removing the block insulating film 21, the charge storage layer 20, and the tunnel insulating film 19.

As depicted in FIG. 28, the conductive layer 36 is formed in the same manner as FIG. 11 for the first embodiment. At this time, since the insulating layers 31 and 33 are removed, the interconnect layer 13 and the semiconductor layer 34 are in contact with the conductive layer 36.

As depicted in FIG. 29, the silicide heat treatment is performed to form the silicide layer 24a in the bottom portion of the memory hole MH, in the same manner as FIG.

12 for the first embodiment. At this time, the vicinity of the surface of the interconnect layer 13 and the semiconductor layer 34 are also silicide-processed to form the silicide layers 41a and 41b.

As depicted in FIG. 30, the excess conductive layer 36 is removed, in the same manner as FIG. 13 for the first embodiment.

As depicted in FIG. 31, after filling the gap GP with P doped poly-Si, the slit SLT is filled with the insulating layer 16, in the same manner as FIGS. 15 and 16 for the first embodiment.

As depicted in FIG. 32, the MILC heat treatment is performed, in the same manner as FIGS. 17 and 18 for the first embodiment. Thus, a part of the silicide layer 24a moves, as the silicide layer 24b, inside the semiconductor layer 35 to form the semiconductor layer 22 made of a monocrystal silicon between the silicide layer 24a and the silicide layer 24b. Thereby, the memory pillar MP is formed.

Figure 33:
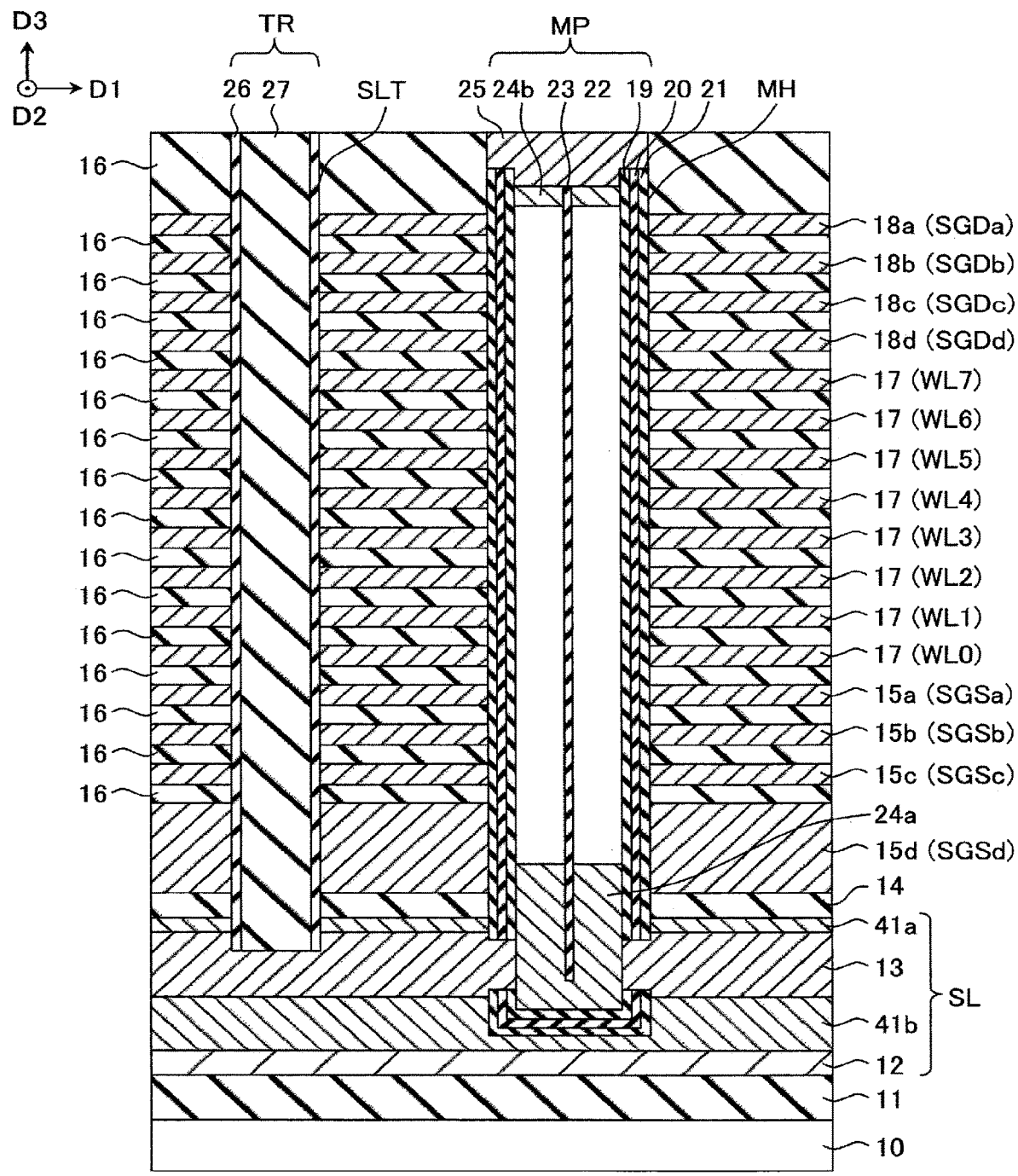
FIG. 33 is a cross-sectional view of the memory cell array in the semiconductor memory device according to the third embodiment.

In the present embodiment, a case where only the vicinity of the surface of the interconnect layer 13 is silicide-processed by the silicide heat treatment is described in the description of FIG. 29, but the entire interconnect layer 13 may be silicide-processed. Namely, as depicted in FIG. 33, the source line SL may be a configuration in which the interconnect layer 12, the silicide layer 41b, the interconnect layer 13, and the silicide layer 41a are sequentially stacked.

3.3 EFFECTS RELATED TO THE PRESENT EMBODIMENT

The configuration according to the present embodiment produces effects similar to the effects of the first embodiment.

Furthermore, in the configuration according to the present embodiment, since the interconnect layer 13, i.e., a part of P doped poly-Si, is replaced by the silicide layers 41a and 41b, i.e., NiSi$_2$, in the source line SL, the resistance of the source line SL can be reduced.

4. FOURTH EMBODIMENT

Now, a fourth embodiment will be described. In the fourth embodiment, a configuration of the source line SL, which is different from those of the first and third embodiments, will be described. Hereinafter, only the matters different from the first to third embodiments will be described.

4.1 CROSS-SECTIONAL CONFIGURATION OF THE MEMORY CELL ARRAY

First, a cross-sectional configuration of the memory cell array 111 will be described using FIG. 34.

As depicted in FIG. 34, the configuration of the source line SL differs from that in FIG. 3 for the first embodiment, and that in FIG. 26 for the third embodiment. More specifically, on the semiconductor substrate 10, the insulating layer 11 is formed, and the interconnect layer 12 functioning as the source line SL is formed on the insulating layer 11. Namely, the source line SL is composed of the metal interconnect layer 12, and the interconnect layer 13 is not provided.

4.2 MANUFACTURING METHOD OF THE MEMORY CELL ARRAY

Now, the manufacturing method of the memory cell array 111 will be described using FIGS. 35 to 40.

Figure 35:
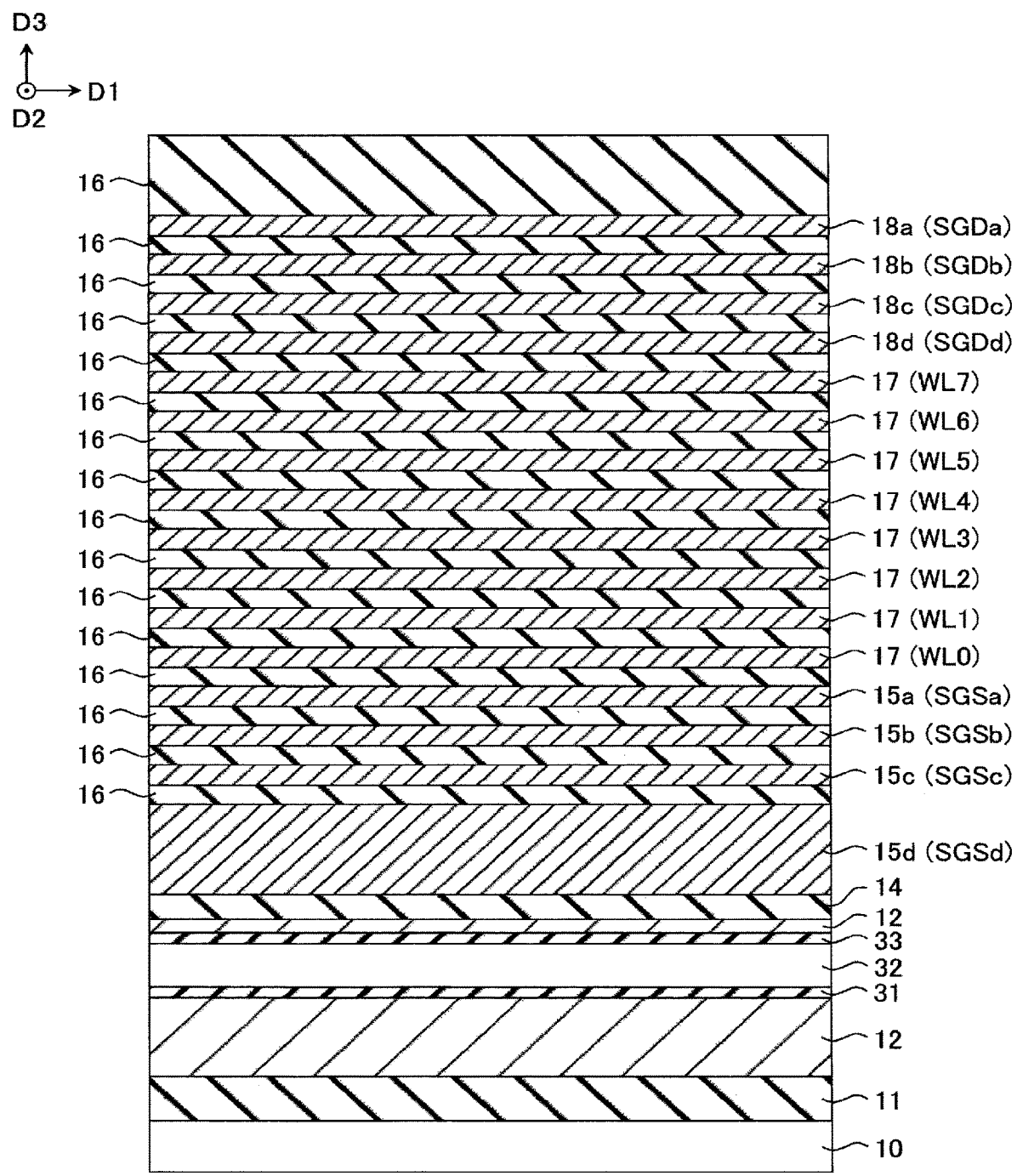

As depicted in FIG. 35, on the semiconductor substrate 10, the insulating layer 11, the interconnect layer 12, an insulating layer 31, a semiconductor layer 32, an insulating layer 33, the interconnect layer 12, the insulating layer 14, and the gate electrode layer 15d are sequentially formed. Then, on the gate electrode layer 15d, the gate electrode layers 15c to 15a, the eight gate electrode layers 17, and the gate electrode layers 18d to 18a are sequentially formed via the insulating layers 16 which lie between the respective layers. Furthermore, the insulating layer 16 is formed on the gate electrode layer 18a.

As depicted in FIG. 36, after forming the memory pillar MP, the slit SLT, and the gap GP by the same procedures as FIGS. 4-9 for the first embodiment, the block insulating film 21, the charge storage layer 20, the tunnel insulating film 19, and the insulating layers 31 and 33 are removed by wet etching using a hydrofluoric acid chemical solution, in the same manner as FIG. 27 for the second embodiment.

As depicted in FIG. 37, after forming the conductive layer 36, the silicide layer 24a is formed in the bottom portion of the memory hole MH by the silicide heat treatment.

Figure 38:
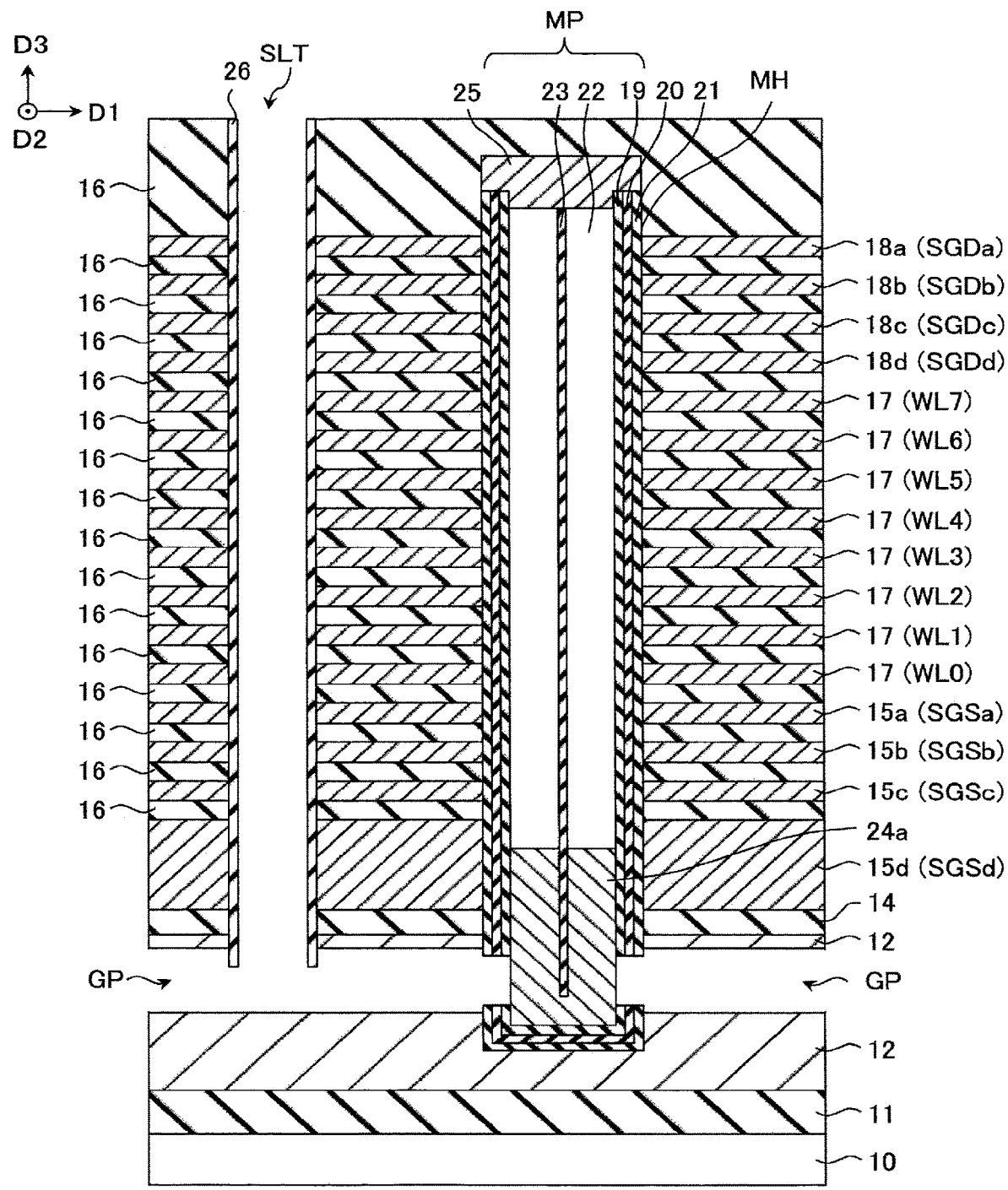

As depicted in FIG. 38, the excess conductive layer 36 is removed.

As depicted in FIG. 39, the gap GP is filled with a conductive metal material. More specifically, for example, after forming a TiN thin film as a barrier metal, W is formed to fill the gap GP. Then, for example, excess W and TiN in the slit SLT and on the core layer 23 are removed by wet etching or dry etching. It should be noted that TiN may not be provided. After that, the slit SLT is filled with the insulating layer 16.

As depicted in FIG. 40, the MILC heat treatment is performed, in the same manner as FIGS. 17 and 18 for the first embodiment. Thus, a part of the silicide layer 24a moves, as the silicide layer 24b, inside the semiconductor layer 35 so that the semiconductor layer 22 made of a monocrystal silicon is formed between the silicide layer 24a and the silicide layer 24b. Thereby, the memory pillar MP is formed.

4.3 EFFECTS RELATED TO THE PRESENT EMBODIMENT

The configuration according to the present embodiment produces effects similar to the effects of the first embodiment.

Furthermore, in the configuration according to the present embodiment, since the source line SL is composed of the interconnect layer 12, i.e., a metal interconnect such as W, etc. (and a stack film such as TiN/Ti as a barrier metal), the resistance of the source line SL can be reduced.

5. FIFTH EMBODIMENT

Now, a fifth embodiment will be described. In the fifth embodiment, a case where the silicide layer 24a is fouled in an upper portion of the memory pillar MP, and the silicide layer 24b is formed in the lower portion of the memory pillar MP by the MILC heat treatment will be described. Hereinafter, only the matters different from the first to fourth embodiments will be described.

5.1 CROSS-SECTIONAL CONFIGURATION OF THE MEMORY CELL ARRAY

First, a cross-sectional configuration of the memory cell array 111 will be described using FIG. 41. In the present embodiment, a case where the configuration of the source line SL is the same as that of the first embodiment will be described.

As depicted in FIG. 41, differences from FIG. 3 for the first embodiment are that the silicide layer 24a is formed in the upper portion of the memory pillar MP, and the silicide layer 24b is formed in the lower portion of the memory pillar MP. In addition, in an example of FIG. 41, a case where the height position of the bottom surface of the silicide layer 24a is lower than the bottom surface of the gate electrode layer 18a is depicted, but the height position of the bottom surface of the silicide layer 24a may be higher than the top surface of the gate electrode layer 18a in the same manner as the first embodiment, and only needs to be higher than the bottom surface of the gate electrode layer 18d.

5.2 MANUFACTURING METHOD OF THE MEMORY CELL ARRAY

The manufacturing method of the memory cell array 111 will be described using FIGS. 42-49. In the manufacturing method of the memory cell array 111 in the present embodiment, the processes of up to forming the memory hole MH to sequentially stack the block insulating film 21, the charge storage layer 20, the tunnel insulating film 19, the semiconductor layer 35, and the core layer 23 are the same as FIGS. 4 and 5 for the first embodiment.

Figure 42:
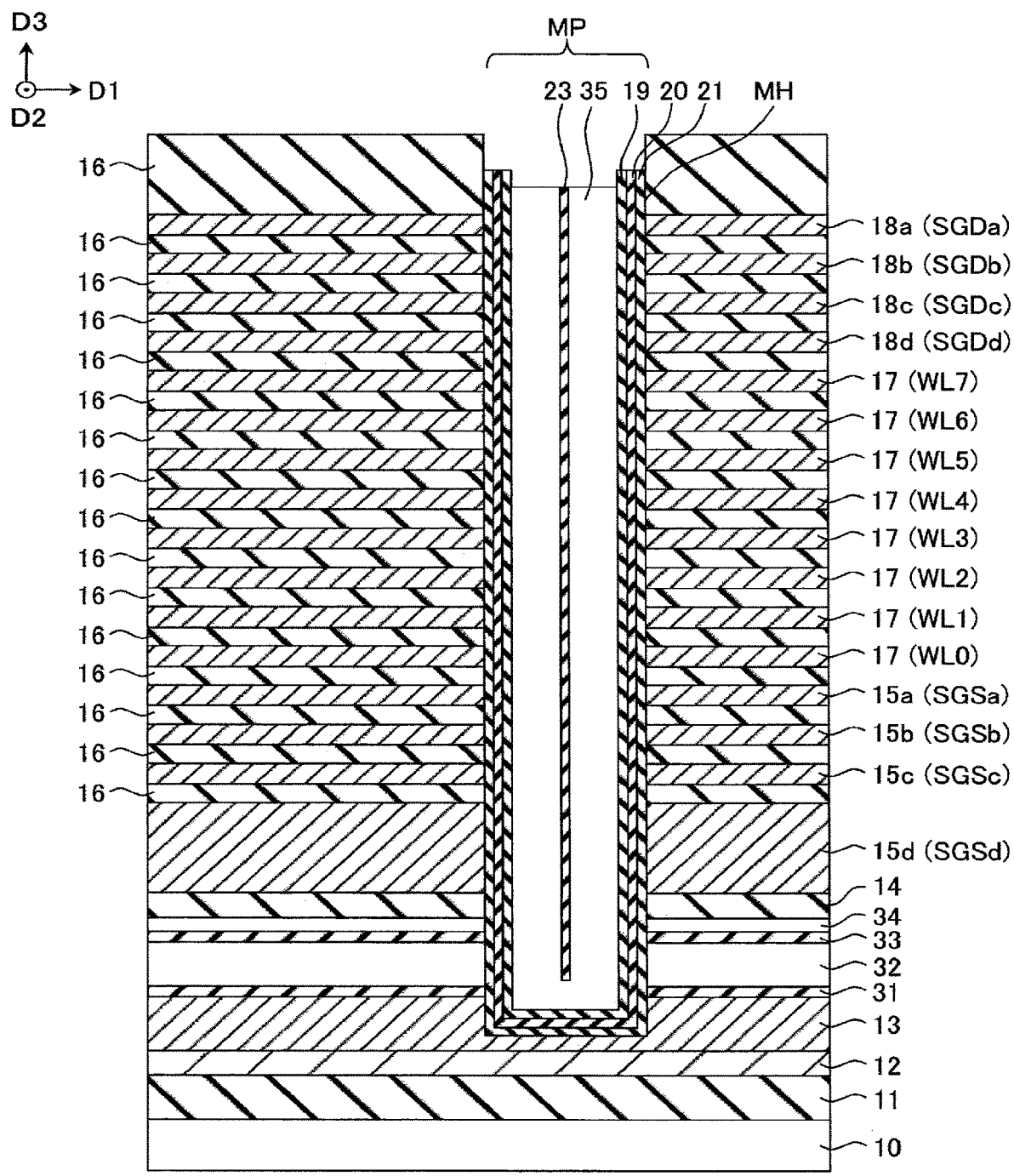

As depicted in FIG. 42, after stacking the block insulating film 21, the charge storage layer 20, the tunnel insulating film 19, the semiconductor layer 35, and the core layer 23, for example, the excess block insulating film 21, charge storage layer 20, tunnel insulating film 19, semiconductor layer 35, and core layer 23 on the insulating layer 16 are removed by dry etching. At this time, in the upper portion inside the memory hole MH, the block insulating film 21, the charge storage layer 20, the tunnel insulating film 19, the semiconductor layer 35, and the core layer 23 are partially etched.

As depicted in FIG. 43, the conductive layer 36 (Ni) is formed.

Figure 44:
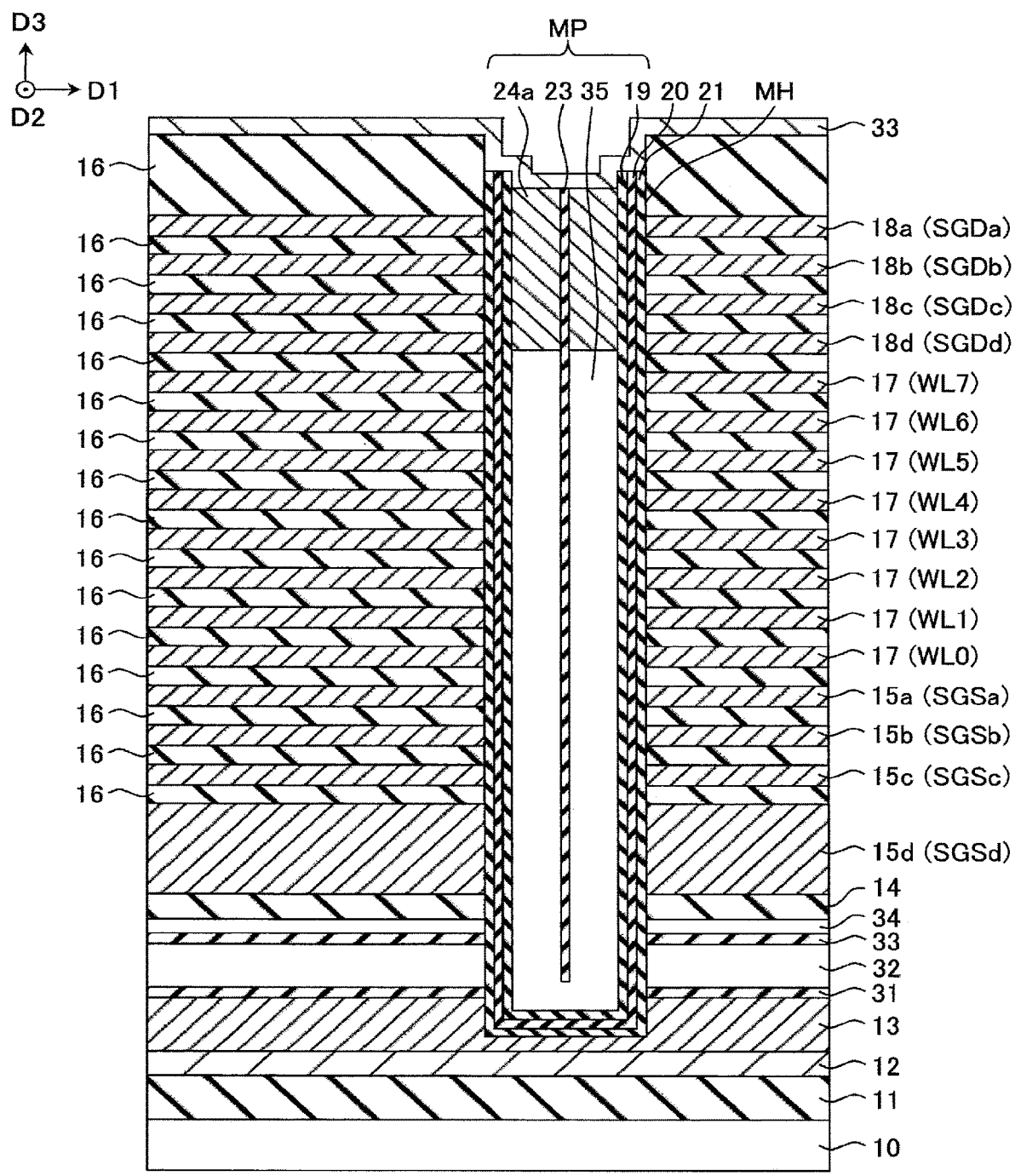

As depicted in FIG. 44, the silicide heat treatment is performed to have the conductive layer 36 (Ni) and the semiconductor layer 35 (amorphous silicon) reacted to form the silicide layer 24a ($NiSi_2$) in the upper portion of the memory hole MH.

Figure 45:
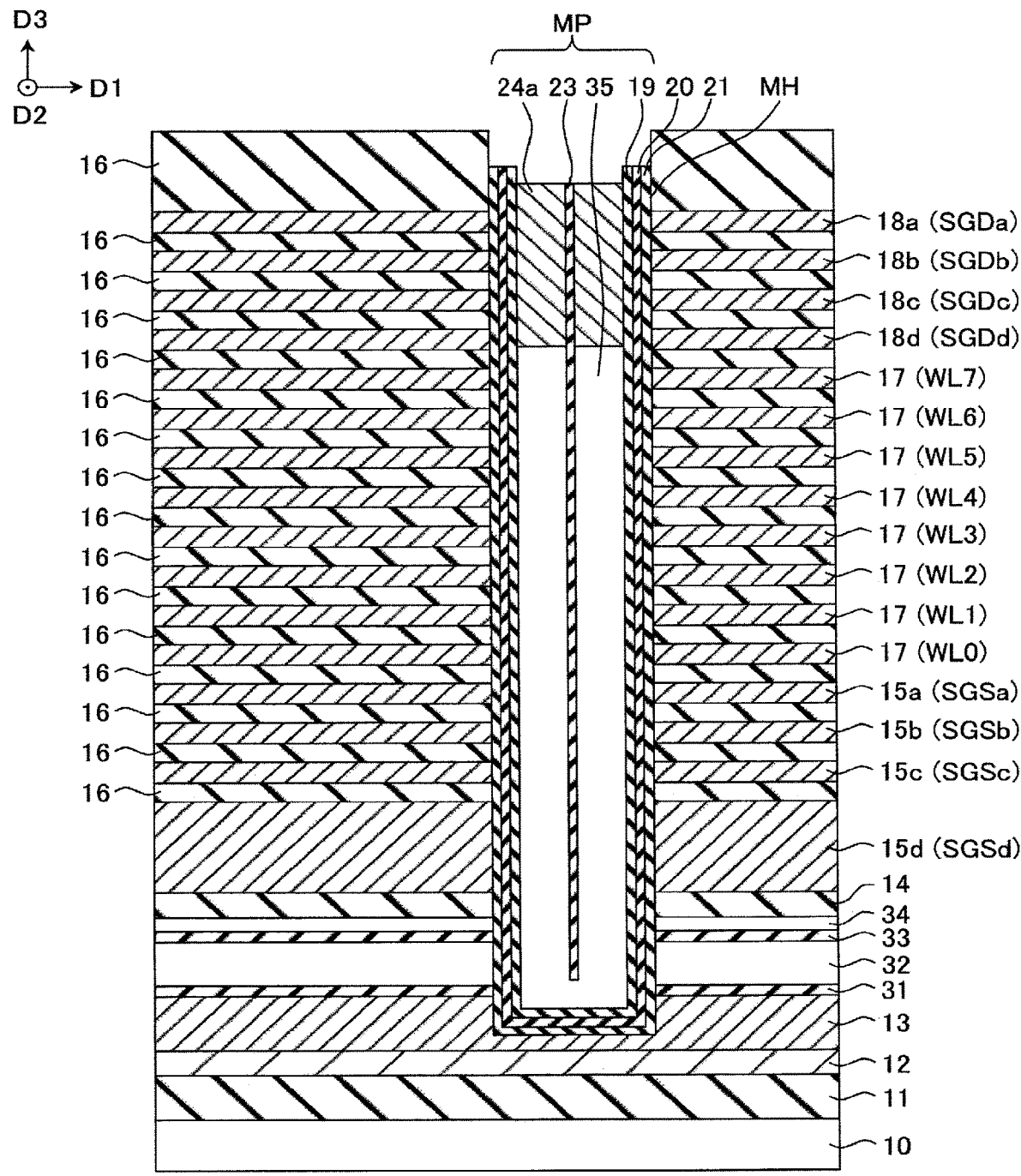

As depicted in FIG. 45, the excess conductive layer 36, i.e., Ni, in the memory hole MH and on the insulating layer 16 is removed.

Figure 46:
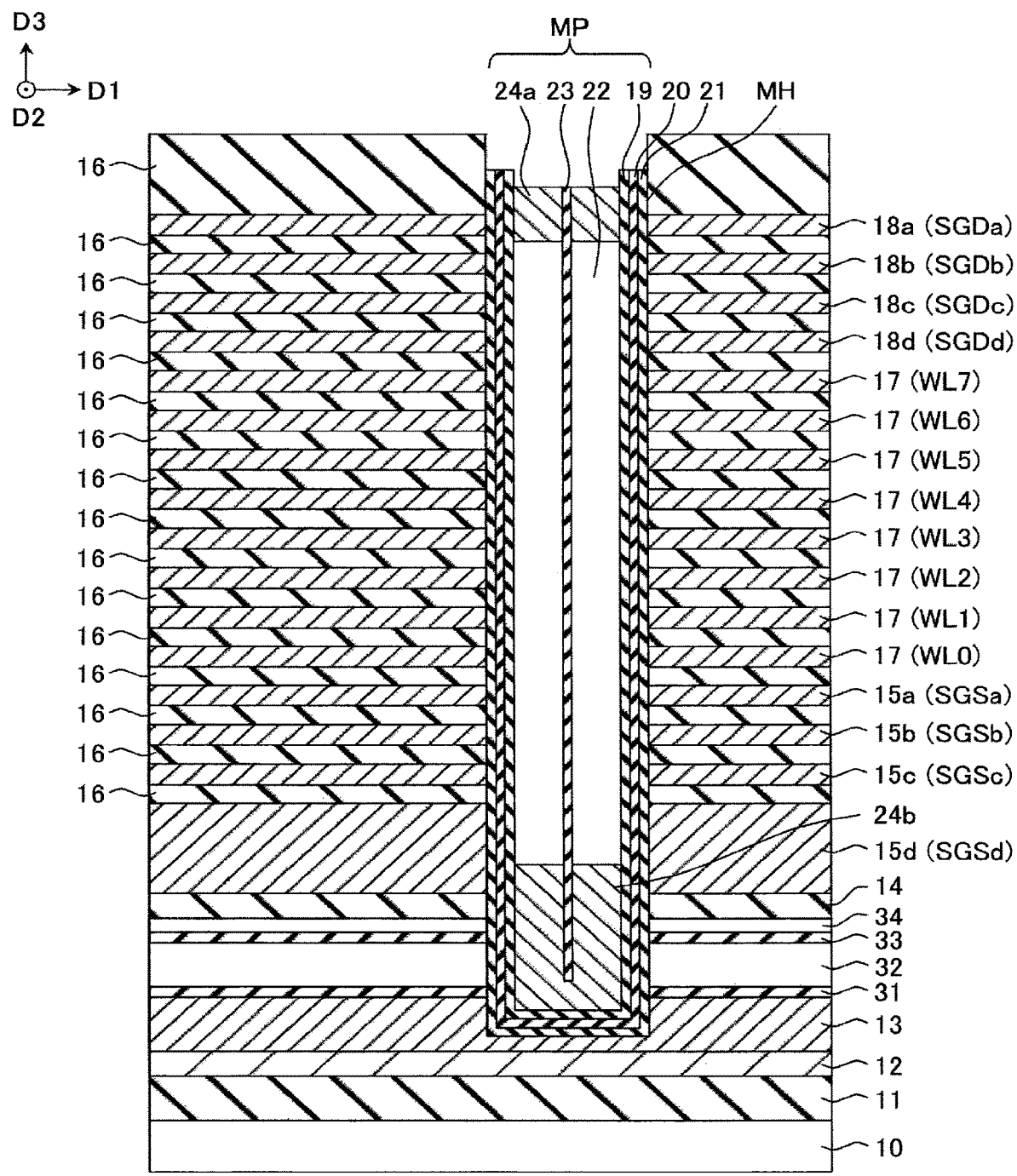

As depicted in FIG. 46, the MILC heat treatment is performed. Thus, a part of the silicide layer 24a moves, as the silicide layer 24b, inside the semiconductor layer 35, and the semiconductor layer 22 made of a monocrystal silicon is formed between the silicide layer 24a and the silicide layer 24b. At this time, the height position of the top surface of the silicide layer 24b is set to be higher than the bottom surface of the gate electrode layer 15d and lower than the top surface of the gate electrode layer 15a.

Figure 47:
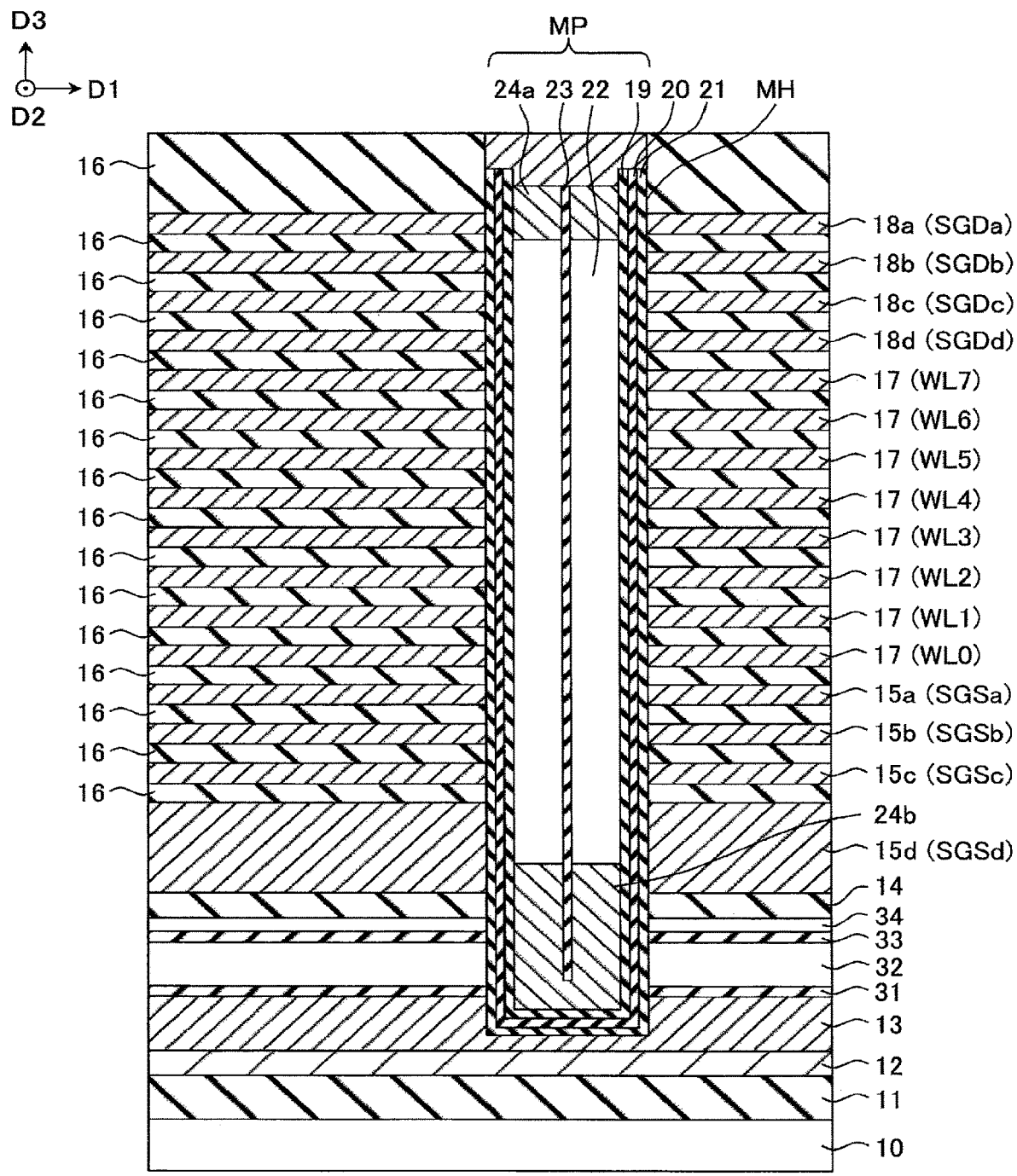

As depicted in FIG. 47, the cap layer 25 is formed on the top of the memory hole MH in the same manner as FIG. 6 for the first embodiment.

As depicted in FIG. 48, the slit SLT and the gap GP are formed by the same procedures as those of FIGS. 7-9 for the first embodiment.

As depicted in FIG. 49, the block insulating film 21, charge storage layer 20, the tunnel insulating film 19, and the insulating layers 31 and 33 in the gap GP are removed by wet etching.

As depicted in FIG. 50, the gap GP is filled with the interconnect layer 13 (P doped poly-Si), and after removing the excess P doped poly-Si in the slit SLT and on the insulating layer 16, the insulating layer 16 is formed to fill inside the slit SLT, in the same manner as FIGS. 15 and 16 for the first embodiment.

5.3 EFFECTS RELATED TO THE PRESENT EMBODIMENT

The manufacturing method described in the present embodiment can be applied to the memory pillar configurations described in the first to fourth embodiments. Thus, the configuration according to the present embodiment produces effects similar to the effects of the first to fourth embodiments.

6. MODIFICATIONS

The semiconductor memory device according to the above-described embodiments includes a first interconnect layer (SL) provided above a semiconductor substrate (10), a first insulating layer (14) and a second interconnect layer (15d (SGSd)) stacked on the first interconnect layer, and a memory pillar MP penetrating the first insulating layer and the second interconnect layer so that a bottom surface of the memory pillar MP reaches an inner portion of the first interconnect layer, the memory pillar MP including a second insulating layer (21), a charge storage layer (20), and a third insulating layer (19), which are stacked on a part of a side surface including an area in contact with the second interconnect layer and on the bottom surface of the memory pillar MP, and a first silicide layer (24a ($NiSi_2$)) in contact with the first interconnect layer, a semiconductor layer (22), and a second silicide layer (24b ($NiSi_2$)), which are sequentially stacked along a first direction (D3) perpendicular to the semiconductor substrate. In the first direction (D3), a height position of a bottom surface of the first silicide layer is lower than a top surface of the first interconnect layer, and a height position of a top surface of the first silicide layer is higher than a bottom surface of the second interconnect layer.

Application of the above-described embodiments allows provision of a semiconductor memory device that can improve processing capabilities.

The embodiments are not limited to the above-described forms, but various modifications may be made to the embodiments.

For example, the embodiments may be combined together wherever possible. In the third embodiment, for example, the memory pillar MP may be formed by two-staged memory holes MH1 and MH2 indicated in the third example of the second embodiment.

Furthermore, in the above-described embodiments, in the erase operation, the voltage VERA may be applied to the bit line BL, and the voltage VERA_GIDL may be applied to the select gate lines SGD (SGDa to SGDd).

In the above-described embodiments, the block insulating film 21, the charge storage layer 20, and the tunnel insulating film 19 present in the bottom portion of the memory pillar MP may not be provided.

In the first, second, third, and fifth embodiments, the metal interconnect layer 12 may not be provided.

Moreover, a case where the semiconductor memory device is a NAND flash memory is described in the above-described embodiments, but the device is not limited to the NAND flash memory. For example, the device may be a resistance change type memory, such as ReRAM (Resistive RAM).

The term "couple" in the above-described embodiments also includes the state of indirect connection or coupling via a transistor, a resistor, etc. or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first interconnect layer provided above a semiconductor substrate;
   a first insulating layer and a second interconnect layer stacked in order on the first interconnect layer; and
   a memory pillar penetrating the first insulating layer and the second interconnect layer so that a bottom surface of the memory pillar reaches an inner portion of the first interconnect layer, and including a second insulating layer, a charge storage layer, and a third insulating layer, which are stacked on a part of a side surface including an area in contact with the second interconnect layer and on the bottom surface of the memory pillar, and a first silicide layer in contact with the first interconnect layer, a semiconductor layer, and a second silicide layer, which are stacked in order along a first direction perpendicular to the semiconductor substrate,
   wherein, in the first direction, a height position of a bottom surface of the first silicide layer is lower than a top surface of the first interconnect layer, and a height position of a top surface of the first silicide layer is higher than a bottom surface of the second interconnect layer.

2. The semiconductor memory device according to claim 1, wherein the first and second silicide layers are nickel disilicide ($NiSi_2$).

3. The semiconductor memory device according to claim 1, wherein the semiconductor layer is a monocrystal silicon.

4. The semiconductor memory device according to claim 1, further comprising a third interconnect layer provided above the second interconnect layer and penetrated by the memory pillar,
   wherein, in the first direction, a height position of a top surface of the second silicide layer is higher than a top surface of the third interconnect layer, and a height position of a bottom surface of the second silicide layer is lower than the top surface of the third interconnect layer.

5. The semiconductor memory device according to claim 1, wherein the first interconnect layer includes a silicon layer including an impurity and in contact with the first silicide layer.

6. The semiconductor memory device according to claim 5, wherein the impurity is phosphorus or arsenic.

7. The semiconductor memory device according to claim 1, wherein the first interconnect layer includes:
   a first silicon layer including a first impurity;
   a third silicide layer provided on the first silicon layer;
   a second silicon layer including a second impurity, provided on the third silicide layer, and in contact with the first silicide layer; and
   a fourth silicide layer provided on the second silicon layer.

8. The semiconductor memory device according to claim 7, wherein the third and fourth silicide layers are $NiSi_2$.

9. The semiconductor memory device according to claim 7, wherein the first and second impurities are phosphorus or arsenic.

10. The semiconductor memory device according to claim 1, wherein the first interconnect layer includes a metal material.

11. The semiconductor memory device according to claim 1, wherein, in the first direction, the height position of the top surface of the first silicide layer is lower than a top surface of the second interconnect layer.

12. The semiconductor memory device according to claim 1, further comprising:
    a fourth insulating layer provided on the second interconnect layer; and
    a third interconnect layer provided on the fourth insulating layer and penetrated by the memory pillar,
    wherein, in the first direction, the height position of the top surface of the first silicide layer is higher than the top surface of the second interconnect layer, and is lower than a bottom surface of the third interconnect layer.

13. The semiconductor memory device according to claim 1, further comprising a plurality of third interconnect layers separated and stacked above the second interconnect layer in the first direction and penetrated by the memory pillar.

14. The semiconductor memory device according to claim 13, wherein the plurality of third interconnect layers are in contact with the second insulating layer.

15. The semiconductor memory device according to claim 1, wherein the memory pillar is such that a part of the second insulating layer, charge storage layer, and the third insulating layer provided on a side surface of the memory pillar is removed in the inner portion of the first interconnect layer.

16. The semiconductor memory device according to claim 1, wherein the memory pillar includes a first memory pillar including the first silicide layer and a second memory pillar including the second silicide layer, which are stacked along the first direction.

17. The semiconductor memory device according to claim 1, further comprising:
    a source line driver to which the first interconnect layer is coupled; and
    a row decoder to which the second interconnect layer is coupled.

18. The semiconductor memory device according to claim 17, wherein, in an erase operation, the source line driver applies a first voltage to the first interconnect layer in a first period, and applies a second voltage lower than the first voltage to the first interconnect layer in a second period after the first period, and the row decoder applies a third voltage lower than the first voltage and higher than the second voltage to the second interconnect layer in the first period, and applies the second voltage to the second interconnect layer in the second period.

19. The semiconductor memory device according to claim 1 is a NAND flash memory.

* * * * *